United States Patent
Kabasawa et al.

(10) Patent No.: US 9,666,787 B2
(45) Date of Patent: May 30, 2017

(54) SENSOR DEVICE AND ELECTRONIC APPARATUS

(71) Applicant: SONY CORPORATION, Tokyo (JP)

(72) Inventors: Hidetoshi Kabasawa, Kanagawa (JP); Hiroshi Ozaki, Kanagawa (JP); Kazuo Takahashi, Kanagawa (JP); Satoshi Mitani, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/785,903

(22) PCT Filed: Mar. 20, 2014

(86) PCT No.: PCT/JP2014/001614
§ 371 (c)(1),
(2) Date: Oct. 21, 2015

(87) PCT Pub. No.: WO2014/178163
PCT Pub. Date: Nov. 6, 2014

(65) Prior Publication Data
US 2016/0155927 A1    Jun. 2, 2016

(30) Foreign Application Priority Data
May 1, 2013 (JP) .................................. 2013-096143

(51) Int. Cl.
| | |
|---|---|
| H01L 23/10 | (2006.01) |
| H01L 41/113 | (2006.01) |
| G01C 19/5783 | (2012.01) |
| G01C 19/5769 | (2012.01) |
| G01L 9/00 | (2006.01) |
| H01L 41/047 | (2006.01) |
| H01L 41/053 | (2006.01) |
| B81B 7/00 | (2006.01) |
| B81C 1/00 | (2006.01) |
| H01L 23/48 | (2006.01) |

(Continued)

(52) U.S. Cl.
CPC .......... H01L 41/1132 (2013.01); B81B 7/008 (2013.01); B81C 1/00238 (2013.01);
(Continued)

(58) Field of Classification Search
CPC .... H01L 23/053; H01L 23/10; H01L 23/3121
See application file for complete search history.

(56) References Cited

U.S. PATENT DOCUMENTS

| | | | | |
|---|---|---|---|---|
| 2005/0167795 A1* | 8/2005 | Higashi | ................... | B81B 7/007 257/678 |
| 2010/0252898 A1* | 10/2010 | Tanaka | ................... | B81B 7/0041 257/415 |
| 2012/0079882 A1* | 4/2012 | Chiba | ................ | G01C 19/5783 73/514.29 |

FOREIGN PATENT DOCUMENTS

| | | |
|---|---|---|
| JP | 6-229821 A | 8/1994 |
| JP | 2003-270262 A | 9/2003 |

(Continued)

OTHER PUBLICATIONS

Translation of JP2003-270262 (listed on the Oct. 21, 2015 IDS).*
(Continued)

*Primary Examiner* — Whitney T Moore
*Assistant Examiner* — Joseph Galvin, III
(74) *Attorney, Agent, or Firm* — Sheridan Ross P.C.

(57) ABSTRACT

A sensor device and an electronic apparatus by which downsizing and a reduction in costs can be achieved is provided. A sensor device according to an embodiment of the present technology includes a sensor element and a semiconductor element. The semiconductor element includes a first surface, a second surface, and a via-hole. The first surface includes a first terminal on which the sensor element is mounted and is an inactive surface. The second surface includes a second terminal for external connection and is an active surface. The via-hole electrically connects the first surface and the second surface to each other.

20 Claims, 31 Drawing Sheets

(51) Int. Cl.
*H01L 25/16* (2006.01)
*H01L 21/768* (2006.01)

(52) U.S. Cl.
CPC ..... *G01C 19/5769* (2013.01); *G01C 19/5783* (2013.01); *G01L 9/0073* (2013.01); *H01L 21/76898* (2013.01); *H01L 23/481* (2013.01); *H01L 25/162* (2013.01); *H01L 41/0474* (2013.01); *H01L 41/0533* (2013.01); *H01L 41/113* (2013.01); *H01L 41/1138* (2013.01); *B81B 2201/02* (2013.01); *B81B 2207/012* (2013.01)

(56) References Cited

FOREIGN PATENT DOCUMENTS

| | | |
|---|---|---|
| JP | 2005-283475 A | 10/2005 |
| JP | 2005-345473 A | 12/2005 |
| JP | 2006-308498 A | 11/2006 |
| JP | 2007-17199 A | 1/2007 |
| JP | 2008-46078 A | 2/2008 |
| JP | 2009-63550 A | 3/2009 |
| JP | 2010-96614 A | 4/2010 |
| JP | 2010-230691 A | 10/2010 |
| JP | 2011-137818 | 7/2011 |
| JP | 2011-141152 A | 7/2011 |
| JP | 2011-164091 A | 8/2011 |
| JP | 2012-84669 A | 4/2012 |
| JP | 2012-182361 A | 9/2012 |

OTHER PUBLICATIONS

Translation of JP2007-017199 (listed on the Oct. 21, 2015 IDS).*
Translation of JP 2012-182361 (listed on the Oct. 21, 2015 IDS).*
International Search Report prepared by the Japanese Patent Office on Apr. 7, 2014, for International Application No. PCT/JP2014/001614.

* cited by examiner

⇒ Vibration direction
→ Coriolis force

SENSOR DEVICE AND ELECTRONIC APPARATUS

CROSS REFERENCE TO RELATED APPLICATIONS

This application is a national stage application under 35 U.S.C. 371 and claims the benefit of PCT Application No. PCT/JP2014/001614 having an international filing date of Mar. 20, 2014, which designated the United States, which PCT application claimed the benefit of Japanese Patent Application No. 2013-096143 filed May 1, 2013, the disclosures of which are incorporated herein by reference in their entirety.

TECHNICAL FIELD

The present technology relates to a sensor device on which a sensor element such as a vibration type gyro sensor is mounted and to an electronic apparatus including such a sensor device.

BACKGROUND ART

As an angular velocity sensor, for example, a vibration type gyro sensor is widely known. The vibration type gyro sensor detects an angular velocity by causing a vibrator to vibrate at a predetermined frequency in advance and detecting Coriolis force generated in the vibrator by the use of a piezoelectric element or the like. Typically, the vibration type gyro sensor (hereinafter, referred to as sensor device) is mounted on the same substrate as an integrated circuit (IC) that oscillates the vibrator, detects the angular velocity, and so on in parallel as a package component (see Patent Document 1).

By the way, in view of downsizing of an installed electronic apparatus, it is desirable to achieve downsizing of the sensor device and a reduction in costs. However, in the mounting method above, it is necessary to ensure a footprint for mounting at least the sensor and the IC. That is disadvantageous in pursuing downsizing and the reduction in costs.

In view of this, Patent Document 2 describes a sensor device having a configuration in which an accommodation portion that accommodates a controller (IC) is formed in a multi-layer wiring board of ceramic or the like and a gyro sensor is disposed in the accommodation portion. This gyro sensor is formed of a three-axis gyro sensor that is rectangular as a whole and mounted over the controller accommodated in the accommodation portion. With this, mounting regions of the gyro sensor and the controller overlap with each other, such that the footprint can be reduced.

Patent Document 1: Japanese Patent Application Laid-open No. 2010-230691

Patent Document 2: Japanese Patent Application Laid-open No. 2011-164091

SUMMARY OF INVENTION

Problem to be Solved by the Invention

However, regarding the sensor device described in Patent Document 2, the accommodation portion is a recess portion formed in a wiring board surface. Therefore, the rectangular gyro sensor mounted over it needs to be longer in at least either one of vertical and horizontal directions than the accommodation portion. Therefore, there is a problem in that the gyro sensor cannot be sufficiently downsized. Further, in the case where multiple gyro sensors are taken from a single wafer by an MEMS process or the like, the downsizing of the gyro sensor is limited, and hence the number of obtained gyro sensors cannot be increased. Consequently, the reduction in costs is also limited.

In view of the above-mentioned circumstances, it is an object of the present technology to provide a sensor device and an electronic apparatus by which downsizing and a reduction in costs can be achieved.

Means for Solving the Problem

In order to achieve the above-mentioned object, a sensor device according to an embodiment of the present technology includes a sensor element and a semiconductor element.

The semiconductor element includes a first surface, a second surface, and a via-hole.

The first surface includes a first terminal on which the sensor element is mounted and is an inactive surface.

The second surface includes a second terminal for external connection and is an active surface.

The via-hole electrically connects the first surface and the second surface to each other.

According to the sensor device, the sensor element can be directly mounted on the semiconductor element, and hence, as a whole of the sensor device, the downsizing and the reduction in costs can be realized. Further, the sensor element is mounted on the side of the inactive surface of the semiconductor element, and hence mutual interference of the sensor element and the semiconductor element can be suppressed. With this, the operation as a whole of the sensor device can be stably maintained.

Note that "the active surface" means an element forming surface in which an integrated circuit or the like of the semiconductor element is formed and the "inactive surface" means a surface on a side of the substrate of the semiconductor element, in which the integrated circuit or the like is not formed.

The sensor element may include
a detecting portion capable of detecting a predetermined physical quantity, and
a supporting portion that supports the detecting portion and is connected to the first terminal.

With this, the sensor element can be bonded on the first surface of the semiconductor element via the supporting portion.

Further, the semiconductor element may further include a recess portion formed in the first surface to be opposed to the detecting portion.

With the recess portion, a sufficient gap can be ensured between the sensor element and the semiconductor element, and hence it is possible to further reduce the influence of the semiconductor element on the operation of the sensor element. In addition, according to the sensor device, the recess portion can be formed in the first surface that is the inactive surface, and hence the recess portion can be formed without the element structure of the semiconductor element.

Further, the detecting portion may include a movable portion, and
the sensor element may be configured to be capable of outputting a signal depending on the predetermined physical quantity based on a moving state of the movable portion.

For example, the sensor element may be configured to output a signal relating to an angular velocity based on a change of a vibrating state of the movable portion.

With this, the sensor device can be configured as a vibration type gyro sensor.

For example, the movable portion may include a diaphragm, and the sensor element may be configured to be capable of outputting a signal relating to a pressure based on a deformation of the diaphragm.

With this, the sensor device can be configured as a diaphragm type pressure sensor.

In these sensor devices, the semiconductor element may further include a recess portion formed in the first surface to be opposed to the movable portion.

With the above-mentioned configuration, the movable portion is opposed to the recess portion. Therefore, the influence of the air resistance and the like on the motion of the movable portion can be suppressed and the sensor sensitivity can be stably maintained.

In addition, the semiconductor element may further include a vibration control member that is formed in the first surface and capable of suppressing vibration of the semiconductor element and the sensor element based on motion of the movable portion.

With the vibration control member, the vibration of the semiconductor element due to the motion of the movable portion can be suppressed. Therefore, the influence of the sensor element itself, which is mounted on the semiconductor element, on the sensor properties can be suppressed and the detection accuracy can be improved.

Alternatively, the detecting portion may output a signal based on absorption of an electromagnetic wave having a predetermined wavelength.

With this, the sensor element can be configured as a photoelectric conversion element or a thermoelectric conversion element that uses heat generated by electromagnetic waves. That is, the sensor device can be configured as an imaging element (image sensor).

In the sensor device, the semiconductor element may further include a recess portion that is formed in the first surface to be opposed to the detecting portion.

With this, the detecting portion and the semiconductor element can be separated from each other at a predetermined distance corresponding to the depth of the recess portion and the thermal insulation of the detecting portion can be improved. Therefore, the detection accuracy of the sensor device can be improved.

Further, in the sensor device, the semiconductor element may further include a reflecting layer that is formed in the first surface and capable of reflecting the electromagnetic wave having the predetermined wavelength.

With this, the electromagnetic wave passing through the detecting portion can be reflected to the detecting portion. Therefore, the utilization efficiency of electromagnetic waves can be enhanced and the sensor sensitivity can be improved.

Further, the supporting portion may have a first thickness, and the semiconductor element may have a second thickness smaller than the first thickness.

With this, even if the semiconductor element is made thinner, the strength of the sensor device as a whole can be increased by the supporting portion of the sensor element.

In addition, the semiconductor element may further include a first re-wiring layer that is provided in the first surface and electrically connects the first terminal and the via-hole to each other, and a second re-wiring layer that is provided in the second surface and electrically connects the second terminal and the via-hole to each other.

With this, the first terminal and the integrated circuit and the second re-wiring layer of the semiconductor element can be connected to each other via the first re-wiring layer and the via-hole. With this, even in the case of mounting on the side of the first surface that is the inactive surface, suitable electrical connection with the semiconductor element can be established. Further, with the first and second re-wiring layers, the degree of freedom in wiring design can be increased. With this, the wiring length can be reduced and it is possible to reduce noise or the like due to crosstalk between the wires.

Further, the sensor device may further include a coating portion that is disposed on the first surface and coats the sensor element, in which the first re-wiring layer may include a third terminal that is connected to the coating portion.

With the coating portion, the handleability of the sensor device can be improved. Further, by being connected to the third terminal, the coating portion can function as an electromagnetic shield. With this, the reliability of the sensor device can be improved.

Further, the sensor element may further include a movable portion and be configured to be capable of outputting a signal depending on the predetermined physical quantity based on a moving state of the movable portion, and the coating portion may further include a coating film that coats the sensor element, and a sealing portion that seals between the coating film and the movable portion.

With the sealing portion, even if the sensor element includes the movable portion, the movable portion can be shielded from the coating film. With this, the sensor element can be coated with the coating film while ensuring the moving space of the movable portion.

Further, the semiconductor element may further include a restriction portion that is disposed between the first surface and the sensor element and restricts a size of a gap between the first surface and the sensor element.

With this, when the first terminal is bonded on the sensor element by soldering, a gap having a predetermined size can be reliably ensured between the first surface and the sensor element irrespective of a crush amount of a solder bump or the like. With this, the sufficient gap can be ensured between the sensor element and the semiconductor element and the influence of the semiconductor element on the operation of the sensor element can be further reduced.

Note that the term "restrict" used here means restricting the gap between the first surface and the sensor element not to be equal to or smaller than the predetermined size.

In addition, the first surface may include a first region that is opposed to the detecting portion, and a second region in which the first terminal is formed, the second region being proximate to the first region, and the semiconductor element may further include a resin layer formed between the second region and the sensor element, and an inflow preventing portion that is disposed on the first surface and prevents the resin layer from flowing into the first region.

With this, even if the resin layer is formed around the first terminal, the resin layer can be prevented from flowing to a side opposed to the detecting portion. Therefore, it is possible to prevent malfunction of the detecting portion and enhance the operation stability.

An electronic apparatus according to an embodiment of the present technology includes a sensor device.

The sensor device includes a sensor element and a semiconductor element.

The semiconductor element includes a first surface, a second surface, and a via-hole.

The first surface includes a first terminal on which the sensor element is mounted and is an inactive surface.

The second surface includes a second terminal for external connection and is an active surface.

The via-hole electrically connects the first surface and the second surface to each other.

Effect of the Invention

As described above, according to the present technology, it is possible to provide a sensor device and an electronic apparatus by which downsizing and a reduction in costs can be achieved.

MODE(S) FOR CARRYING OUT THE INVENTION

Hereinafter, embodiments according to the present technology will be described with reference to the drawings.

First Embodiment

Figure 1:
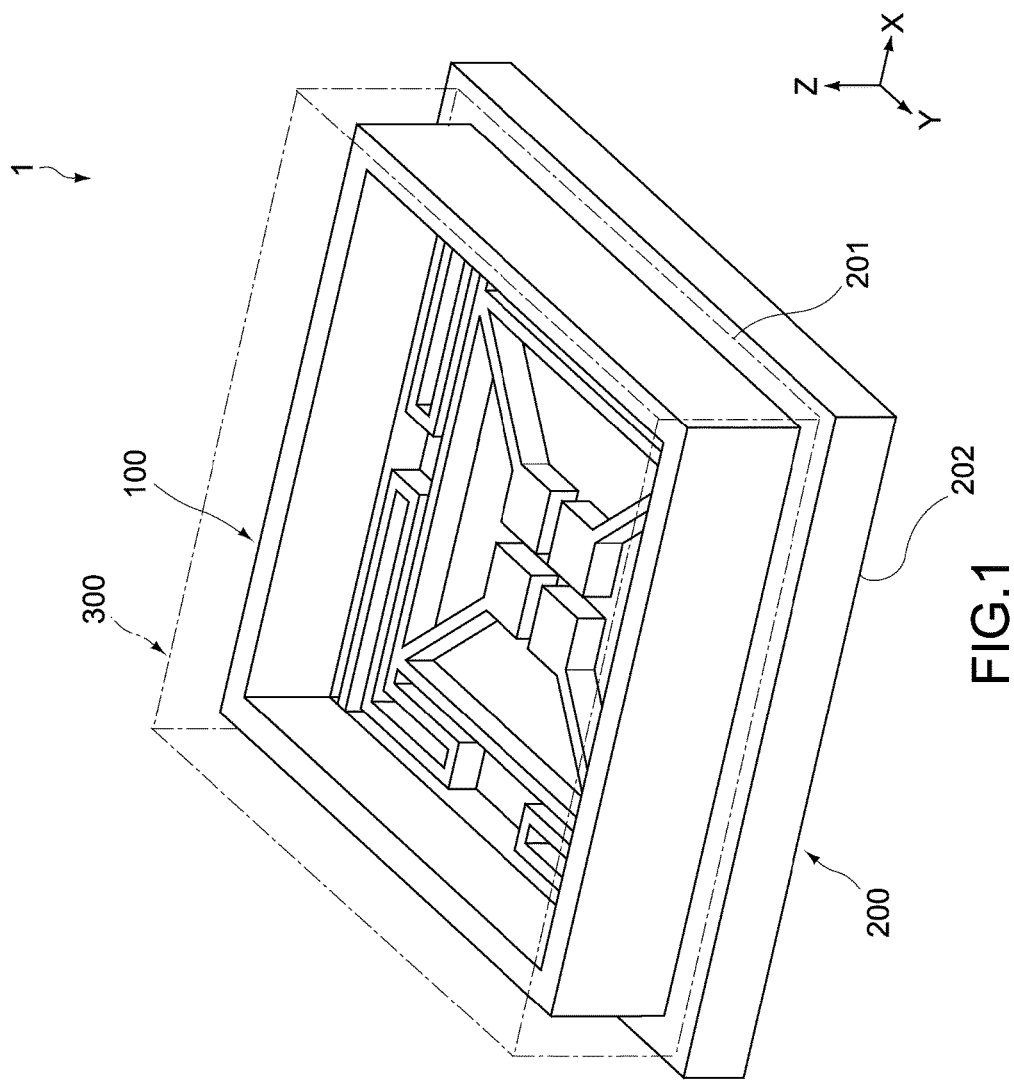
FIG. 1 A schematic perspective view of a sensor device according to a first embodiment of the present technology.
Figure 2:
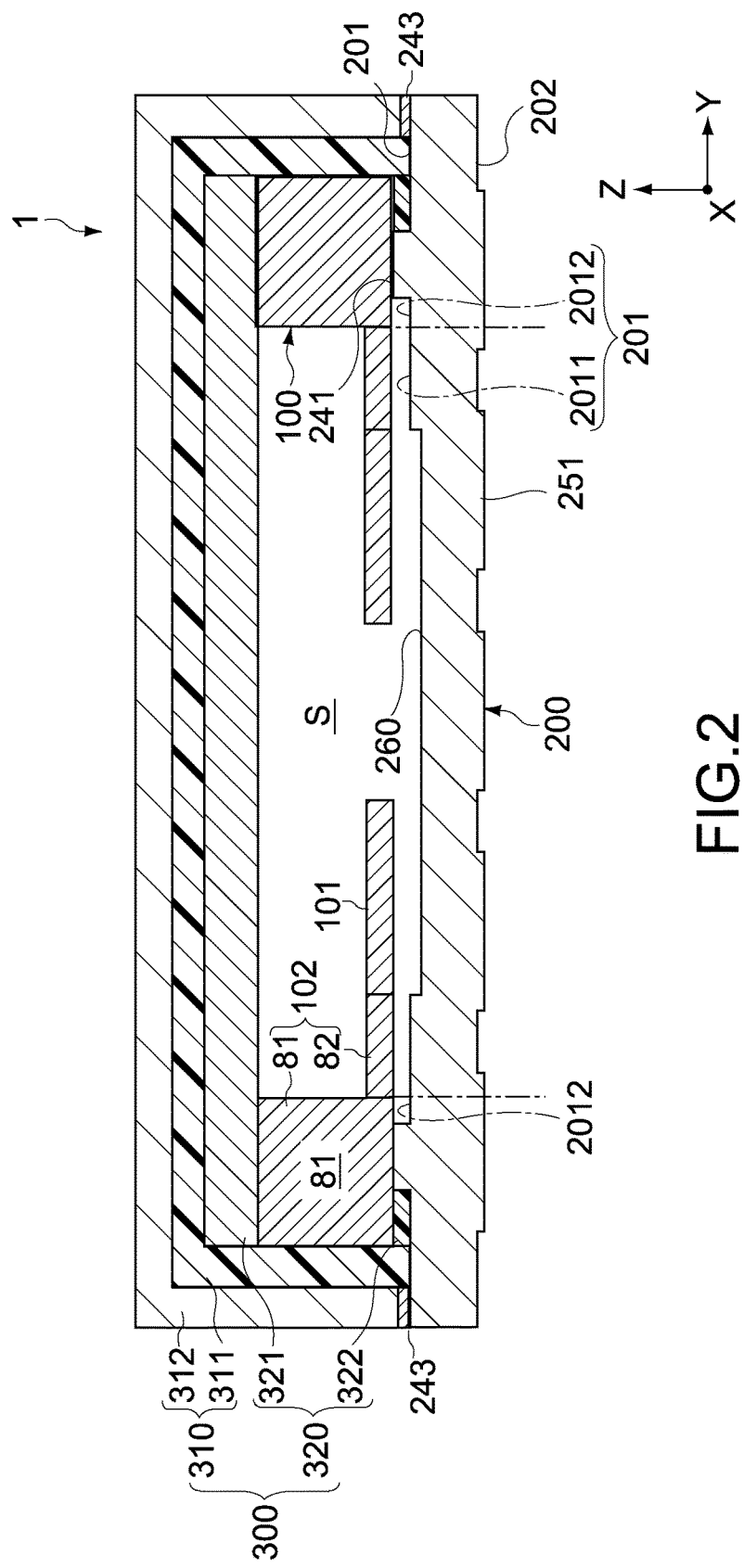
FIG. 2 A schematic cross-sectional view of the sensor device.
Figure 3:
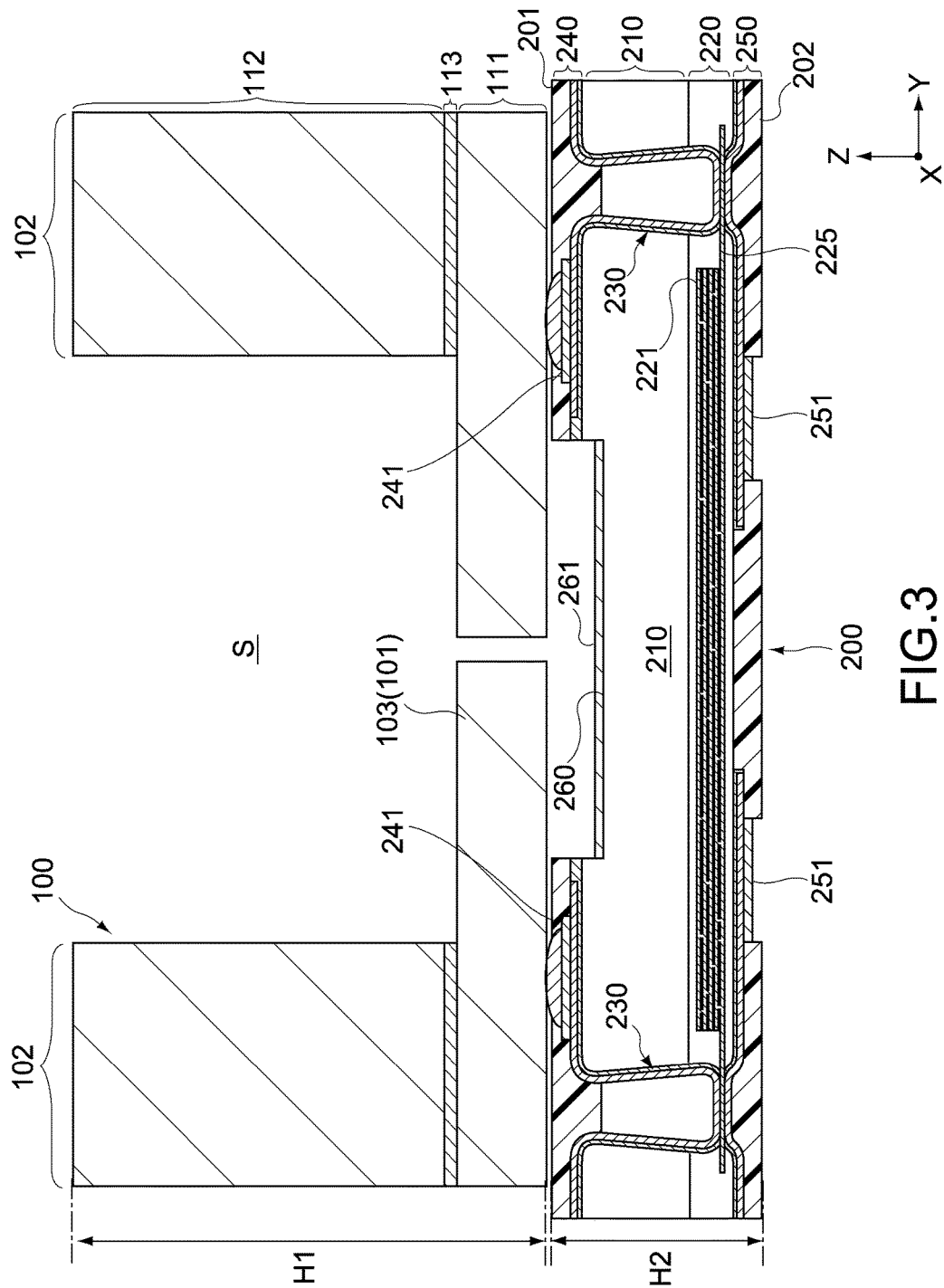
FIG. 3 A schematic cross-sectional view of the sensor device from which a coating portion is removed.
Figure 4:
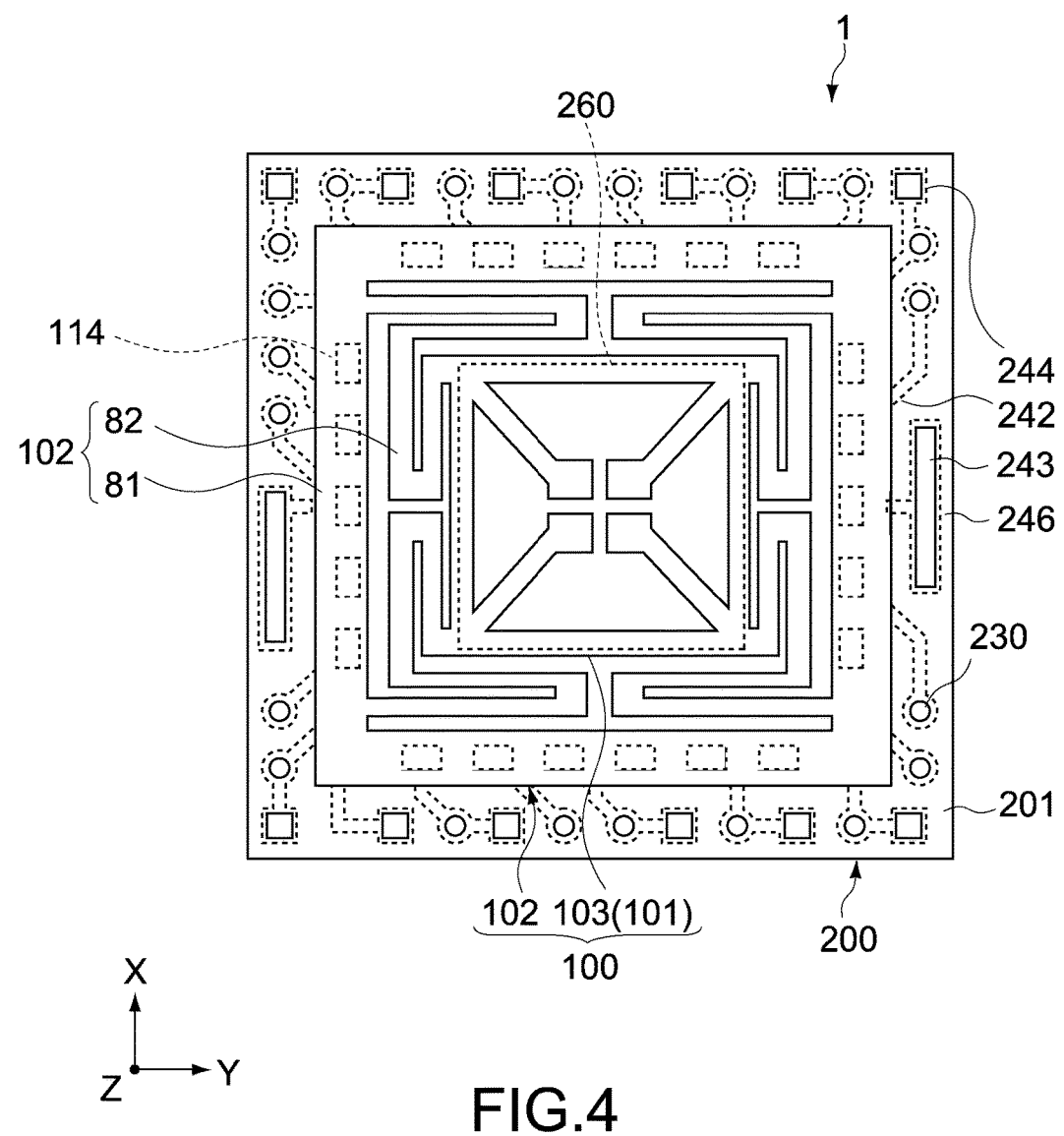
FIG. 4 A plan view of the sensor device from which the coating portion is removed.

FIGS. 1 and 2 are diagrams showing a sensor device according to an embodiment of the present technology. FIG. 1 is a schematic perspective view and FIG. 2 is a schematic cross-sectional view. A sensor device 1 of this embodiment includes a sensor element 100, a semiconductor element 200, and a coating portion 300. Note that, in FIG. 1, only an outline of the coating portion 300 is shown by an alternate long and short dash line. Further, FIGS. 3 and 4 are diagrams of the sensor device 1 viewed in a state in which the coating portion 300 is removed therefrom. FIG. 3 is a schematic cross-sectional view and FIG. 4 is a plan view. Note that an X-axis direction in the figures indicates a vertical direction of the sensor device 1, a Y-axis direction indicates a horizontal direction, and a Z-axis direction indicates a thickness direction. They indicate directions orthogonal to one another.

The sensor device 1 shown in FIG. 1 is configured as a single package component formed in an approximately rectangular parallelepiped shape as a whole. The sensor element 100 is directly mounted on the semiconductor element 200. That is, the sensor element 100 is surface-mounted on a first surface 201 of the semiconductor element 200B by a flip chip method, for example. The sensor device 1 has a dimension of about 2 mm in the vertical and horizontal directions and a thickness of about 0.7 mm in this embodiment.

In this embodiment, the sensor element 100 is configured as a gyro sensor element capable of outputting a signal relating to an angular velocity as a predetermined physical quantity. An entire thickness H1 of the sensor element 100 is, for example, about 340 μm.

The semiconductor element 200 is formed of a single IC (Integrated Circuit) component capable of controlling the sensor element 100. In this embodiment, the semiconductor element 200 is formed of a semiconductor bare chip. The semiconductor element 200 has an approximately rectangular parallelepiped shape having, for example, an approximately square shape with a side having a length of about 2.0 mm. For example, the semiconductor element 200 has a thickness H2 of about 100 μm (see FIG. 3).

In this embodiment, the coating portion 300 is formed on the first surface 201. The coating portion 300 includes a coating film 310 that coats the sensor element 100. The coating film 310 can also function as an electromagnetic shield of the sensor element 100 because it includes an electrically conductive film at its outer layer portion.

The sensor device 1 is bonded on a control board or the like (not shown) via second terminals 251 of a second surface 202 of the semiconductor element 200 and installed in an electronic apparatus. Examples of the electronic apparatus may include a video camcorder, a car navigation system, and a game console. The control board may be a wiring board (mother board) of such an electronic apparatus. The control board includes one in which other electronic components are installed in addition to the sensor device 1.

[Outline of Sensor Element]

Figure 5:
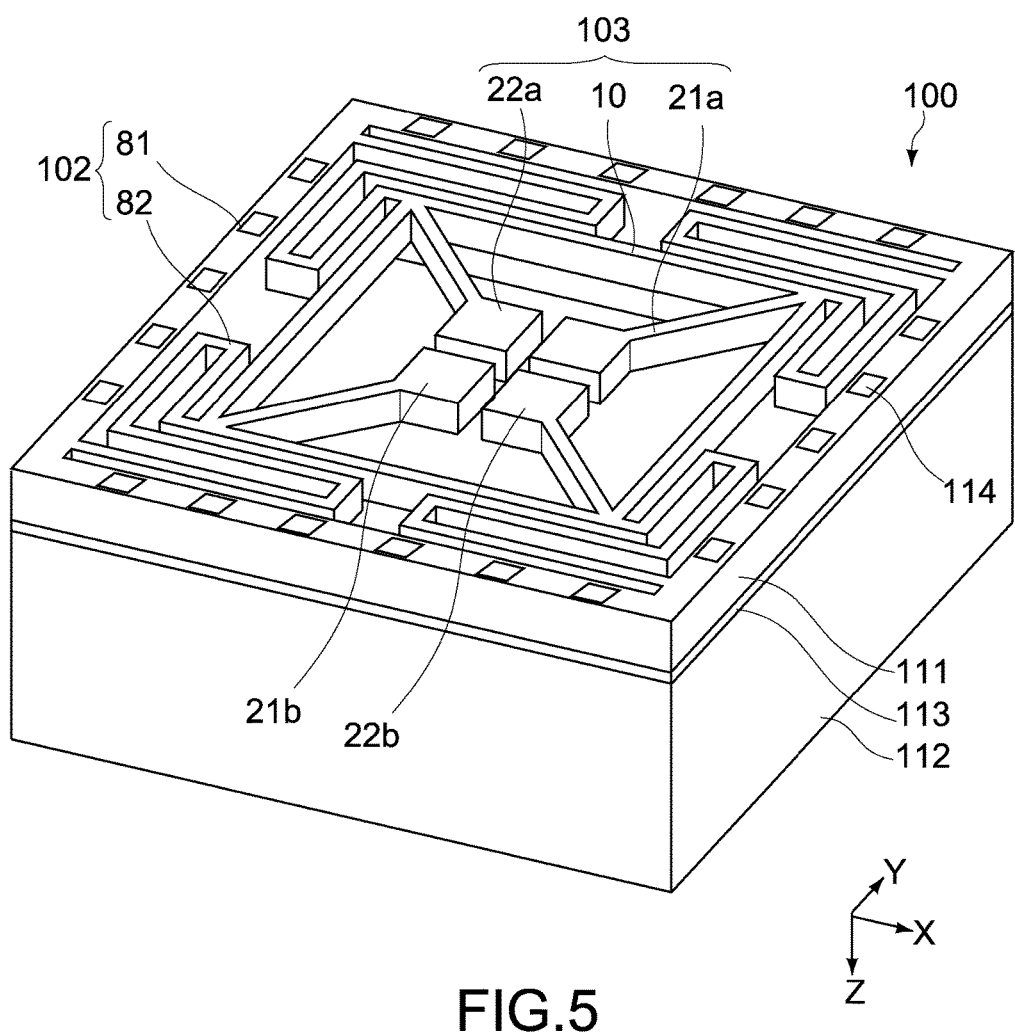
FIG. 5 An overall perspective view of a sensor element of the sensor device.

FIG. 5 is an overall perspective view showing a configuration example of the sensor element 100, which shows a back surface of the element opposed to the wiring board 200. Referring to FIGS. 3 to 5, the sensor element 100 includes a detecting portion 101 and a frame body (supporting portion) 102. The detecting portion 101 includes a vibrator portion (movable portion) 103 and detection electrodes 51, 71, and 72 (see FIG. 10) that are formed in a center portion of the sensor element 100. The frame body (supporting portion) 102 supports the vibrator portion 103 and is formed in a periphery of the sensor element 100. In this embodiment, the detecting portion 101 detects, based on a vibrating state of the vibrator portion 103, an angular velocity around each of axes along two predetermined directions in an XY-plane and an angular velocity around a Z-axis along a direction perpendicular to the XY-plane. That is, the sensor element 100 is configured to be capable of outputting signals depending on these angular velocities.

The vibrator portion 103 includes a plurality of pendulum portions 21a, 21b, 22a, and 22b. As will be described later, the plurality of pendulum portions 21a, 21b, 22a, and 22b are displaced according to the angular velocity around the Z-axis and displaced in the Z-axis direction according to the angular velocity around the X-axis or the Y-axis.

The frame body 102 includes a base 81 and a coupling portion 82. The base 81 includes terminal portions 114. The base 81 is formed in an approximately rectangular frame shape surrounding an outside of the vibrator portion 103. The coupling portion 82 couples the base 81 to the vibrator portion 103. The coupling portion 82 has a shape deformable in the XY-plane. Thus, the vibrator portion 103 can be supported without interfering with the vibration of the vibrator portion 103.

In this embodiment, the sensor element 100 is formed of a material including silicon (Si). For example, the sensor element 100 is formed by bonding two silicon (Si) substrates on each other and subjecting the thus obtained SOI (Silicon On Insulator) substrate to fine machining. The sensor element 100 includes a first layer 111, a second layer 112, a bonding layer 113 that bonds the first and second layers 111 and 112 on each other. The first and second layers 111 and 112 are each formed of a silicon substrate. The bonding layer 113 is formed of a silicon oxide film. In this embodiment, the first layer 111 has a thickness of about 40 μm, the second layer 112 has a thickness of about 300 μm, and the bonding layer 113 has a thickness of about 1 μm.

The first layer 111 is formed in an approximately rectangular shape having a plane that is square, rectangular, or the like. The second layer 112 is formed in a rectangular annular shape having a size corresponding to the first layer 111. Note that, in this embodiment, the first layer 111 is formed in a square shape with a side having a length of about 1.7 mm. The first layer 111 forms the vibrator portion 103, the coupling portion 82, and a lower portion (upper portion in FIG. 5) of the base 81. The second layer 112 is formed in a frame shape along a region corresponding to the base 81 in a periphery of the first layer 111. The second layer 112 forms an upper portion of the base 81 (lower portion in FIG. 5).

With the above-mentioned configuration, the vibrator portion 103 and the coupling portion 82 are formed of only the first layer 111 and has a thickness of about 40 μm.

On the other hand, the base 81 has a configuration in which the first and second layers 111 and 112 are laminated via the bonding layer 113 and has the thickness H1 of about 340 μm. That is, in this embodiment, the thickness H2 of the semiconductor element 200 is smaller than the thickness H1 of the base 81 (supporting portion 102) (see FIG. 3). In this manner, in the sensor element 100 according to this embodiment, the base 81 larger in height surrounds a periphery of the vibrator portion 103 such that a space S as a moving space is formed on the vibrator portion 103.

In the base 81, the terminal portions 114 are formed along a periphery of a lower surface formed by the first layer 111. In this embodiment, the terminal portions 114 are formed of electrode pads and solder bumps formed thereon. Along the periphery of the base 81, the plurality of terminal portions 114 are arranged in each of the sides. The solder bumps may be plating bumps or ball bumps. The terminal portions 114 are not limited to the configuration including the solder bumps and may include gold bumps or the like instead of the solder bumps.

Each of the terminal portions 114 is formed on an insulating film (not shown) that coats a back surface of the first layer 111, for example. With this, each of the terminal portions 114 is prevented from short-circuiting via the first layer 111 of single crystal silicon. Although the insulating film is typically formed of a silicon oxide film, it is not limited thereto of course.

The base 81 is surface-mounted on the semiconductor element 200 via the terminal portions 114 by the flip chip method. The thickness H1 of the base 81 (supporting portion 102) is larger than the thickness H2 of the semiconductor element 200, and hence the base 81 functions as a reinforced layer of the entire sensor device 1. With this, handling in manufacturing the sensor device 1 becomes easy and the sensor device 1 can be prevented from being damaged during or after mounting on the control board or the like. The vibration properties of the sensor element 100 can be more stably maintained.

In addition, the base 81 is bonded on the semiconductor element 200 by the plurality of terminal portions 114, and hence stress applied on the terminal portions 114 is dispersed and the bonding state can be more stably maintained.

[Semiconductor Element]

Figure 6:
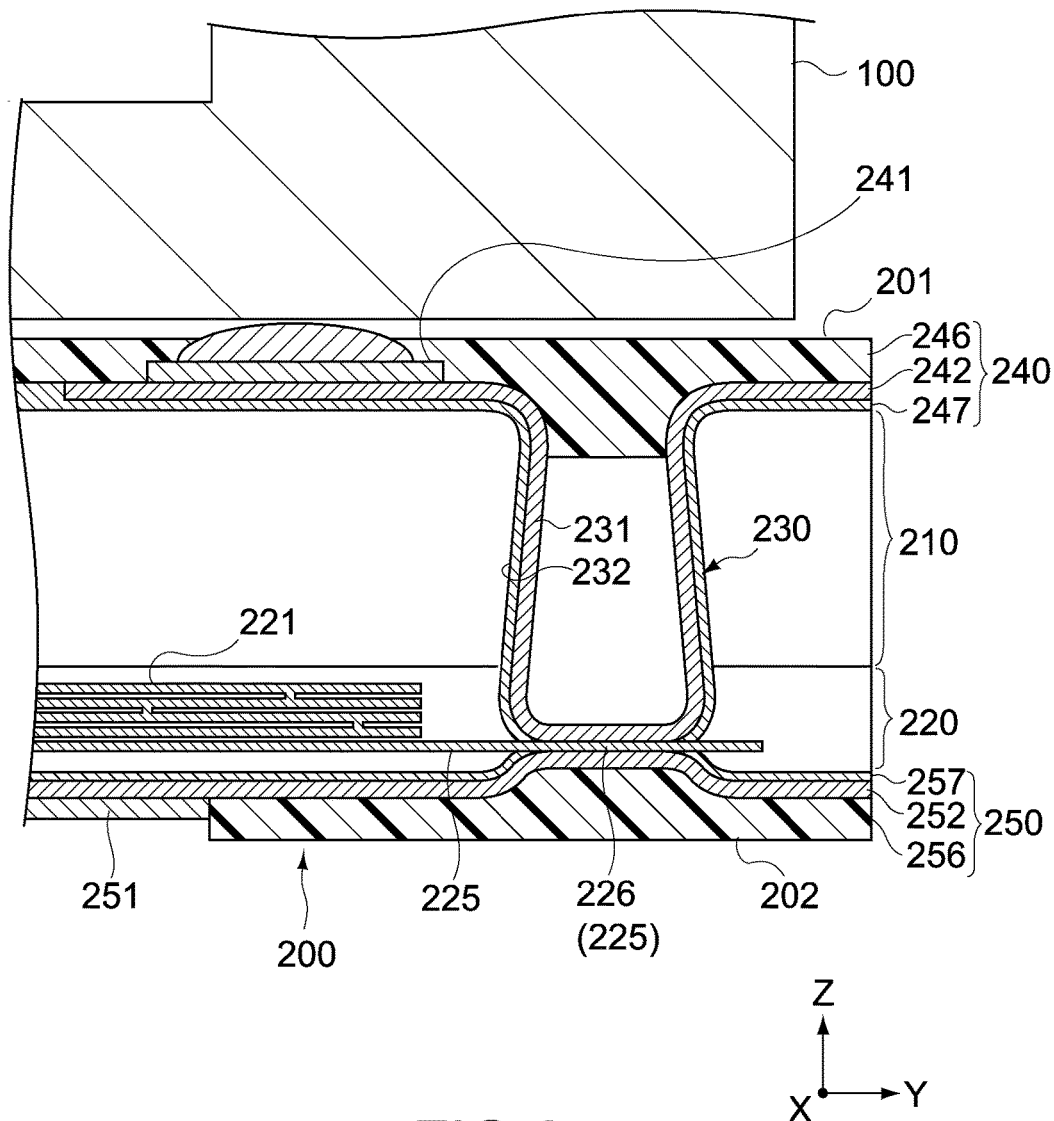
FIG. 6 A cross-sectional view showing a main part of a semiconductor element of the sensor device.

FIG. 6 is a schematic cross-sectional view showing a main part of the semiconductor element 200. The semiconductor element 200 is configured as an IC substrate including a substrate body 210 and an element forming layer 220 formed on one surface of the substrate body 210 (back surface in example shown in figure). The semiconductor element 200 includes a first re-wiring layer 240 and a second re-wiring layer 250 that are formed on the top and back surfaces of the IC substrate, respectively. The first re-wiring layer 240 and the second re-wiring layer 250 are connected to each other via via-holes 230 penetrating the substrate body 210. The first re-wiring layer 240 and the second re-wiring layer 250 are configured to be electrically connected to the sensor element 100, the control board, and the like.

The substrate body 210 is formed of a silicon substrate or the like.

The element forming layer 220 functions as an IC formed on the substrate body 210. Specifically, the element forming layer 220 includes a transistor element, a resistance element, a wire, and the like. The element forming layer 220 is formed by alternately laminating a plurality of metal layers and insulating layers patterned into a predetermined shape. In this embodiment, the element forming layer 220 includes five metal layers including a first metal layer 221 and a fifth metal layer 225. The element and wires formed in these metal layers are appropriately laid out not to generate noise departing from an allowable range due to crosstalk. Further, the element forming layer 220 is electrically connected to the sensor element 100 via the via-holes 230. Further, in this embodiment, the element forming layer 220 includes via-hole connection portions 226. The via-hole connection portions 226 are formed in the fifth metal layer 225 and electrically connected to the via-holes 230. Note that the via-hole connection portions 226 are not limited to the configuration in which they are connected to the fifth metal layer 225 and may be connected to, for example, the first metal layer 221.

Further, the semiconductor element 200 includes the first surface 201 on a side of the substrate body 210 and the second surface 202 on a side of the element forming layer 220. That is, the second surface 202 is an active surface on the side on which the IC is formed. On the other hand, the first surface 201 is an inactive surface on the side on which the IC is not formed. Thus, the sensor element 100 is mounted on the semiconductor element 200 via the first surface 201 as the inactive surface and conduction between the second surface 202 as the active surface and the sensor element 100 is established via the via-holes 230.

(First Surface)

Figure 7:
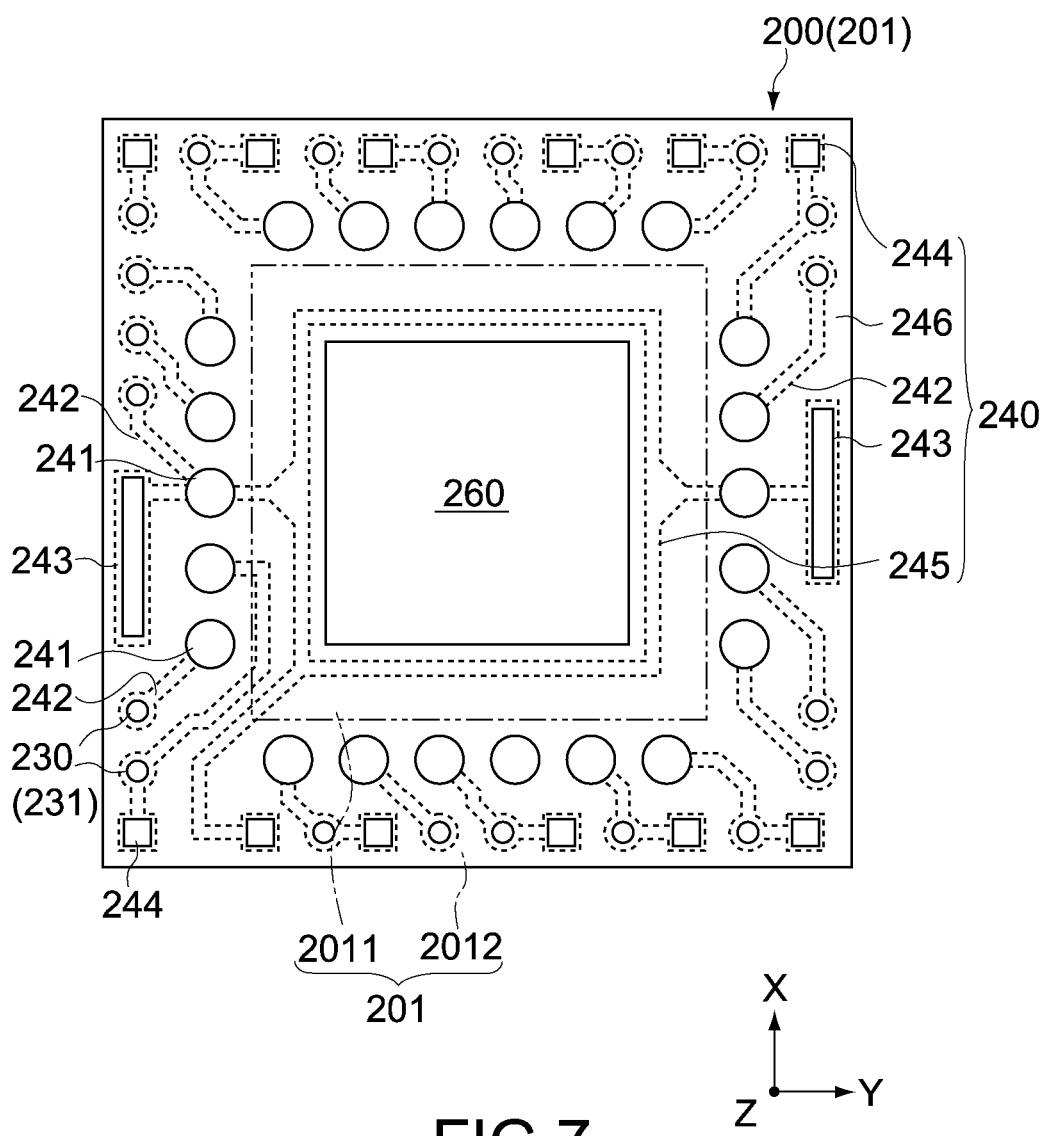
FIG. 7 A plan view showing a configuration of a first surface of the semiconductor element.

FIG. 7 is a schematic plan view showing a configuration of the first surface 201. The first surface 201 includes a plurality of first terminals 241 on which the sensor element 100 is mounted. The first terminals 241 are constituted of land portions formed in the first re-wiring layer 240 (wiring portions 242 to be described later) and electrically and mechanically bonded to the terminal portions 114 of the sensor element 100 by a flip chip method via the solder bumps, for example. Note that the electrical bonding method between the sensor element 100 and the first surface 201 is not limited to soldering and a bonding material such as an electrically conductive adhesive may be used or a bonding technique such as ultrasonic bonding may be used.

The first surface 201 includes a first region 2011 opposed to the detecting portion 101 including the vibrator portion 103 and a second region 2012 proximate to the first region 2011. The first terminals 241 are formed in the second region 2012. In this embodiment, for example, the first region 2011 is a region occupying a center portion of the first surface 201 and the second region 2012 is a region around the first region 2011. That is, the first region 2011 is opposed also to the space S (see FIG. 2).

The first re-wiring layer 240 that electrically connects the first terminals 241 and the via-holes 230 to each other is formed on the first surface 201.

Referring to FIGS. 6 and 7, the first re-wiring layer 240 includes the wiring portions 242, a plurality of third terminals 243, a plurality of fourth terminals 244, a ground wire 245, a wiring protection layer 246, and an insulating film 247. The wiring portions 242 are formed of a titanium (Ti)/copper (Cu) alloy or the like having a thickness of about 4 μm. The wiring portions 242 connect the via-holes 230 to the first terminals 241, the third terminals 243, the fourth terminals 244, and the ground wire 245. Further, the insulating film 247 is disposed between the wiring portions 242 and the substrate body 210 and provided to ensure insulation between them.

The plurality of third terminals 243 are a plurality of pad portions formed in the wiring portions 242 and connected to the coating portion 300. In this embodiment, the third terminals 243 function as ground terminals connected to the ground wire 245 via the wiring portions 242. With this, the coating portion 300 can be maintained at a reference potential such as a ground potential.

The plurality of fourth terminals 244 are a plurality of pad portions formed in the wiring portions 242 and used for adjusting the sensor properties of the sensor device 1 after the sensor element 100 is mounted on the semiconductor element 200. That is, the plurality of fourth terminals 244 are configured such that an electrode probe that applies an oscillation output for driving the vibrator portion 103 at a resonant frequency, an electrode probe for obtaining a detection signal, and the like are connectable. With this, as will be described later, by performing laser machining or the like on the vibrator portion 103 based on the vibrating state, the vibration properties and the like of the vibrator portion 103 can be adjusted. That is, according to this embodiment, before shipping the sensor device 1, in a state in which the sensor device 1 is not mounted on the control board and the like, the sensor properties of the sensor element 100 can be checked and adjusted.

The ground wire 245 is connected to the first terminals 241 via the wiring portions 242 and further connected to a ground circuit included in the element forming layer 220 via the via-holes 230. The ground wire 245 is not limited to the case where it is connected to the ground potential and may be connected to a predetermined direct-current potential. The ground wire 245 is, for example, formed surrounding a periphery of a recess portion 260 formed in the first surface 201. As in the wiring portions 242, the ground wire 245 is coated with the wiring protection layer 246.

Note that the region in which the ground wire 245 is formed forms a convex portion having a thickness (height) of about 4 μm corresponding to the thickness of the ground wire 245. With this, the ground wire 245 can function as an inflow preventing portion with respect to the resin layer (see FIG. 31) and the like filled as underfill in peripheries of a resin portion 322 (described later) and the first terminals 241, i.e., between the second region 2012 and the sensor element 100. That is, the ground wire 245 can prevent the resin portion 322 and the like from flowing into the first region 2011.

The wiring protection layer 246 is formed of an insulating film that coats the surface of the substrate body 210. The wiring protection layer 246 is formed of, for example, a solder resist film including an epoxy resin. The wiring protection layer 246 coats the wiring portions 242, the ground wire 245, and the apertures of the via-holes 230. With this, it is possible to prevent a short-circuit between the sensor element 100 and these wires. The wiring protection layer 246 has a thickness of about 10 μm, for example. In regions on the first, third, and fourth terminal portions 241, 243, and 244, the wiring protection layer 246 is not formed and connection holes for exposing these terminal portions are formed. Note that the wiring protection layer 246 may completely fill the via-holes 230.

Note that, in FIGS. 4 and 7, the wiring portions 242, the ground wire 245, and the apertures of the via-holes 230 that are coated with the wiring protection layer 246 are shown by the broken lines.

Here, in this embodiment, the first re-wiring layer 240 is not formed and the recess portion 260 is formed in the center portion of the first surface 201. Hereinafter, the recess portion 260 will be described.

(Recess Portion)

Referring to FIGS. 3 and 7, the recess portion 260 is formed in the first surface 201 to be opposed to the vibrator portion 103 of the sensor element 100. In this embodiment, the recess portion 260 is configured as a region from which the center portion of the wiring protection layer 246 is removed by etching or the like. Such a recess portion 260 can ensure a gap between the vibrator portion 103 and the semiconductor element 200 and thus the vibrator portion 103 can be stably driven.

A depth of the recess portion 260 in the Z-axis direction is appropriately set in view of an amount of displacement or the like of each of the pendulum portions 21a, 21b, 22a, and 22b of the vibrator portion 103 in the Z-axis direction. In this embodiment, the displacement of each of the pendulum portions 21a, 21b, 22a, and 22b in the Z-axis direction is several μms and it is only necessary to ensure a depth of about 15 μm or more from the vibrator portion 103 to a bottom of the recess portion 260. Here, due to solder bumps or the like that bond the first terminals 241 and the terminal portions 114 of the sensor element 100, a gap of about 10 to 40 μm is provided between the surface of the wiring protection layer 246 and the vibrator portion 103. Therefore, if the wiring protection layer 246 has a thickness of about 10 μm, by removing the wiring protection layer 246, a gap of about 20 to 50 μm can be ensured between the vibrator portion 103 and the semiconductor element 200.

Note that, in order to ensure a larger gap, the recess portion 260 is formed at a depth reaching the inside of the substrate body 210 as shown in FIG. 3. In this case, after the wiring protection layer 246 of the region in which the recess portion 260 is to be formed is removed, the recess portion 260 can be formed by further etching the substrate body 210 using an etching method such as reactive ion etching (RIE).

Due to the recess portion 260, a sufficient gap can be provided between the vibrator portion 103 and the semiconductor element 200. Thus, a damping effect due to generation of an air flow can be reduced. Therefore, with the recess portion 260, the sensitivity of the sensor element 100 can be stably maintained without interfering with the motion of the vibrator portion 103.

The position and a planar shape of the recess portion 260 in the first surface 201 are not particularly limited as long as it can cover vibration regions of the pendulum portions 21a, 21b, 22a, and 22bs. For example, in a planar view in the Z-axis direction, the recess portion 260 is formed in an approximately square shape similar to a frame portion 10 (described later) that supports each of the pendulum portions 21a, 21b, 22a, and 22b.

In addition, a vibration control member 261 is disposed in the recess portion 260 in this embodiment.

(Vibration Control Member)

The vibration control member 261 is disposed on the first surface 201. For example, the vibration control member 261 is disposed on a bottom surface of the recess portion 260. The position of the vibration control member 261 is not limited thereto. For example, the vibration control member 261 may be disposed from the bottom surface of the recess portion 260 to a side wall surface or may be disposed around the recess portion 260. For the vibration control member 261, for example, an alloy, a rubber, an alloy resin, a composite material thereof for controlling the vibration may be employed. Further, the thickness of the vibration control member 261 is not particularly limited as long as a sufficient gap can be ensured the vibration control member 261 and the vibrator portion 103 when it is disposed in the recess portion 260.

With the vibration control member 261, the vibration of the semiconductor element 200 due to the vibration of the vibrator portion 103 can be suppressed. Therefore, it is possible to suppress the vibration of the sensor element 100 via the semiconductor element 200 and maintain the sensor properties of the sensor element 100.

(Via-Hole)

Referring to FIG. 6, the via-hole 230 includes a wiring portion 231 and an insulating film 232. The via-hole 230 is formed at a depth from the surface of the substrate body 210 to the element forming layer 220 and electrically connects the first surface 201 and the second surface 202 to each other.

The wiring portion 231 is continuously formed from the wiring portion 242 of the first re-wiring layer 240 and is, at the bottom portion of the via-hole 230, connected to the second re-wiring layer 250 via the via-hole connection portion 226 of the fifth metal layer 225. The wiring portion 231 is not limited to the configuration in which it is formed along an inner surface of the via-hole 230 as shown in FIG. 6. The wiring portion 231 may take a configuration in which an electrically conductive material is embedded in the via-hole 230.

The insulating film 232 is disposed between the wiring portion 231 and the substrate body 210 and continuously formed from the insulating film 247 of the first re-wiring layer 240. The insulating film 232 is provided for ensuring insulation of the substrate body 210 and the wiring portion 231. The insulating film 232 is removed at the bottom of the via-hole 230 at which the wiring portion 231 and the second re-wiring layer 250 are connected to each other.

(Second Surface)

Figure 8:
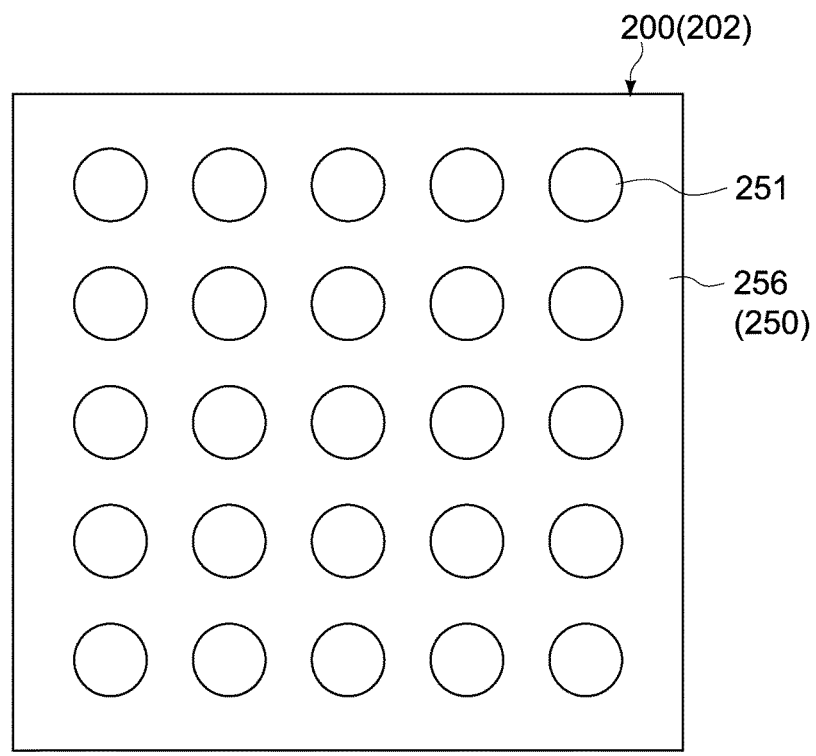
FIG. 8 A plan view showing a configuration of a second surface of the semiconductor element.

FIG. 8 is a schematic plan view showing a configuration of the second surface 202. The second surface 202 includes the plurality of second terminals 251 for external connection. The plurality of second terminals 251 are formed of a plurality of land portions formed on the second re-wiring layer 250 (wiring portions 252 to be described later). The plurality of second terminals 251 are, for example, electrically bonded to the control board or the like of the electronic apparatus (not shown) by a flip chip method via solder bumps. In FIG. 8, the second terminals 251 are formed of 25 island-like land portions arranged in the entire second surface 202. However, it is not limited thereto. It is appropriately set depending on a configuration of the control board or the like to be mounted and a circuit configuration of the element forming layer 220. For example, the ground terminals included in the second terminals 251 may be configured as a single connection terminal having a solid film shape instead of the plurality of land portions.

In the second surface 202, the second re-wiring layer 250 that electrically connects the second terminals 251 and the via-holes 230 to each other is formed.

Referring to FIG. 6, the second re-wiring layer 250 includes the wiring portion 252 pulled out from the via-hole connection portion 226 of the element forming layer 220, a wiring protection layer 256, and an insulating film 257. The wiring portion 252 is formed of a Ti/Cu alloy or the like as in the wiring portion 242 of the first re-wiring layer 240. The wiring portion 252 connects the via-hole 230 and the second terminal 251 to each other. The insulating film 257 is disposed between the wiring portion 252 and the element forming layer 220 and provided for ensuring insulation of them. Due to the provision of the second re-wiring layer 250, the degree of freedom in wiring design of the element forming layer 220 can be increased.

The wiring protection layer 256 is configured to be similar to the wiring protection layer 246. That is, the wiring protection layer 256 is formed of an insulating film that coats the element forming layer 220 and a surface of the wiring portion 252 and formed of, for example, a solder resist film including an epoxy resin. With this, when the sensor device 1 is mounted on the control board (not shown), the short-circuit can be prevented. Note that the wiring protection layer 256 is not formed in regions on the second terminal portions 251 and connection holes for exposing these terminal portions is formed.

[Coating Portion]

Referring to FIG. 2, the coating portion 300 includes the coating film 310 and a sealing portion 320. The coating portion 300 is disposed on the first surface 201 and is configured to coat the sensor element 100.

The coating film 310 includes a first film 311 and a second film 312 and coats the sensor element 100.

The first film 311 is an insulation resin film formed around the sensor element 100 and forms an inner layer portion of the coating film 310. As the insulation resin, for example, an epoxy resin (glass-epoxy resin) including an additive such as a glass fiber may be employed. With this, it is possible to reduce a difference of a linear expansion coefficient from the substrate body 210 of the semiconductor element 200 including Si. Therefore, it is possible to suppress generation of cracks of the coating film 310 due to thermal expansion and suppress fluctuation of the properties of the sensor element 100 and fluctuation of the properties of the semiconductor element 200.

The second film 312 is a film including an electrically conductive material formed on the first film 311 and forms an outer layer portion of the coating film 310. As the film including the electrically conductive material, for example, a resin film including an electrically conductive material such as a silver (Ag) paste or a metal film formed by sputtering, vapor deposition, or the like may be employed.

The second film 312 is bonded on the third terminals 243 of the semiconductor element 200. The bonding method is not particularly limited. The second film 312 may be bonded utilizing the adhesion of a resin film or via a separate electrically conductive adhesive or the like.

The sensor device 1 is generally mounted on the control board together with other electronic components. Therefore, the sensor device 1 can be affected by electromagnetic waves generated from the other electronic components. In addition, the sensor element 100 needs to detect fine displacements of the vibrator vibrating due to the piezoelectric effect, and hence, if electromagnetic waves are added from the outside, the sensor properties may be largely deteriorated.

Therefore, by providing the coating film 310 including the electrically conductive material to coat the sensor element 100, the sensor element 100 can be shielded from such external noise. In addition, the coating film 310 is maintained at the ground potential or the like via the third terminals 243, and hence a more stable shield effect can be obtained.

Further, the coating film 310 exerts a light-shielding function with respect to the sensor element 100. As will be described later, for driving the sensor element 100 and detecting angular velocities, the piezoelectric properties of the piezoelectric film are utilized. However, the piezoelectric film of this type has not only the piezoelectric effect but also a pyroelectric effect. The coating film 310 prevents a driving property of the sensor element 100 and an angular velocity-detecting property from being fluctuated due to a change in polarization properties due to irradiation of external light.

In addition, the coating film 310 also functions as a cover for the sensor device 1. The coating film 310 coats the sensor element 100 and the like, and hence the handleability as the electronic component can be improved.

On the other hand, the sealing portion 320 includes a sealing plate 321 and the resin portion 322 and seals between the coating film 310 and the vibrator portion 103. That is, the sealing portion 320 prevents the coating film 310 from flowing into the space S of the vibrator portion 103 and the first region 2011 of the first surface 201.

The resin portion 322 seals a gap between the sensor element 100 and the semiconductor element 200 that is formed by the thickness of the solder bumps and the like. Specifically, the resin portion 322 is formed of, for example, an epoxy resin including an additive such as a filler and formed surrounding a periphery of the sensor element 100 (see FIG. 2). With this, the coating film 310 can be prevented from flowing through the gap between the sensor element 100 and the semiconductor element 200. Further, the resin portion 322 also functions to protect the solder bumps of the first terminals 241 from corrosion and increase the bonding strength of the first terminals 241 and the terminal portions 114 of the sensor element 100.

The sealing plate 321 is configured as a plate member that is disposed on the frame body 102 and seals an upper portion of the space S. With such a sealing plate 321, inflow of the coating film 310 into the space S of the vibrator portion 103 from the above can be suppressed. The sealing plate 321 is not particularly limited as long as it can coat the space S. For example, the sealing plate 321 is formed in a rectangular shape substantially identical to the outer shape of the frame body 102 in a planar view in the Z-axis direction. The method of bonding the sealing plate 321 and the frame body 102 to each other is not particularly limited. For example, an adhesive or the like may be employed.

The sealing plate 321 may be formed of, for example, a material including an electrically conductive material. With this, the electromagnetic shield function can be added to the sealing plate 321. In this embodiment, the sealing plate 321 has a configuration in which a metal film is formed on a surface of a plate material formed of Si by sputtering, vapor deposition, or the like. With this, the sealing plate 321 has a linear expansion coefficient closer to that of the sensor element 100 formed of Si. Thus, the sealing plate 321 can reduce damage and the like of the bonding portion due to thermal expansion and the like and can also function as an electromagnetic shield. Alternatively, the sealing plate 321 may be formed of a metal plate of a 42 alloy (alloy of minute amount of additives and the like of Nickel (Ni) 42%, iron (Fe) 57%, copper (Cu), and the like), alloy of nickel silver (Cu), zinc (Zn), and Ni), aluminum (Al), or the like.

Figure 9:
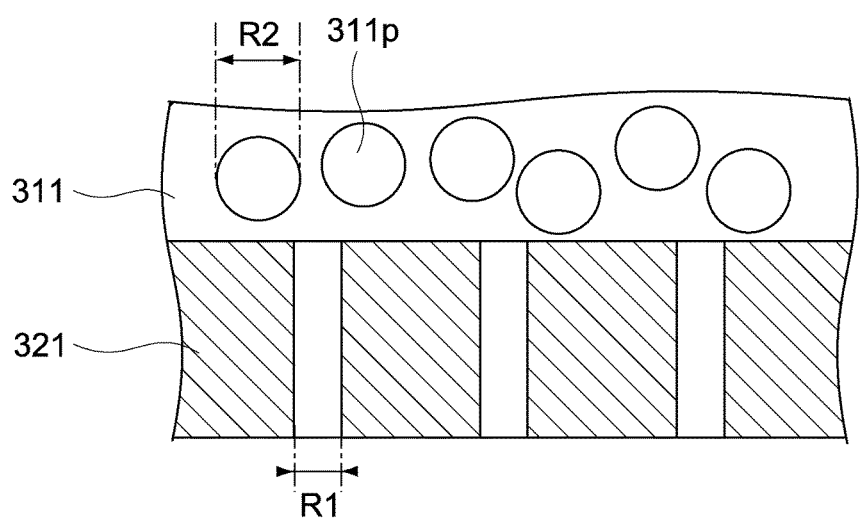
FIG. 9 A diagram explaining a function of the coating portion of the sensor device.

In addition, the sealing plate 321 includes a plurality of fine through-holes 323. FIG. 9 is an enlarged diagram schematically showing cross-sections of the first film 311 and the sealing plate 321. The reference symbol 311p in the figure indicates a resin particle contained in the first film 311 of the coating film 310. The through-holes 323 are configured not to permit the coating film 310 containing the particles 311p to pass therethrough but to permit the air to pass therethrough.

If the space S is completely sealed by the sealing plate 321, there is also a possibility that it is heated in the reflow process and the like when the sensor device 1 is mounted on the control board and the like, the air in the space S is expanded, and cracks are caused in the coating film 310. Further, there is also a fear that, due to a change in pressure due to the temperature change of the space S, the vibration mode of the vibrator portion 103 becomes unstable.

In view of this, by providing the sealing plate 321 with the through-holes 323, it becomes possible to suppress fluctuation of the pressure in the space S and to reduce damage of the coating film 310, instability of the vibration mode, and the like.

The through-holes 323 has a diameter R1 smaller than a diameter R2 of the resin particle 311p contained in the coating film 310 with which the sealing plate 321 is in contact. In addition, the diameter R1 of the through-hole 323 can be set in view of various conditions, for example, a size of an additive such as a glass fiber, viscosity depending on the material of the coating film 310, the thickness of the sealing plate 321 or the coating film 310, or a pressure difference between the space S and the outside in a vacuum deforming process of the coating film 310 (described later). With this, the through-holes 323 that do not permit the coating film 310 to pass therethrough but permit the air to pass therethrough can be formed.

[Sensor Element]

Hereinafter, the configuration and operation of the sensor element 100 will be described again.

Figure 10:
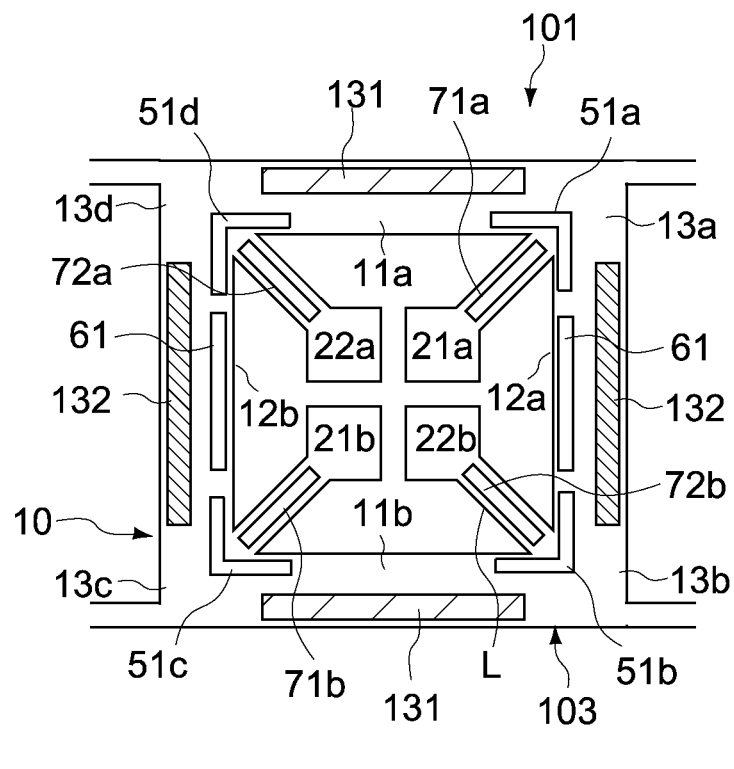
FIG. 10 A schematic plan view of a main part of the sensor element.

FIG. 10 is a plan view schematically showing a configuration of a main part (vibrator portion 103) of the sensor element. As described above, the sensor element 100 includes the detecting portion 101 including the vibrator portion 103 and the detection electrodes 51, 71, and 72 and the frame body 102. The vibrator portion 103 includes an annular frame 10 and the pendulum portions 21a, 21b, 22a, and 22b. The frame 10 is formed of a pair of first beams, a pair of second beams, and connection portions and has four sides. The frame body 102 includes the base 81 and the coupling portion 82.

The frame 10 includes a horizontal direction in an a-axis direction, a vertical direction in a b-axis direction, and a thickness direction in a c-axis direction. On the other hand, in FIG. 10, the Y-axis is set in an axis direction parallel to an a-axis and the X-axis is set in a direction parallel to a b-axis. The Z-axis direction is an axis direction parallel to the c-axis direction.

Each of the sides of the frame 10 functions as a vibration beam. The sides of the frame 10 include a pair of first beams 11a and 11b and a pair of second beams 12a and 12b. The pair of first beams 11a and 11b extends in parallel to each other in the a-axis direction. The pair of second beams 12a and 12b extends in parallel to each other in the b-axis direction orthogonal to the a-axis direction. The beams 11a, 11b, 12a, and 12b have the same length, width, and thickness. An outer appearance of the frame 10 has a hollow square shape.

At sites corresponding to four corners of the frame 10, connection portions 13a, 13b, 13c, and 13d that connect between the pair of first beams 11a and 11b and the pair of second beams 12a and 12b are formed. Both ends of the pair of first beams 11a and 11b and the pair of second beams 12a and 12b are supported by the connection portions 13a to 13d.

The frame 10 further includes first pendulum portions 21a and 21b and second pendulum portions 22a and 22b. The first pendulum portions 21a and 21b are respectively formed in the pair of connection portions 13a and 13c in a diagonal relationship to each other. The first pendulum portions 21a and 21b extend along their diagonal line direction in an inside of the frame 10. The second pendulum portions 22a and 22b are respectively formed in the pair of connection portions 13b and 13d in a diagonal relationship to each other. The second pendulum portions 22a and 22b extend along their diagonal line direction in the inside of the frame 10. One ends of the first and second pendulum portions 21a, 21b, 22a, and 22b are fixed to the connection portions 13a to 13d. The other ends thereof are free ends and function as vibration weights arranged near the center of the frame 10. Further, portions between the one ends fixed to the connection portions 13a to 13d and the other ends will be referred to as arm portions L.

As a drive unit that vibrates the frame 10, the sensor element 100 includes first driving electrodes 131 arranged along the pair of first beams 11a and 11b in their upper surfaces and second driving electrodes 132 arranged along the pair of second beams 12a and 12b in their upper surfaces. The driving electrodes 131 and 132 are mechanically deformed according to input voltages and vibrate the beams 11a, 11b, 12a, and 12b with driving force of the deformation. The deformation directions are controlled by a polarity of the input voltage. In FIG. 10, for the sake of easy understanding, the driving electrodes 131 and 132 are shown by different kinds of hatching.

The driving electrodes 131 and 132 have the same configuration. Although the illustration is omitted, the driving electrodes 131 and 132 each have a laminate structure of upper and lower electrode layers and a piezoelectric material layer formed between these electrode layers. The piezoelectric material layer is formed of, for example, lead zirconate titanate (PZT) and polarized and aligned such that it is expanded and contracted according to a potential difference between the lower electrode layer and the upper electrode layer. Therefore, by connecting the lower electrode layer of each of the driving electrodes 131 and 132 to a common reference potential and applying an alternate-current voltage, the piezoelectric material layer can be expanded and contracted.

Here, an operation principle of the sensor element 100 will be described.

Voltages of opposite phases are applied on the first driving electrodes 131 and the second driving electrodes 132 such that one is expanded while the other is contracted. With this, the beams 11a and 11b and the beams 12a and 12b undergo flexural deformation in the b-axis and a-axis directions with the both ends being supported by the connection portions 13a to 13d, and alternately vibrate in a direction to be separated from each other in the XY-plane and a direction to approach each other.

Therefore, if the pair of first beams 11a and 11b vibrate in the direction to approach each other, the pair of second beams 12a and 12b vibrates in the direction to be separated from each other. If the pair of first beams 11a and 11b vibrates in the direction to be separated from each other, the pair of second beams 12a and 12b vibrates in the direction to approach each other. At this time, a center portion of each of the beams 11a, 11b, 12a, and 12b forms an antinode of the vibration and the both end portions thereof (connection portions 13a to 13d) form a node of the vibration. Hereinafter, such a vibration mode will be referred to as fundamental vibration of the frame 10.

The beams 11a, 11b, 12a, and 12b vibrate at their resonant frequency. The resonant frequency of each of the beams 11a, 11b, 12a, and 12b is defined by its shape, length, and the like. For example, in this embodiment, the resonant frequency of the beams 11a, 11b, 12a, and 12b is set within a range of 1 to 100 kHz.

Figure 11:
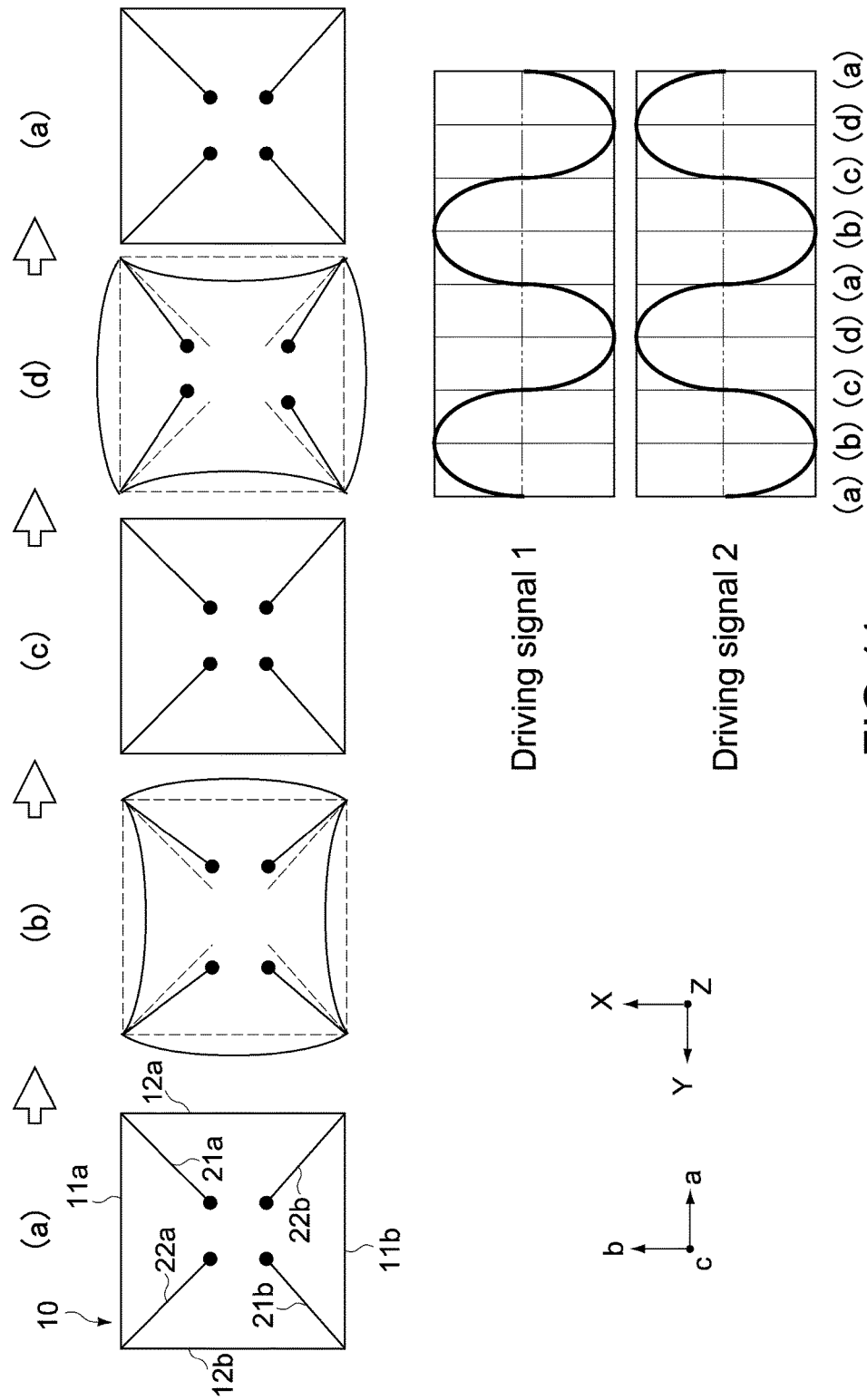
FIG. 11 A diagram explaining a vibration mode of the sensor element.

FIG. 11 is a schematic diagram showing a change over time of the fundamental vibration of the frame 10. In FIG. 11, a "driving signal 1" indicates a change over time of an input voltage applied on the first driving electrodes 131 and a "driving signal 2" indicates a change over time of an input voltage applied on the second driving electrodes 132. As shown in FIG. 11, the driving signal 1 and the driving signal 2 have an alternate-current waveform changing in opposite phases. With this, the frame 10 changes in the order of (a), (b), (c), (d), (a), . . . and the frame 10 vibrates on a vibration mode on which when one pair of the pair of first beams 11a and 11b and the pair of second beams 12a and 12b approaches each other, the other pair is separated from each other and when the one pair is separated from each other, the other pair approaches each other.

Note that a delay time actually exists from the application of the input signal to the change (displacement) of the frame due to influences of a response time and an input operation frequency of a piezoelectric substance, a resonant frequency of the frame, and the like. In this example, the change over time of FIG. 11 is described assuming that the delay time is sufficiently small.

Further, along with the above-mentioned fundamental vibration of the frame 10, the first pendulum portions 21a and 21b and the second pendulum portions 22a and 22b also vibrate in synchronization with the vibration of the frame 10 with the connection portions 13a to 13d being centers in the XY-plane. The vibration of the pendulum portions 21a, 21b, 22a, and 22b are excited by the vibration of the beams 11a, 11b, 12a, and 12b. In this case, the first pendulum portions 21a and 21b and the second pendulum portions 22a and 22b vibrate (swing) in opposite phases at a supporting portion of the pendulum portion in the XY-plane, that is, in left and right swinging directions from the connection portions 13a to 13d.

As shown in FIG. 11, when the pair of first beams 11a and 11b vibrates in the direction to approach each other, the first pendulum portion 21a and the second pendulum portion 22a vibrate in the direction to be separated from each other (state (b)). When the pair of first beams 11a and 11b vibrate in the direction to be separated from each other, the first pendulum portion 21a and the second pendulum portion 22a vibrate in the direction to approach each other (state (d)). The first pendulum portion 21b and the second pendulum portion 22b also alternately vibrate in the direction to be separated from each other and in the direction to approach each other depending on the vibration directions of the pair of second beams 12a and 12b. As described above, the first pendulum portions 21a and 21b and the second pendulum portions 22a and 22b vibrate in opposite phases in synchronization with the fundamental vibration of the frame 10.

Figure 12:
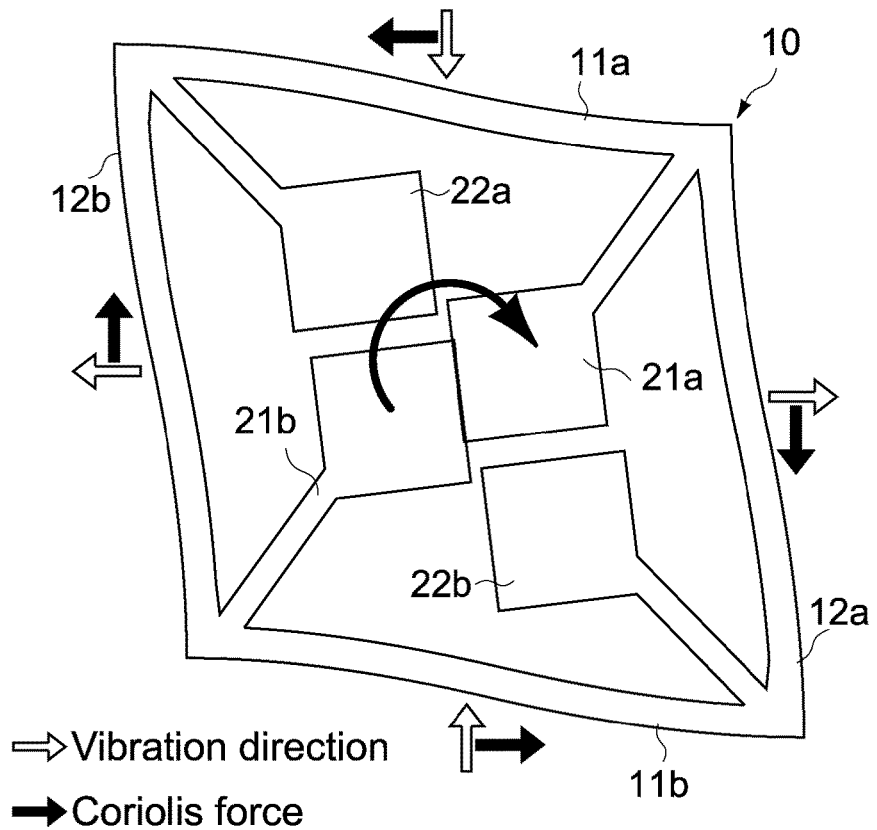
FIG. 12 A diagram explaining an operation of the sensor element.

The alternate-current voltage of the opposite phases are applied on the driving electrodes 131 and 132 in the above-mentioned manner as described above, and hence the beams 11a, 11b, 12a, and 12b of the frame 10 vibrate on the vibration mode shown in FIG. 11. When an angular velocity around the Z-axis acts on the frame 10 continuing such a fundamental vibration, Coriolis force resulting from the angular velocity acts on each point of the frame 10, and thus the frame 10 is deformed to be crushed in the XY-plane as shown in FIG. 12. Therefore, by detecting the deformation amount of the frame 10 in this XY-plane, it is possible to detect the magnitude and direction of the angular velocity acting on the frame 10.

FIG. 12 is a plan view schematically showing the frame 10 deformation of the frame 10 at a point of time when an angular velocity acts around the Z-axis. Note that, for the sake of easy explanation, the shape and deformation of the frame 10 are slightly exaggerated in the figure. When an angular velocity in a clockwise direction about the Z-axis acts on the frame 10 vibrating as the fundamental vibration, Coriolis force proportional to the magnitude of the angular velocity is generated at points (beams 11a, 11b, 12a, and 12b, pendulum portions 21a, 21b, 22a, and 22b) within the frame 10. Here, in the XY-plane orthogonal to the Z-axis, the Coriolis force of each of the points is in a direction that forms in a clockwise direction 90 degrees with its moving direction (vibration direction) at that point of time. That is, the direction of the Coriolis force depends on the vibration direction of the point on which the Coriolis force acts at that point of time as shown in FIG. 12. With this, the frame 10 is crushed (warped) in the XY-plane to change from the square shape to an approximately parallelogram shape.

Note that FIG. 12 shows how a predetermined angular velocity acts in the clockwise direction about the Z-axis. Note that, if the direction of the angular velocity is opposite (counterclockwise direction), the direction of the Coriolis force acting on each point also becomes opposite.

Any means may be used for detecting the angular velocity acting on the frame 10. In this embodiment, the angular velocities are detected by a piezoelectric detection layer formed in the frame 10. The sensor element 100 detects the angular velocity around the Z-axis as the piezoelectric detection layer and includes four detection electrodes 51 as shown in FIG. 10.

Detection electrodes 51a, 51b, 51c, and 51d are formed in peripheries of the connection portions 13a to 13d, respectively. The detection electrodes 51a to 51d extends from the connection portions 13a to 13d along the beams in two directions, respectively. The detection electrodes 51 have the same configuration as the driving electrodes 131 and 132. Thus, the detection electrode 51 is formed of a laminate of a lower electrode layer, a piezoelectric material layer, and an upper electrode layer. The detection electrode 51 functions to convert a mechanical deformation of each beam into an electrical signal.

On the other hand, as the piezoelectric detection layer that detects angular velocities around the X-axis and the Y-axis, the sensor element 100 of this embodiment includes detection electrodes 71a, 71b, 72a, and 72b formed on pendulum portions 21a, 21b, 22a, and 22b.

The detection electrodes 71a, 71b, 72a, and 72b are linearly formed on axial centers of the arm portions L of the pendulum portions 21a, 21b, 22a, and 22b. The detection electrodes 71a, 71b, 72a, and 72b have the same configuration as the first and second driving electrodes 131 and 132. Thus, each of the detection electrodes 71a, 71b, 72a, and 72b is formed of a laminate of a lower electrode layer, a piezoelectric material layer, and an upper electrode layer and functions to convert a mechanical deformation of the arm portion L into an electrical signal. In particular, the detection electrodes 71a, 71b, 72a, and 72b functions to detect a deformation of the arm portion L in the Z-axis direction.

In this embodiment, one angular velocity detection axis (Y-axis) is set in an axis direction parallel to the a-axis and the other angular velocity detection axis (X-axis) is set in an axis direction parallel to the b-axis. In such a configuration, each of the detection electrodes 71a, 71b, 72a, and 72b formed in the pendulum portions 21a, 21b, 22a, and 22b functions as a detecting portion for detecting each of the angular velocity around the X-axis and the angular velocity around the Y-axis.

Figure 13:
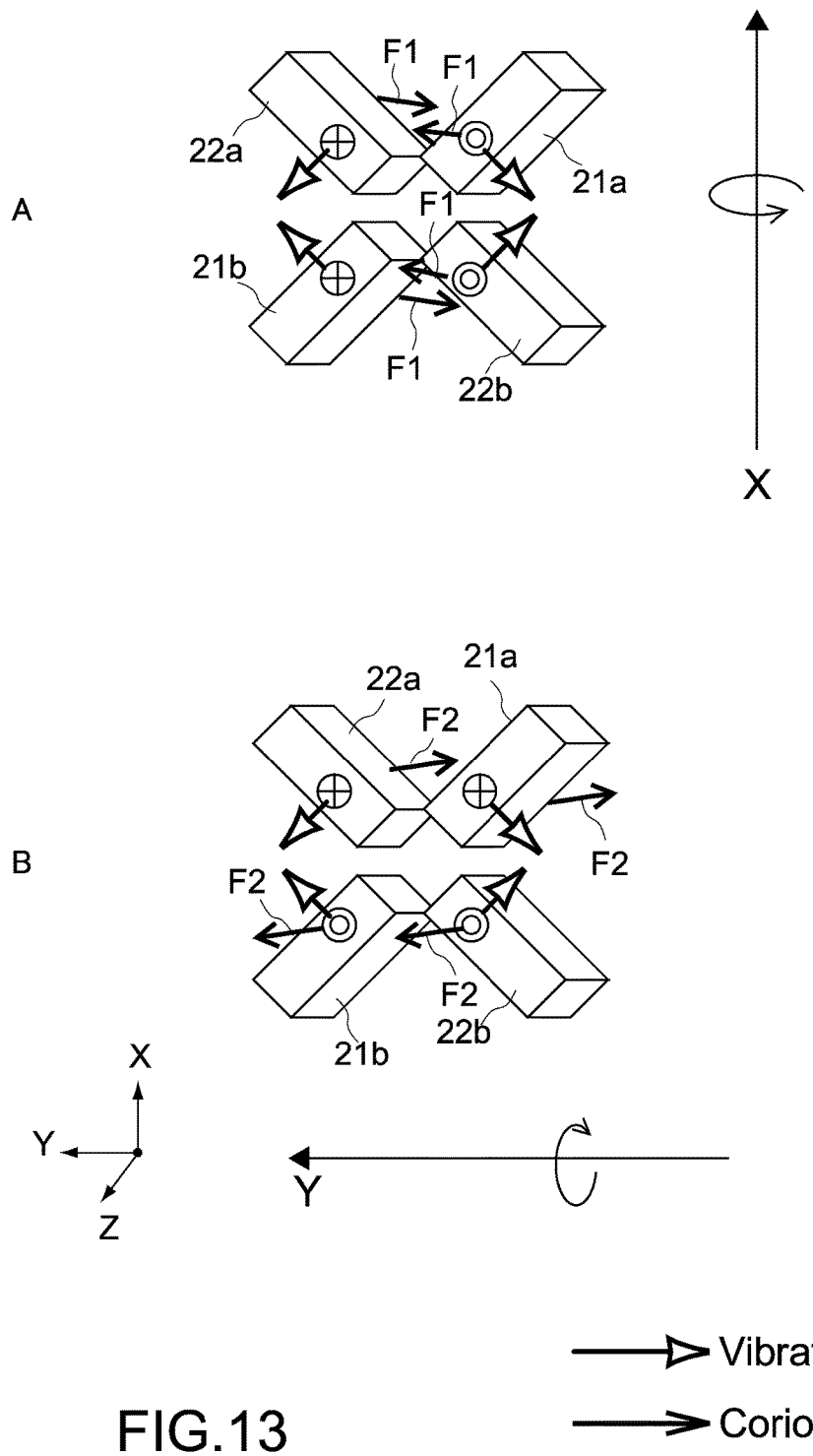
FIG. 13 A diagram explaining another operation of the sensor element.

Alternate-current voltages of opposite phases are applied on the driving electrodes 131 and 132. With this, each of the beams 11a, 11b, 12a, and 12b and the pendulum portions 21a, 21b, 22a, and 22b of the frame 10 vibrates on the vibration mode shown in FIG. 11 (fundamental vibration). FIG. 13A is a schematic perspective view explaining a vibration state of the pendulum portions 21a, 21b, 22a, and 22b when the angular velocity around the X-axis acts on the frame 10. On the other hand, FIG. 13B is a schematic perspective view explaining a vibration state of the pendulum portions 21a, 21b, 22a, and 22b when the angular velocity around the Y-axis acts on the frame 10.

When the angular velocity around the X-axis acts on the frame 10 vibrating as the fundamental vibration, as shown in FIG. 13A, Coriolis force F1 in a direction orthogonal to a vibration direction at that point of time is generated in each of the pendulum portions 21a, 21b, 22a, and 22b. With this, the one pair of the pendulum portion 21a and the pendulum portion 22b proximate to each other in the X-axis direction is deformed in a positive direction of the Z-axis due to the Coriolis force F1. Their deformation amounts are detected by the detection electrodes 71a and 72b. Further, the other pair of pendulum portions 22a and 21b proximate to each other in the X-axis direction is deformed in a negative direction of the Z-axis due to the Coriolis force F1. Their deformation amounts are detected by the detection electrodes 72a and 71b.

On the other hand, when the angular velocity around the Y-axis acts on the frame 10 vibrating as the fundamental vibration, as shown FIG. 13B, Coriolis force F2 is generated in a direction orthogonal to a vibration direction at that point of time in each of the pendulum portions 21a, 21b, 22a, and 22b. With this, one pair of the pendulum portion 21a and the pendulum portion 22a proximate to each other in the Y-axis direction is deformed in the negative direction of the Z-axis due to the Coriolis force F2. Their deformation amounts are detected by the detection electrodes 71a and 72a. Further, the other pair of pendulum portions 21b and 22b proximate to each other in the Y-axis direction is deformed in the positive direction of the Z-axis due to the Coriolis force F2. Their deformation amounts are detected by the detection electrodes 71b and 72b.

Also if an angular velocity is generated around an axis in a direction obliquely crossing each of the X-axis and the Y-axis, the angular velocity is detected by the same principle as described above. That is, each of the pendulum portions 21a, 21b, 22a, and 22b is deformed due to Coriolis force depending on an X-direction component and a Y-direction component of this angular velocity. Their deformation amounts are detected by the detection electrodes 71a, 71b, 72a, and 72b. A driving circuit of the sensor element extracts, based on outputs of these detection electrodes, each of the angular velocity around the X-axis and the angular velocity around the Y-axis. With this, an angular velocity around an arbitrary axis parallel to the XY-plane can be detected.

[Functional Configuration of Semiconductor Element]

The semiconductor element 200 is used as the controller of the sensor element 100 as described above. Hereinafter, an outline of a functional configuration of the semiconductor element 200 will be described.

As described above, the semiconductor element 200 includes the first terminal portions 241 electrically connected to the terminal portions 114 of the sensor element 100. The first terminal portions 241 are electrically connected to the element forming layer 220 via the via-holes 230.

The element forming layer 220 includes a self-oscillation circuit, a wave detection circuit, and a smoothing circuit. The self-oscillation circuit is connected to the driving electrodes 131 and 132 and generates driving signals (alternate-current signals) for driving them. Further, on a terminal side to be connected to one of the driving electrodes 131 and 132, an inverting amplifier is provided. Thus, the driving electrodes 131 and 132 can be expanded and contracted in opposite phases. A terminal to be connected to a reference potential may be further provided.

Further, each of the detection electrodes 51a to 51d, 71a, 71b, 72a, and 72b is connected to the arithmetic circuit and an electrical signal depending on a deformation of each detection electrode is detected. The arithmetic circuits are provided for generating angular velocity signals around the X-axis, the Y-axis, and the Z-axis. The arithmetic circuits perform predetermined arithmetic processing (difference calculation, etc.) on the electrical signals output from the detection electrodes 51a to 51d, 71a, 71b, 72a, and 72b, to thereby generate new arithmetic signals including the signals relating to the angular velocities.

Next, these arithmetic signals are output to the wave detection circuit. In the wave detection circuit, in synchronization with the outputs or the like of the driving signals from the self-oscillation circuit, all the arithmetic signals are rectified and DC-converted. In addition, the DC-converted signals are output to the smoothing circuit and smoothed. The thus obtained DC voltage signals include the magnitude and direction of the angular velocities around the X-axis, the Y-axis, and the Z-axis. These DC voltage signals can be configured to be output from the via-hole connection portions 226 of the element forming layer 220 to other control boards or the like via the second terminals 251 of the second re-wiring layer 250.

In the sensor device 1 having the above-mentioned configuration, the sensor element 100 and the semiconductor element 200 as a controller therefor are directly bonded to each other in the Z-axis direction. With this, it is unnecessary to mount the sensor element 100 and the controller 300 in the same plane. Thus, the sensor device 1 can be downsized. Further, the sensor element 100 and the semiconductor element 200 can be connected to each other without interposing a wiring board, an interposer, or the like in which the semiconductor element 200 is embedded. Thus, the sensor device 1 can be further downsized. Further, the production costs can also be reduced.

Further, by directly mounting the sensor element 100 and the semiconductor element 200, it becomes possible to reduce noise and detect the angular velocities with high accuracy. That is, if the wiring board, the interposer, or the like is interposed, there is a fear that parasitic capacitance and crosstalk problems and the like are caused, which makes it difficult for the S (Signal)/N (Noise) ratio to increase.

Therefore, with the above-mentioned configuration, the parasitic capacitance, the crosstalk, and the like are not generated and the S/N ratio can be increased.

Further, the sensor device 1 has a configuration in which the sensor element 100 is mounted on the inactive surface of the semiconductor element 200. With this, as described below, it becomes possible to maintain desired sensor properties.

For example, if the sensor element is mounted on the active surface of the semiconductor element, the gap with respect to the element forming layer of the semiconductor element is changed due to driving of the vibrator portion. With this, there is a fear that the capacitance between the vibrator portion and the element forming layer may be changed and the circuit properties may be changed. Further, a wiring pattern of the sensor element and a wiring pattern of the element forming layer are opposed to each other, and hence they can interfere with each other and crosstalk between the wires can be generated.

In addition, if a predetermined gap is provided between the vibrator portion and the semiconductor element, separation of the wiring protection layer formed on the active surface, etching of the element forming layer, and the like are required, and hence there is a fear that the element forming layer is damaged. Further, if the terminal of the sensor element and the terminal of the semiconductor element are connected to each other with a gap having a predetermined size or a larger size being ensured for avoiding the damage of the element forming layer, it can be difficult for the entire sensor device to be downsized and the structure can become fragile.

In view of this, by mounting the sensor element 100 on the inactive surface of the semiconductor element 200, the recess portion 230 can be formed in the inactive surface and a suitable gap can be provided. With this, malfunction due to the change of the circuit properties, the crosstalk, or the like can be suppressed and the vibrator portion 103 can be suitably driven. Thus, the accuracy as the sensor device 1 can be increased. Further, the vibration control member 231 can be disposed in the recess portion 230. Thus, it becomes possible to suppress the vibration of the semiconductor element 200 due to the vibration of the vibrator portion 103 and the vibration of the sensor element 100 itself.

Further, in the first surface 201 and the second surface 202 of the semiconductor element 200, the first re-wiring layer 240 and the second re-wiring layer 250 are formed, respectively. With this, also in the case where the sensor element 100 is mounted on the first surface 201 that is the inactive surface, a wiring length can be adjusted to be shorter. Therefore, also with this, the crosstalk and the like between the wires can be suppressed and a desired S/N ratio can be obtained.

Further, in this embodiment, the thickness of the sensor element 100 is formed to be larger than the thickness of the semiconductor element 200. Specifically, the thickness of the frame body 102 in which the terminal portions 114 of the sensor element 100 is formed is configured to be about 3.4 times as large as the thickness of the semiconductor element 200. With this, also in the case where the semiconductor element 200 is made thinner, the strength as the entire sensor device 1 can be increased and deformation such as a warp of the semiconductor element 200 can be suppressed. Therefore, the vibration mode of the sensor element 100 can be stably maintained. At the same time, it becomes possible to reduce problems such as damage after mounting on the control board and the like. Note that the above-mentioned actions and effects can be effectively exerted, for example, as long as the thickness of the sensor element 100 is 1.5 times or more as large as the thickness of the semiconductor element 200.

Further, by setting the second layer 112 of the sensor element 100 to be thick, in the manufacturing process for the sensor element 100, it is possible to simplify or omit the grinding process and the like for adjusting the second layer 112 to have a predetermined thickness. With this, the productivity can be increased also in manufacturing the sensor element 100.

In addition, both of the sensor element 100 and the semiconductor element 200 according to this embodiment are made from a silicon substrate. With this, the linear expansion coefficient of the sensor element 100 and the linear expansion coefficient of the semiconductor element 200 can be substantially identical. Therefore, it is possible to suppress fluctuation of the vibration properties of the sensor element 100 and the operation of the semiconductor element 200 due to a temperature change. At the same time, generation of stress of the semiconductor element 200 and the like due to deformation of the sensor element 100 and the semiconductor element 200 can be suppressed.

Further, the modulus of longitudinal elasticity of Si is about 131 GPa which is larger than the modulus of longitudinal elasticity 0.06 to 12 GPa of an epoxy resin as a main material for an organic substrate. That is, by employing a silicon substrate as the substrate body 210 of the semiconductor element 200, the sensor element 100 can be stably supported in comparison with the case where the organic substrate or the like is employed. More specifically, the sensor element 100 vibrates at the resonant frequency, and hence this vibration is transmitted also to the semiconductor element 200. If the modulus of longitudinal elasticity of the semiconductor element 200 is small, the semiconductor element 200 also vibrates according to this vibration. With this, it can influence the resonant frequency of the sensor element 100 and the vibration mode can be changed. Therefore, the substrate body 210 of the semiconductor element 200 is formed of a silicon substrate, and hence it can be configured to have a relatively large modulus of longitudinal elasticity that is approximately equal to that of the sensor element 100 and the sensor element 100 can be stably supported.

On the other hand, with the above-mentioned configuration, in manufacturing the sensor device 1, action and effect that, also in the case where a process of adjusting the vibration properties of the vibrator portion 103 by laser machining, it can be performed without damaging the element forming layer 220. Hereinafter, the manufacturing method for the sensor device 1 will be described.

[Manufacturing Method for Sensor Device]

Figure 14:
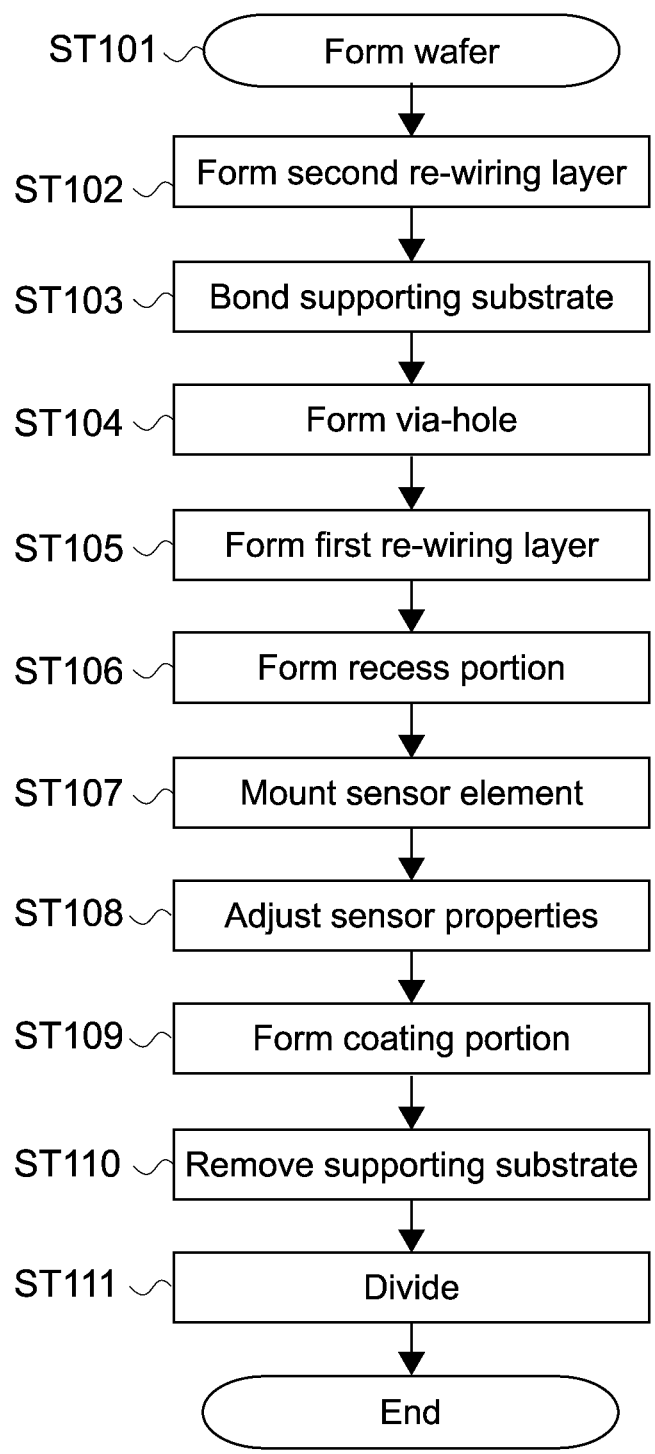
FIG. 14 A process flow diagram showing an embodiment of a manufacturing method for the sensor device.

FIG. 14 is a process flow diagram showing an embodiment of the manufacturing method for the sensor device 1 according to this embodiment. FIGS. 15 to 24 are schematic cross-sectional views for describing the manufacturing method. In this embodiment, a wafer in which a plurality of element regions are formed is fabricated. The sensor element 100 is mounted on each of the element regions. In this manner, a so-called wafer on chip type element is fabricated. After that, it is divided for each of the element regions such that the sensor device 1 having the above-mentioned configuration is manufactured. Note that, in FIGS. 15 to 24, for the sake of description, two element regions are shown with a main part being exaggerated.

Figure 15:
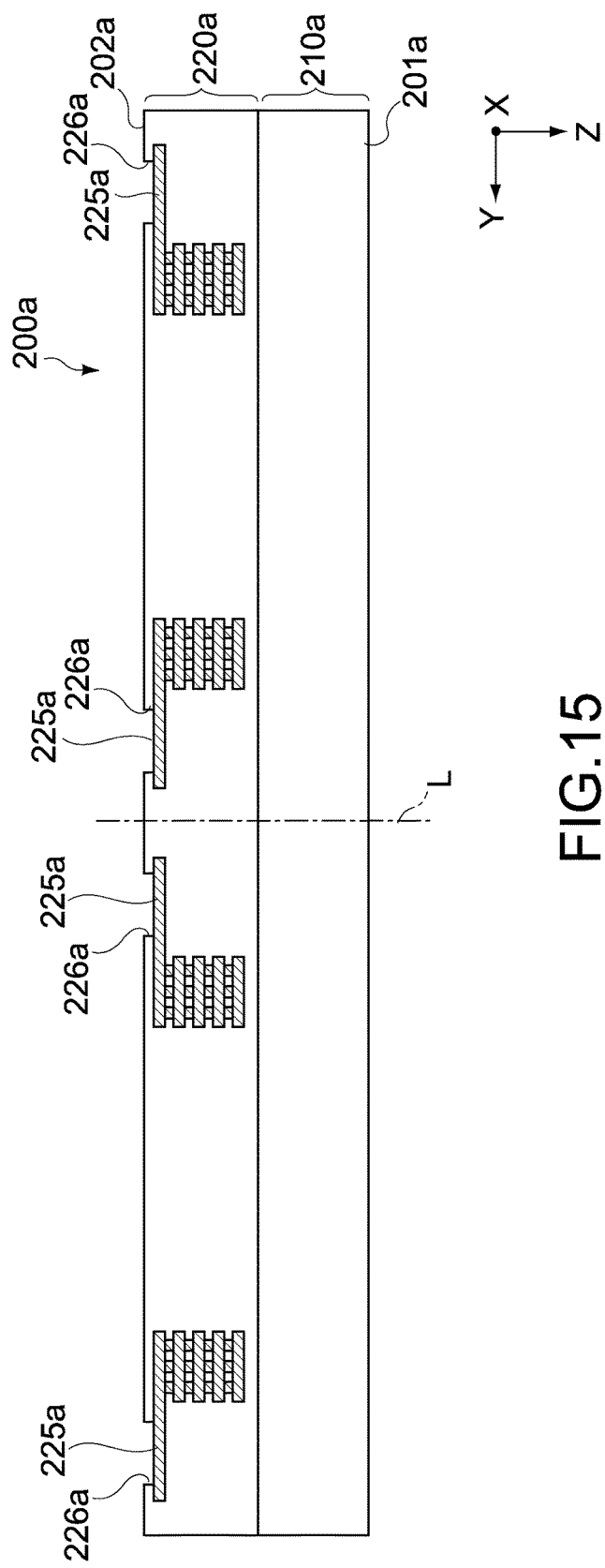
FIG. 15 A schematic cross-sectional view explaining a manufacturing process for the sensor device.

First, referring to FIG. 15, an element forming layer 220*a* including a transistor element, a resistance element, a wire, and the like is laminated on a substrate body 210*a*, such that a wafer 200a is formed (ST101). Note that FIGS. 15 to 20 show a vertically inverted state in comparison with FIGS. 2 and 3 and the like.

The substrate body 210a is, for example, formed of a silicon substrate having a diameter of 8 inches and a thickness of about 600 µm.

The element forming layer 220a is, for example, formed by alternately laminating five metal layers and insulating layers and configured to have an entire thickness of about 5 to 7 µm.

The wafer 200a includes a top surface 202a on a side of the element forming layer 220a and a back surface 201a on a side of the substrate body 210a. A partial region of the top surface 202a is etched and connection holes 226a through which fifth metal layers 225a of the element forming layer 220a are exposed are formed. The connection holes 226a correspond to the via-hole connection portions 226. Note that the top surface 202a is a surface on a side of the second surface 202 and the back surface 201a is a surface on a side of the first surface 201.

In the wafer 200a, the plurality of element regions divided by a scribe line L in the X-axis direction and the Y-axis direction are formed. The scribe line L may be virtual or may be actually formed as a groove or the like.

Figure 16:
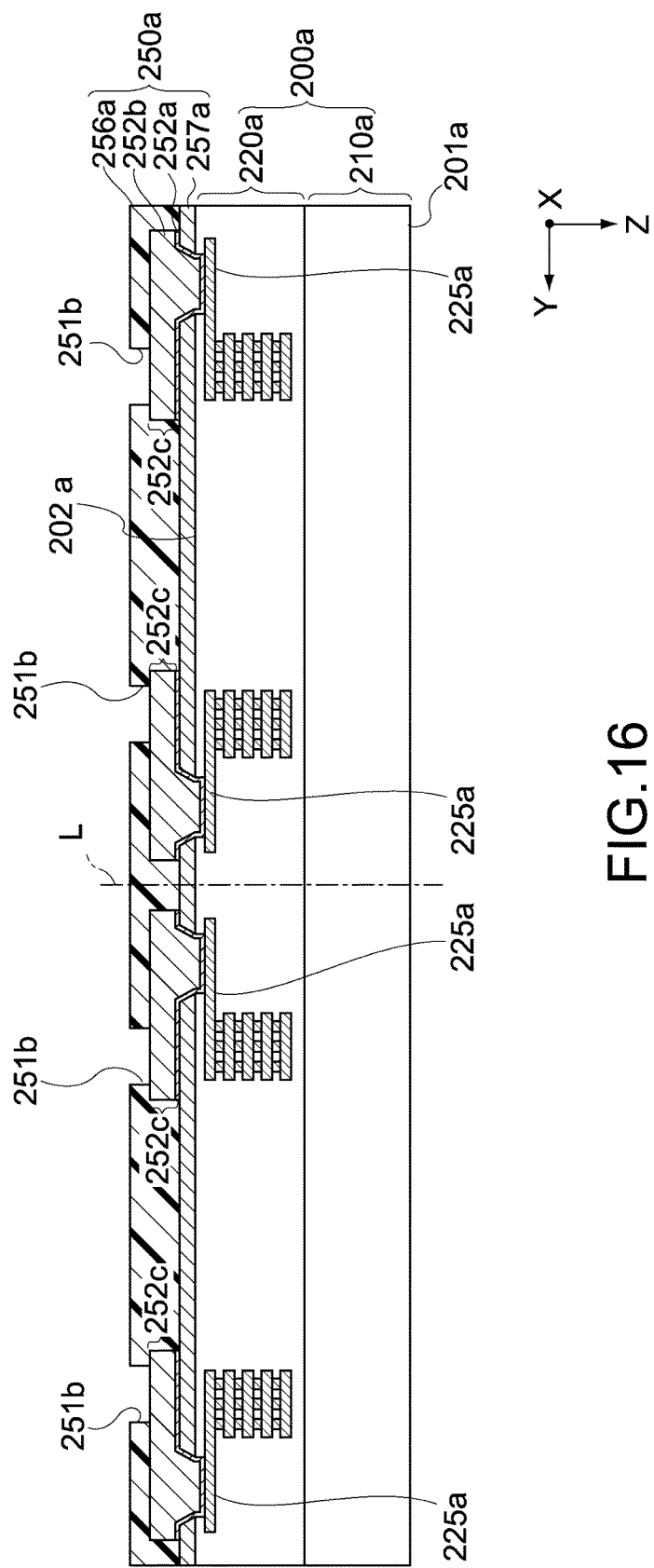
FIG. 16 A schematic cross-sectional view explaining the manufacturing process for the sensor device.

Next, referring to FIG. 16, a second re-wiring layer 250a is formed on the top surface 202a of the wafer 200a (ST102).

Specifically, an insulating film 257a is first formed on the top surface 202a. For the insulating film 257a, a photosensitive resin such as polybenzoxazole (PBO) can be employed. The insulating film 257a is formed to have a thickness of about 5 µm. Regions of the insulating film 257a, which are formed on the connection holes 226a, are removed by photolithography or the like.

A plating seed layer 252a is formed on the entire top surface 202a by sputtering or the like. The plating seed layer 252a can be a laminate film of Ti and Cu, for example.

Next, a resist film in which a pattern corresponding to the wiring portions 252 of the second re-wiring layer 250 is formed is formed on the plating seed layer 252a.

In addition, metal films 252b are formed on the plating seed layer 252a by electrolytic plating. By removing the resist film and removing the plating seed layer 252a in regions in which the metal films 252b are not deposited, wiring portions 252c having a predetermined pattern are formed. Note that, by gold-plating surfaces of the wiring portions 252c, a connection resistance between the second terminals 251 and the wiring portions 252c can be reduced.

In addition, a wiring protection layer 256a having a thickness of about 15 µm, for example, is formed on the metal films 252b and the insulating film 257a. Further, connection holes 251b for forming the second terminals 251 are formed in the wiring protection layer 256a. Note that, as the second terminals 251, metal films for solder connection may be formed in the connection holes 251b.

With this, the second re-wiring layer 250a having a configuration in which the wiring protection layer 256a is formed on the wiring portions 252c having the predetermined pattern can be formed.

Figure 17:
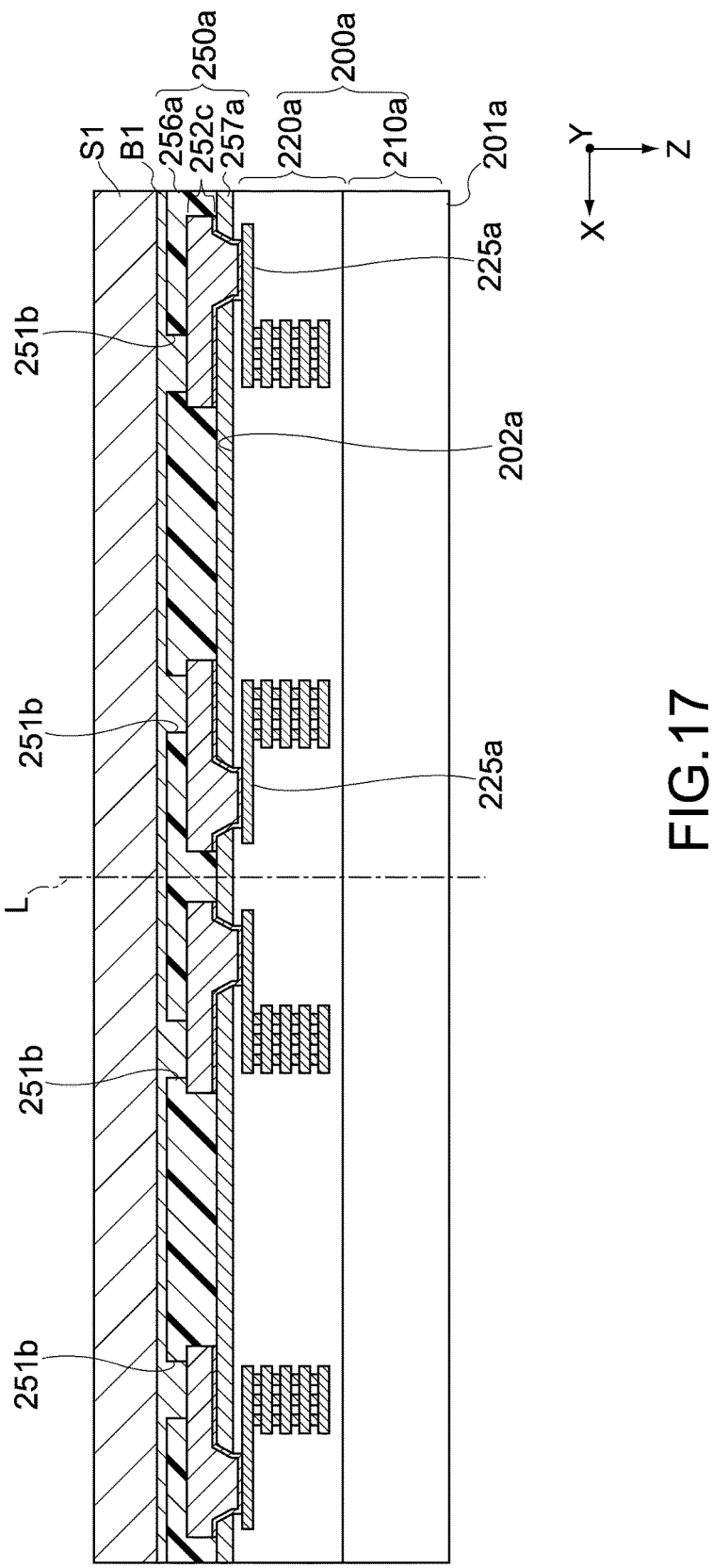
FIG. 17 A schematic cross-sectional view explaining the manufacturing process for the sensor device.

Subsequently, referring to FIG. 17, a supporting substrate S1 is bonded on the second re-wiring layer 250a (ST103).

The supporting substrate S1 can be a glass substrate as large as or larger than the wafer 200a in a planar view, for example. Further, for bonding the supporting substrate S1, an adhesive B1 formed of a viscous ultraviolet curable resin or the like can be used. The adhesive B1 is applied on the wiring protection layer 256a including the connection holes 251a.

In addition, after the supporting substrate S1 is bonded, a process of adjusting the substrate body 210a to have a desired thickness may be performed. Specifically, at the end of this process (ST103), the wafer 200a has an entire thickness of about 600 µm. In view of this, by grinding or dry-etching the substrate body 210a, for example, the wafer 200a is set to have an entire thickness of about 100 µm. With this, a thinner semiconductor element 200 can be fabricated.

Figure 18:
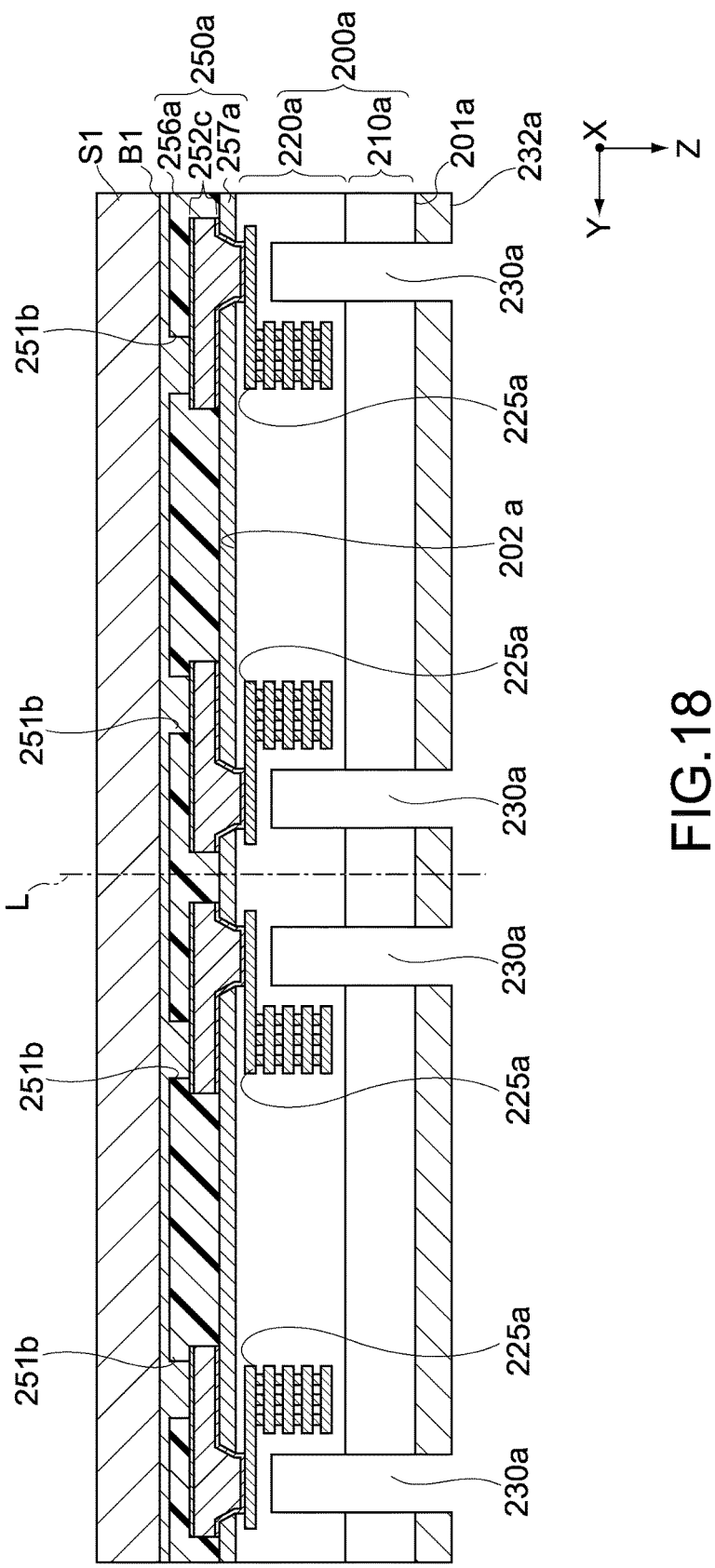
FIG. 18 A schematic cross-sectional view explaining the manufacturing process for the sensor device.

Next, referring to FIG. 18, connection holes 230a for forming the via-holes 230 are formed from the back surface 201a (ST104).

Specifically, a resist film 232a having a pattern corresponding to the via-holes 230 is first formed.

The connection holes 230a are formed by, for example, reactive ion etching (RIE) using the resist film 232a as a mask. The connection holes 230a are formed at a depth reaching the element forming layer 220a. The connection holes 230a are, for example, formed at a depth reaching near fifth metal films 225a.

Then, the resist film 232a is removed by etching or the like.

Figure 19:
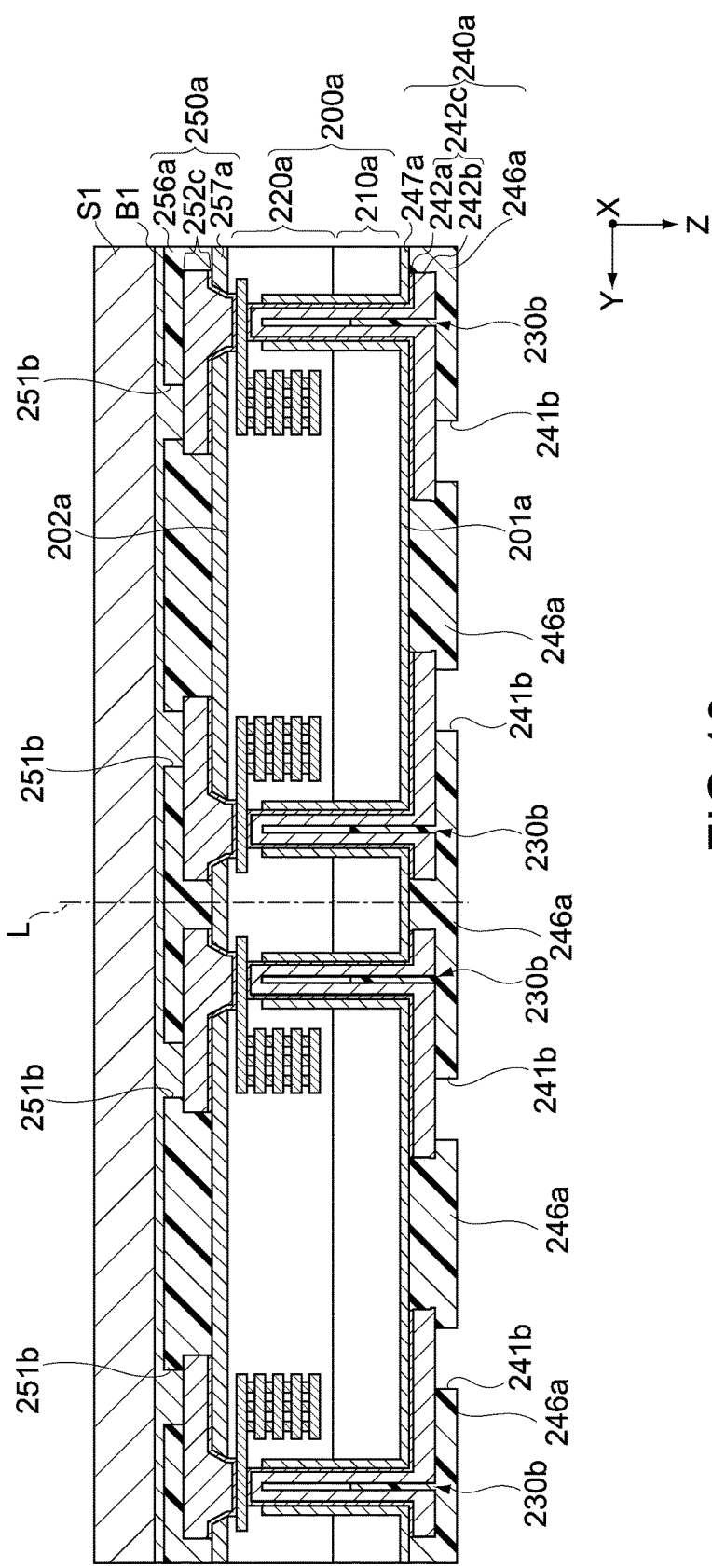
FIG. 19 A schematic cross-sectional view explaining the manufacturing process for the sensor device.

Subsequently, referring to FIG. 19, a first re-wiring layer 240a is formed (ST105).

Specifically, by a CVD method or the like, an insulating film 247a is formed on the back surface 201a and in the connection holes 230a.

Then, bottoms of the connection holes 230a and the insulating film 247a formed on the bottoms are deeply etched by oxygen plasma or the like. With this, the connection holes having a depth reaching the fifth metal films 225a are formed.

In addition, a plating seed layer 242a is formed on the insulating film 247a and in connection holes 230b by sputtering or the like. The plating seed layer 242a can be formed as a laminate film of Ti and Cu, for example.

Further, a resist film in which a pattern corresponding to the wiring portions 242 of the first re-wiring layer 240 is formed is formed on the plating seed layer 242a.

In addition, metal films 242b are formed on the plating seed layer 242a by electrolytic plating. By removing the resist film and removing the plating seed layer 242a in regions in which the metal films 242b are not deposited, wiring portions 242c having a predetermined pattern are formed. The wiring portions 242c correspond to the wiring portions 242 of the first re-wiring layer 240 and the wiring portions 231 of the via-holes 230. Note that, by gold-plating surfaces of the wiring portions 252c, a connection resistance between external connection terminals (described later) and the wiring portions 252c can be reduced.

In addition, a wiring protection layer 246a having a thickness of about 15 µm, for example, is formed on the metal films 242b and the insulating film 247a. The wiring protection layer 246a is formed also in the connection holes 230b in which the metal films 242c are formed. Further, connection holes 241b through which the wiring portions 242c are exposed are formed in the wiring protection layer 246a by photolithography, for example. The first terminals 241, the third terminals 243, and fourth terminals 244 are formed in the connection holes 241b. Note that metal films for solder connection may be formed in the connection holes 241b as the first terminals 241.

With this, the first re-wiring layer 240a having a configuration in which the wiring protection layer 246a is formed on the wiring portions 242c having a predetermined pattern is formed can be formed.

Figure 20:
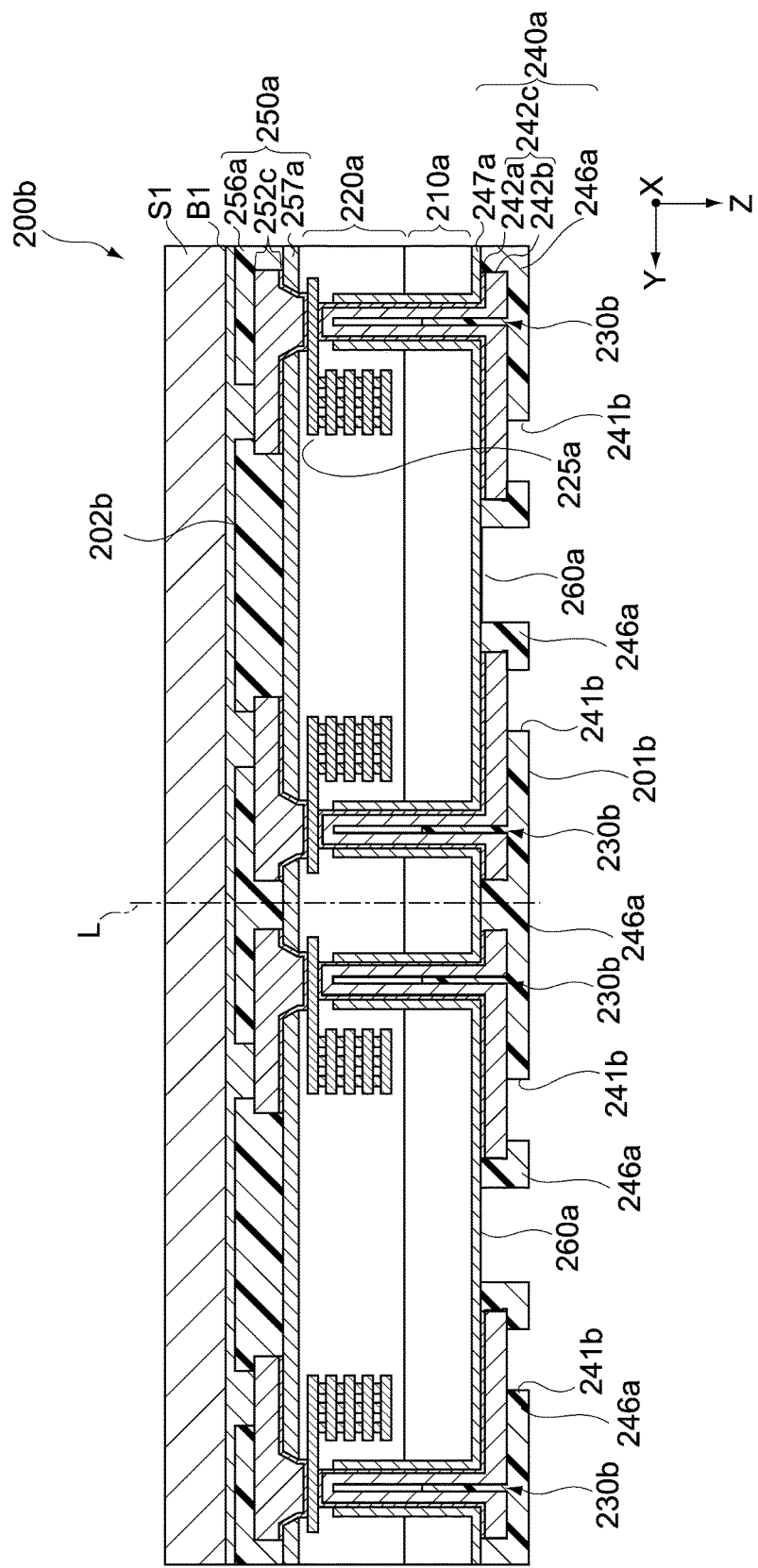
FIG. 20 A schematic cross-sectional view explaining the manufacturing process for the sensor device.

Next, referring to FIG. 20, by partially removing the wiring protection layer 246a, recess portions 260a are formed (ST106). The recess portion 260a is formed in a region opposed to the vibrator portion 103 of the sensor element 100 mounted on the first surface 201a as described above. In this embodiment, the recess portion 260a is formed in the center portion of each element region. Further, the recess portions 260a may be formed at the same time as the above-mentioned connection holes 241b by photolithography, for example. With this, an increase in the number of processes can be prevented.

In addition, the vibration control member 261 may be disposed in each of the recess portions 260a. The arrangement method for the vibration control member 261 is not limited. For example, an adhesive or the like can be used.

With this, a semiconductor element wafer 200b including a first surface 201B and a second surface 202B is formed.

Figure 21:
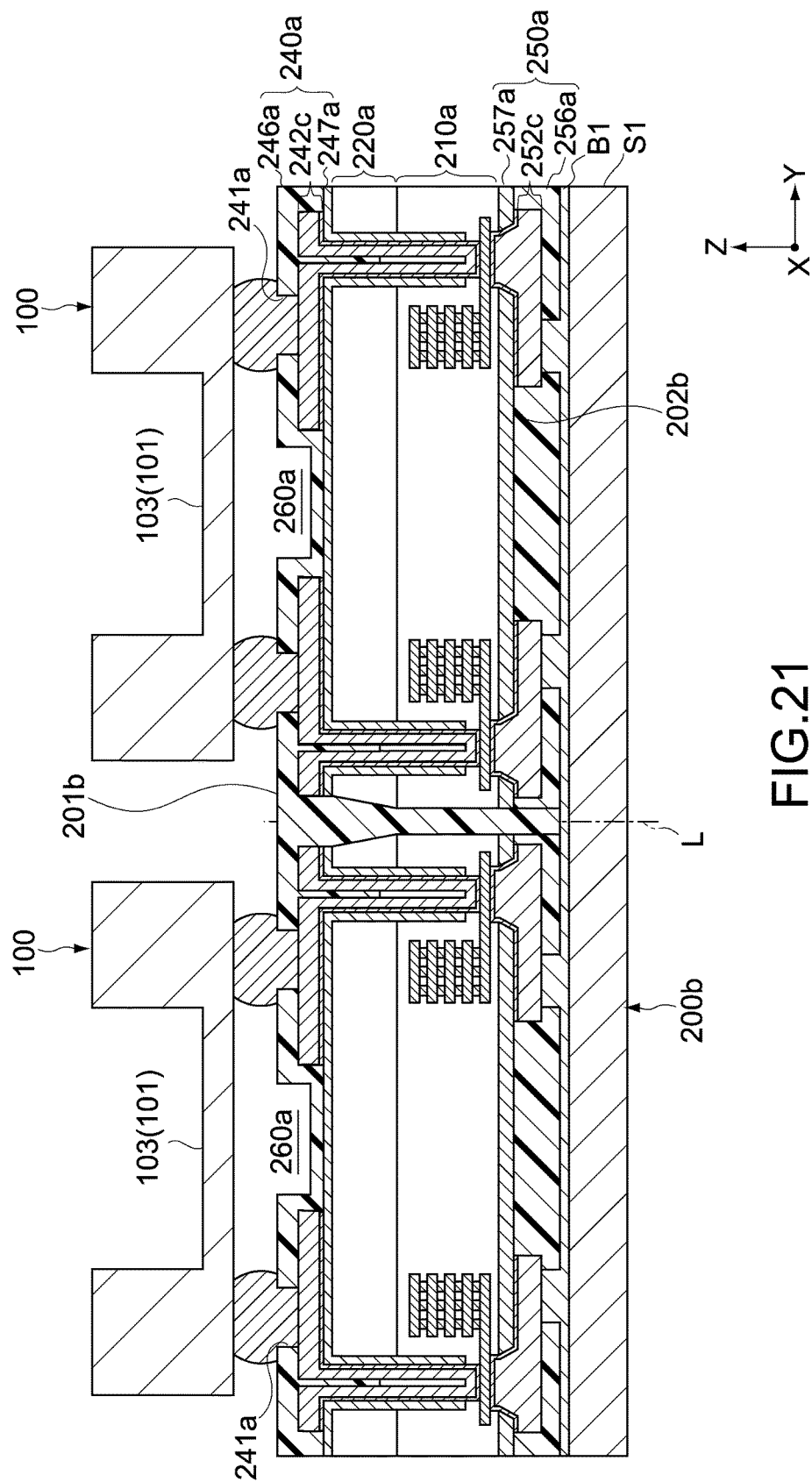
FIG. 21 A schematic cross-sectional view explaining the manufacturing process for the sensor device.
Figure 22:
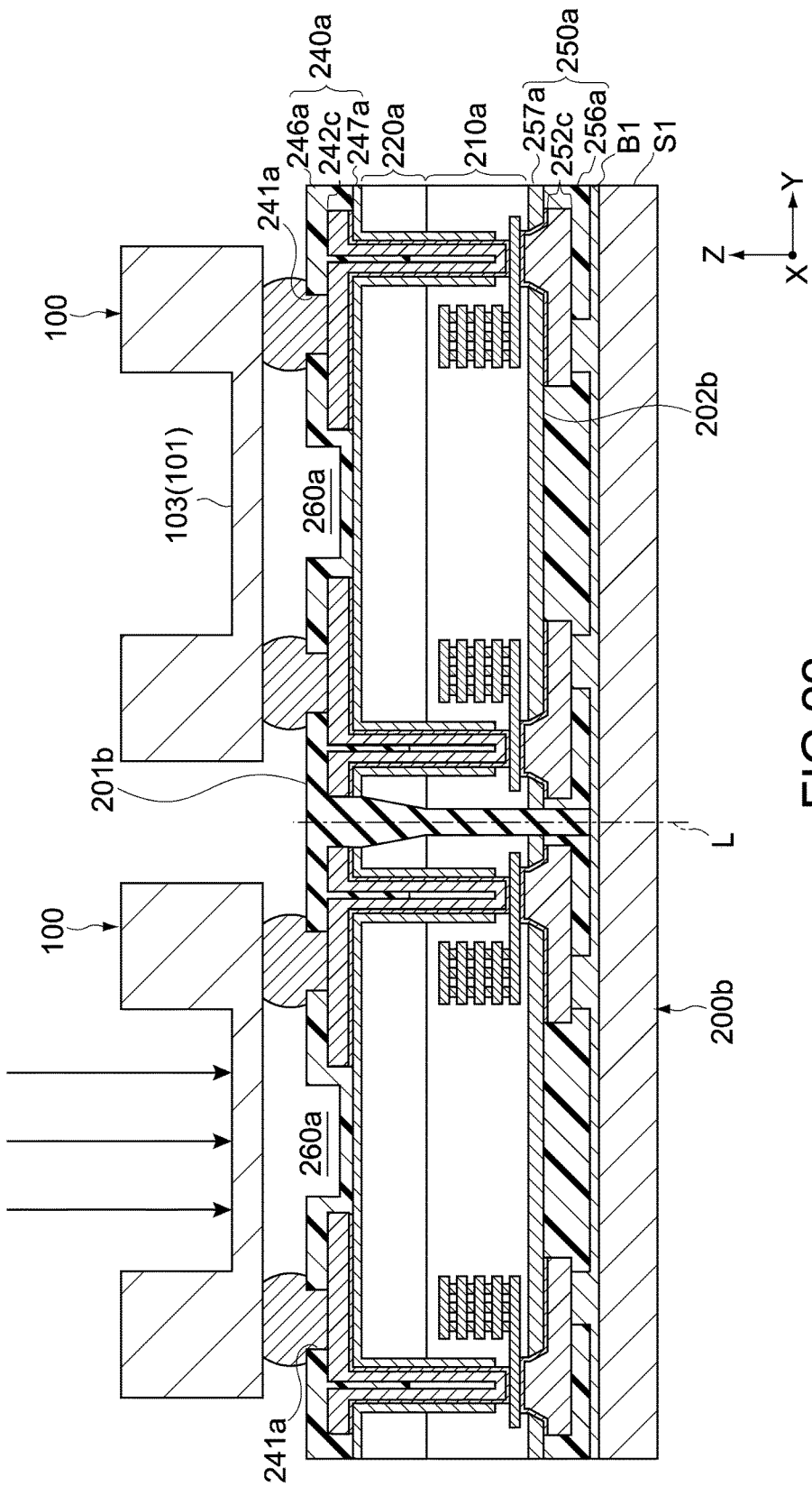
FIG. 22 A schematic cross-sectional view explaining the manufacturing process for the sensor device.
Figure 23:
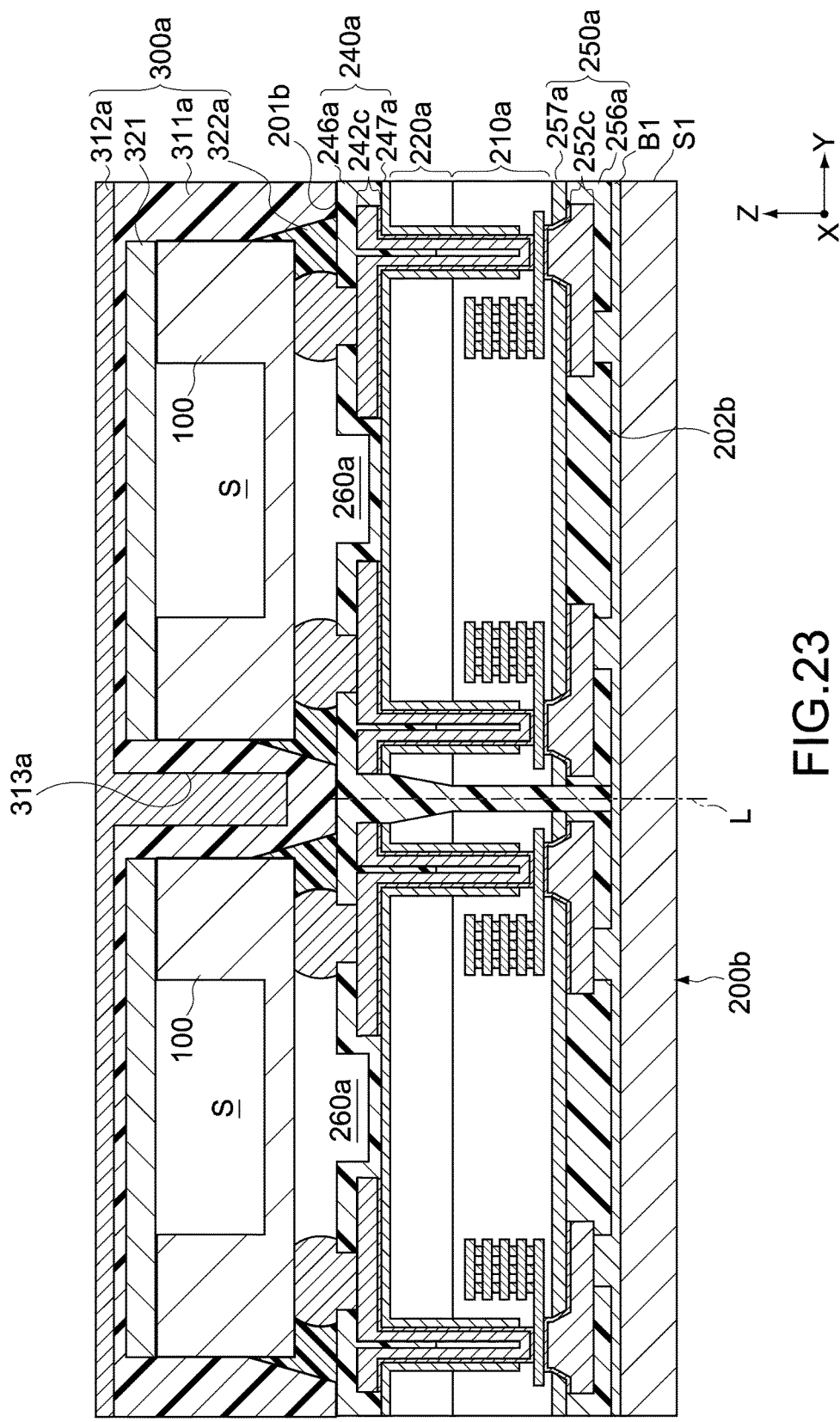
FIG. 23 A schematic cross-sectional view explaining the manufacturing process for the sensor device.

Subsequently, referring to FIG. 21, the sensor element 100 is mounted on the first surface 201B of each of the element regions divided by the scribe line L (ST107). The mounting method for the sensor element 100 is not particularly limited. For example, a reflow method may be employed. Note that FIGS. 21 to 23 show a vertically inverted state in comparison with FIGS. 15 to 20 and the like.

For example, a soldering paste including flux is printed in the connection holes 241b and the sensor element 100 is disposed such that this soldering paste and the terminal portions 114 are connected to each other. After that, by reflowing the semiconductor element wafer 200b on which the sensor element 100 is disposed, the sensor element 100 is electrically and mechanically bonded onto the first surface 201B via first terminals 241a.

Alternatively, instead of the soldering paste, after the flux is applied on the first surface 201B, solder balls may be disposed in the connection holes 241b and reflow may be performed.

Note that, after reflow, a cleaning process of removing flux residues remaining around the first terminals 241a may be performed.

Note that, referring to FIG. 21 or the like, before mounting the sensor element 100, grooves reaching the supporting substrate S1 along the scribe line L may be formed in the semiconductor element wafer 200b. With this, the dividing process (described later) can be easily performed. The formation method for the grooves is not particularly limited. Etching may be employed or the grooves may be mechanically formed by a dicer or the like. Further, the grooves may be filled with an insulation resin. The resin may be the resin material of the wiring protection layer 246a or may be another resin material.

Referring to FIG. 22, the sensor properties of each sensor element 100 is adjusted (ST108). In this process, by irradiating the pendulum portions 21a, 21b, 22a, and 22b of the vibrator portion 103 with laser light shown by the arrow mark in the figure and performing laser machining, the mass balance of the pendulum portions 21a, 21b, 22a, and 22 is made symmetrical and a suitable vibrating state is obtained. That is, each pendulum portion is adjusted to have desired vertical resonant frequency, horizontal resonant frequency, detuning degree, and the like. The vibrating state is checked by bring an electrode probe (not shown) into contact with each of the two or more third terminals 243 and driving the sensor element 100.

That is, via the one fourth terminals 244, a voltage (oscillation output) is applied on the element forming layer 220a in each element region. With this, the semiconductor element 200 generates a driving signal and this driving signal is output to the sensor element 100. Further, a detection signal based on the vibrating state of the sensor element 100 is obtained via the other fourth terminals 244. Then, laser machining is appropriately performed while checking the vibrating state of the sensor element 100 according to the obtained detection signal.

Subsequently, referring to FIG. 23, a coating portion 300A is formed on the first surface 201B (ST109).

First, the gap between the sensor element 100 and the first surface 201B is filled with an underfill material 322a. The underfill material 322a is supplied into a periphery of the sensor element 100 on the first surface 201B from a dispenser or the like (not shown) and cured. The underfill material 322a forms the resin portion 322 after completion.

Next, the sealing plate 321 is disposed on the frame body 102. The sealing plate 321 may be disposed via an adhesive or the like. Further, as will be described later, the plurality of through-holes 323 are formed in the sealing plate 321.

Then, a first film 311a of an insulation resin such as a glass-epoxy resin is formed on the first surface 201B and on the sensor element 100. The first film 311a may be formed by molding. An application method such as screen printing, spin coating, and potting may be employed. Then, the first film 311a is cured. If the first film 311a contains an epoxy resin that is a thermosetting resin, this resin can be cured by heat treatment.

In addition, along the scribe line L, a groove 313a is formed in a part of the first film 311a. As the formation method for the groove 313a, the groove 313a may be formed by laser machining or using a dicer or the like. Alternatively, the groove 313a may be formed by etching.

Then, a second film 312a including an electrically conductive material is formed on the first film 311a including the groove 313a. If an electrically conductive resin such as an Ag paste is used for the second film 312a, it may be formed by an application method. Alternatively, a metal film may be formed by sputtering, vapor deposition, or the like. Note that the second film 312a may be not only on the upper surface of the first film 311a but also on side surfaces.

Note that, other than the groove 313a, groove reaching third terminals 243a may be formed. With this, conduction of the second film 312a and the third terminals 243a is ensured, and a configuration in which the coating film 300 can be maintained at the ground potential can be made.

Further, before curing processing for the first film 311a, the space S may be reduced in pressure and voids (air bubbles) of the resin material may be removed. In this processing, the semiconductor element wafer 200b, which has been supplied with a resin, is conveyed to a vacuum chamber or the like, the pressure in the vacuum chamber is lowered to a predetermined reduced pressure atmosphere, and then it is restored to the atmosphere. By repeating the processing, the voids can be removed.

Moreover, by the above-mentioned processing, in addition to removing the voids, even if the sensor device 1 is heated by the reflow process or the like in mounting on the control board or the like, it is possible to prevent the coating film 310 from being damaged due to expansion of the air in the space S. Further, a pressure change due to the temperature change in the space S can be suppressed and the vibration mode of the vibrator portion 103 can be stabilized.

Here, in this embodiment, the through-holes 323 are formed in the sealing plate 321. With this, in reduction of the pressure in the space S, the space S can be vacuumed through the through-holes 323. The through-holes 323 can be formed using, for example, wet-etching, dry-etching, or a method such as mechanical perforation with a tool such as a drill. Further, the through-holes 323 may be formed after the sealing plate 321 is disposed on the frame body 102, or may be formed in advance. In the former case, the through-holes 323 can be formed at positions such that, even if the etchant flows or the tool protrudes into the space S, its influence on the vibration mode of the vibrator portion 103 is small.

Subsequently, the supporting substrate S1 is removed (ST110). In the case where the supporting substrate S1 is bonded with an adhesive formed of a UV tape, a ultraviolet ray is emitted from a side of the supporting substrate S1. With this, the viscosity of the adhesive is lost, and hence the supporting substrate S1 can be easily removed.

Note that, before removing the supporting substrate S1, an adhesive tape S2 (see FIG. 24) or the like for substrate protection may be attached on the coating portion 300A on the opposite side of the supporting substrate S1. With this, also when the supporting substrate S1 is removed, dispersion of the respective element regions can be suppressed in dividing in the subsequent process and the handleability can be improved.

Figure 24:
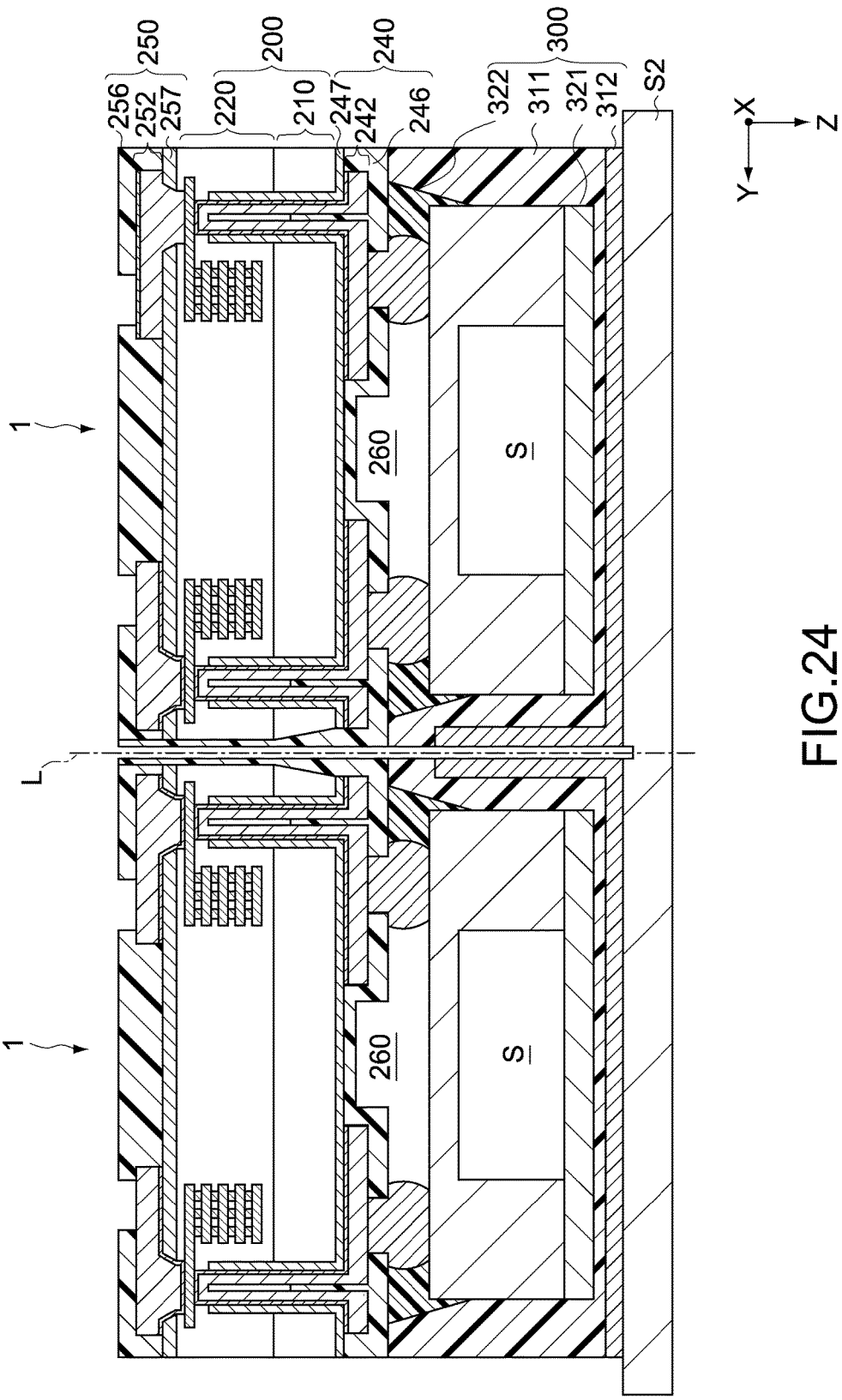
FIG. 24 A schematic cross-sectional view explaining the manufacturing process for the sensor device.

Finally, referring to FIG. 24, the semiconductor element wafer 200b is divided for each of the element regions (ST111). Note that FIG. 24 shows a state obtained by vertically inverting that of FIG. 23.

In this process, dicing is performed along the scribe line L, for example, from a second surface 202a of the semiconductor element wafer 200b, from which the supporting substrate S1 has been removed, to the coating portion 300A on the opposite side (reaching the adhesive tape S2). With this, the semiconductor element wafer 200b is divided and a plurality of sensor devices 1 are completed. The dicing method in this process is not particularly limited. Etching or the like may be used or mechanical dicing by a dicer, laser irradiation, or the like may be performed.

By this process, the sensor device 1 is manufactured. After that, each of the sensor devices 1 is picked up by a vacuum adsorption apparatus or the like and mounted on a predetermined control board or the like.

As described above, according to this embodiment, in the adjustment process for the sensor element 100, even if laser light is emitted, the sensor element 100 and the first surface 201a as the inactive surface are opposed to each other, and hence the possibility that the element forming layer 220a is damaged by the laser light is extremely low. Therefore, in a state in which the sensor element 100 is mounted on the semiconductor element 200 (semiconductor element wafer 200b), this process can be performed. In addition, the fourth terminals 244 capable of connecting the electrode in this process are provided, and hence the vibration mode of the sensor element 100 can be checked before mounting on the control board or the like of the electronic apparatus.

Further, the through-holes 323 are formed in the coating plate 321, and hence the space S can be maintained at a predetermined reduced pressure atmosphere. With this, even in the case where it is heated in the reflow process or the like in mounting the control board or the like of the sensor device 1, the coating film 310 can be prevented from being, for example, damaged due to expansion of the air in the space S. Further, the pressure change due to the temperature change in the space S can be suppressed and the vibration mode of the vibrator portion 103 can be stably maintained.

In addition, dividing can be performed after the process of removing the supporting substrate S1, and hence the supporting substrate S1 can be re-used. With this, the manufacturing costs can be reduced and it can also contribute to a reduction in waste.

Second Embodiment

Figure 25:
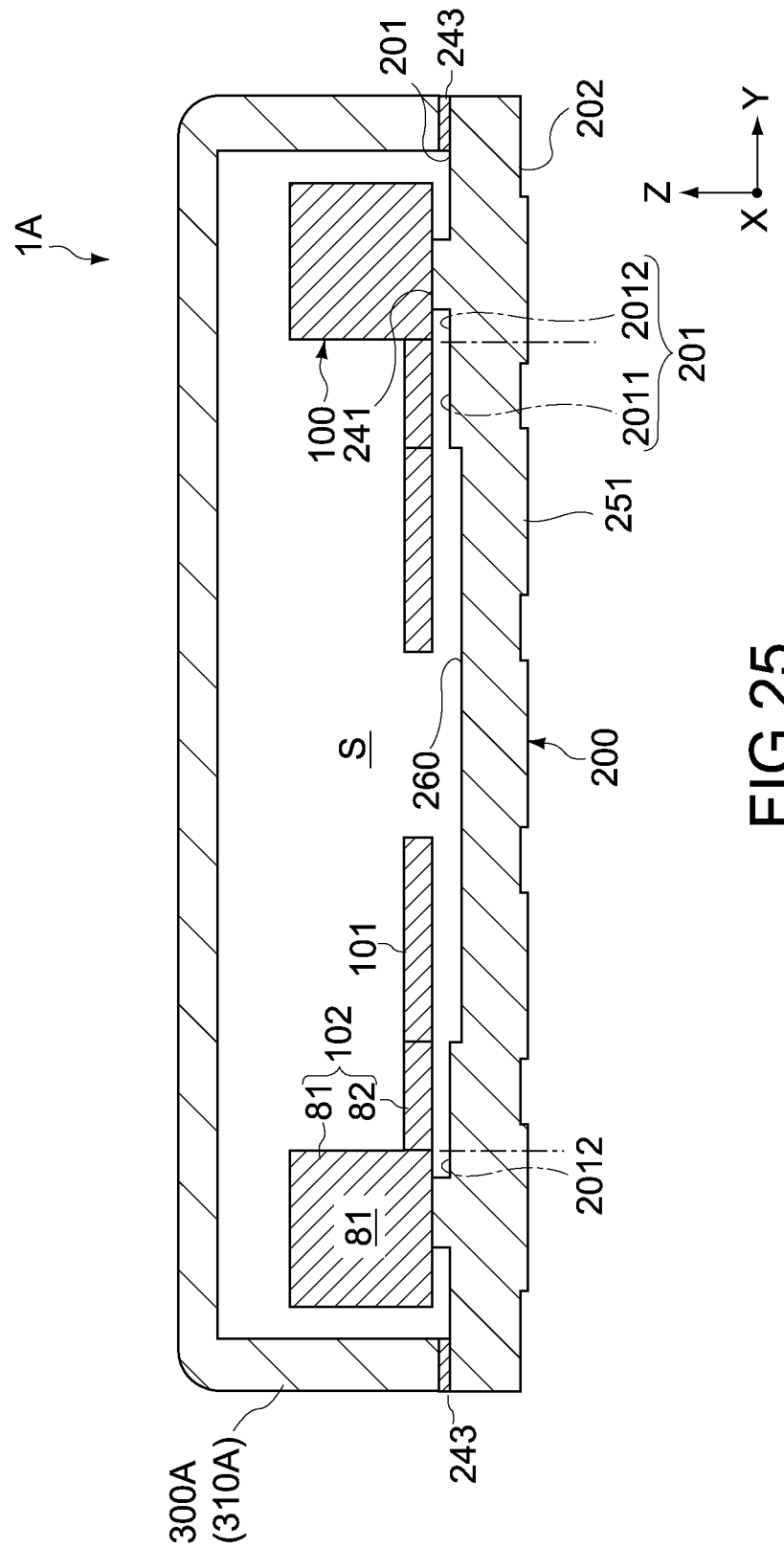
FIG. 25 A schematic cross-sectional view of a sensor device according to a second embodiment of the present technology.

FIG. 25 is a schematic cross-sectional view showing a second embodiment of the present technology. In this embodiment, descriptions of the same portions as the configurations and actions of the first embodiment will be omitted or simplified and portions different from the first embodiment will be mainly described.

A sensor device 1A according to this embodiment includes a coating portion 300A having a different configuration as the coating portion 300 of the first embodiment. Therefore, hereinafter, the coating portion 300A will be mainly described.

In this embodiment, the coating portion 300A includes a lid portion 310A that is disposed on the first surface 201 and capable of coating the sensor element 100. The lid portion 310A is formed in an approximately rectangular parallelepiped lid shape and may be, for example, formed of a metal material of a 42 alloy (alloy of minute amount of additives and the like of Nickel (Ni) 42%, iron (Fe) 57%, copper (Cu), and the like), alloy of nickel silver (Cu), zinc (Zn), and Ni), aluminum (Al), or the like. In this case, for example, it is formed by squeezing out a metal plate or the like. Alternatively, as the lid portion 310A, one obtained by forming a metal film on an inner or outer surface of Si or ceramic ($Al_2O_3$, etc.) formed in an approximately rectangular parallelepiped shape by sputtering or vapor deposition may be employed.

Further, the lid portion 310A can be provided with through-holes (not shown) as in the sealing plate 321 according to the first embodiment. With this, expansion of the air in the space in the reflow process or the like during mounting can be suppressed and damage of the lid portion 310A can be reduced.

The lid portion 310A is bonded on third terminals 243 of a first re-wiring layer 240. The bonding method is not particularly limited. For example, solder bonding or adhesion with an electrically conductive adhesive can be appropriately employed. With this, the lid portion 310A and the third terminals 243 can be electrically and mechanically bonded to each other. Therefore, as in the coating portion 300 according to the first embodiment, the coating portion 300A can be maintained at the ground potential and more stable shield effect can be exerted.

Regarding the coating portion 300A, a sealing resin film (not shown) may be formed around the lid portion 310A. With this, the strength and the handleability as the sensor device 1A can be improved.

Figure 31:
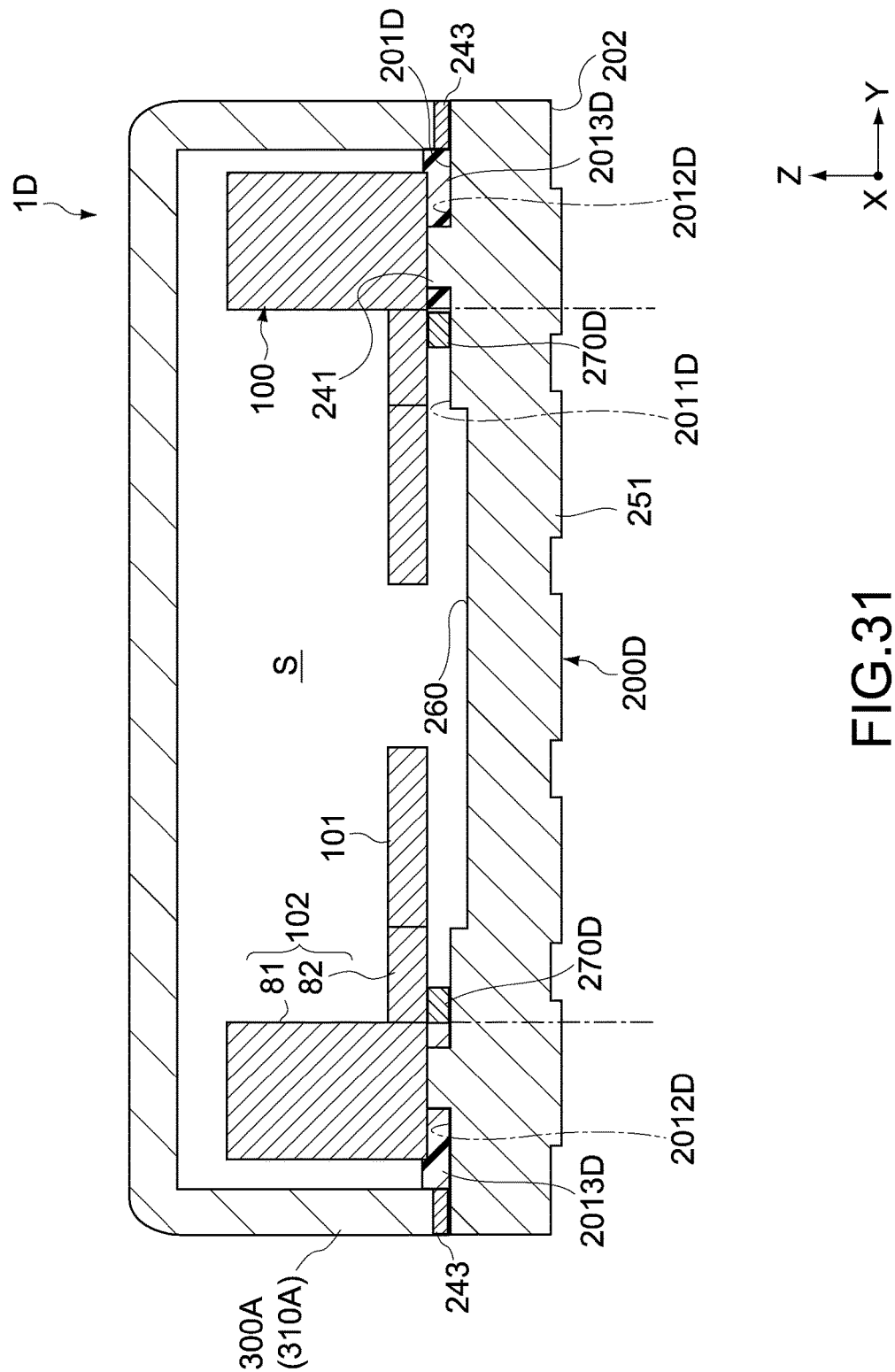
FIG. 31 A schematic cross-sectional view of a sensor device according to a modified example of the second embodiment of the present technology.

Regarding the semiconductor element 200, the second region 2012 of the first surface 201 may be filled with a resin layer as an underfill (see FIG. 31). With this, the bonding strength between the first terminals 241 and the terminal portions 114 of the sensor element 100 can be increased and, if the coating portion 300A includes the sealing resin film, inflow of this sealing resin into the first region 2011 can be suppressed.

Further, by bonding the base 81 of the sensor element 100 and the lid portion 310A to each other, inflow of the sealing resin into the space S can be suppressed.

The sensor device 1A can be manufactured at substantially the same time as the sensor device 1. As a different point, the coating portion 300A is bonded onto the first surface 201 by the process of forming the coating portion 300A. In addition, the dividing process may be performed before the process of removing the supporting substrate S1. If a groove along the scribe line L is formed in the semiconductor element wafer, this groove does not need to be filled with a resin material.

As described above, also with the coating portion 300A according to this embodiment, the function as a cover for the sensor element 100 and the light-shielding function can be exerted. With this, the handleability of the sensor device 1A can be improved and the sensor properties can be stably maintained.

Third Embodiment

FIGS. 26 to 30 are diagrams showing a sensor device 1B according to a third embodiment of the present technology. In this embodiment, descriptions of the same portions as the configurations and actions of the first embodiment will be omitted or simplified and portions different from the first embodiment will be mainly described.

Figure 26:
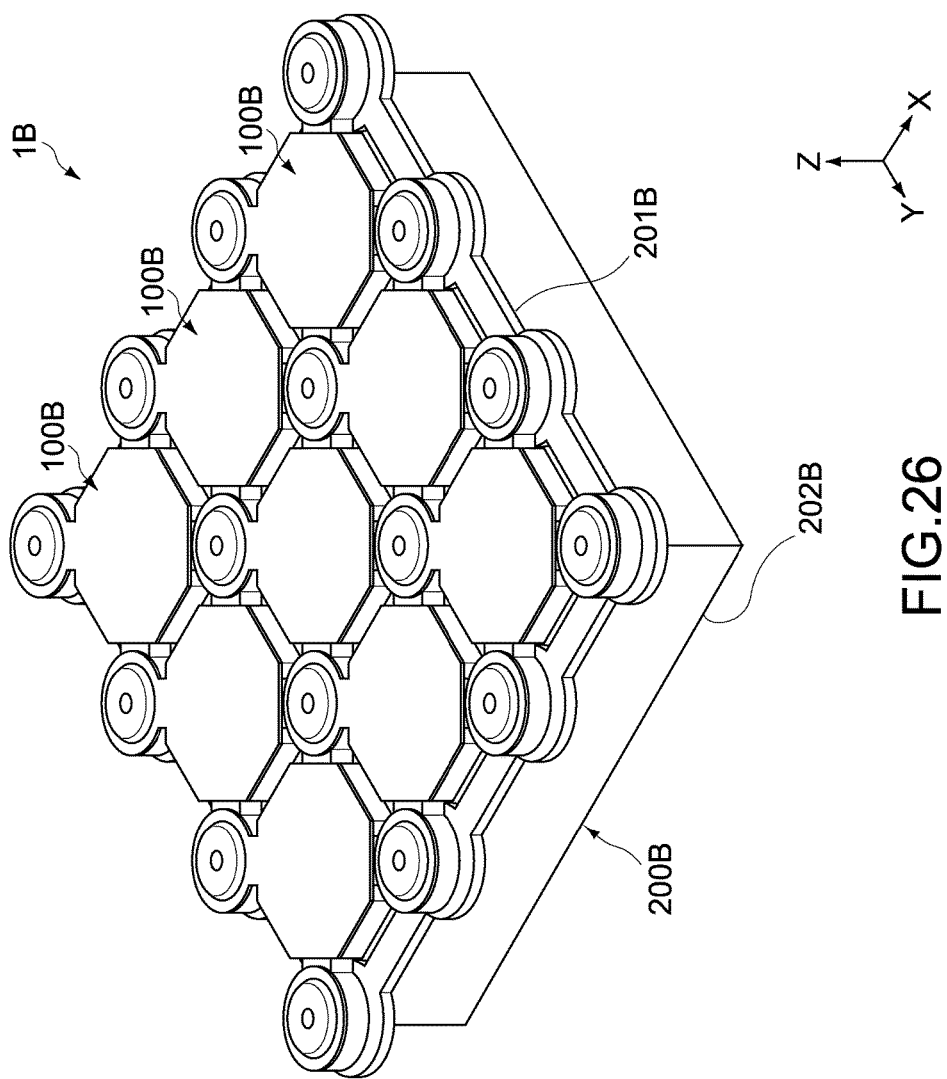
FIG. 26 A schematic perspective view of the sensor device according to a third embodiment of the present technology.

FIG. 26 is a schematic perspective view of the sensor device 1B. FIG. 27A is a schematic plan view. FIG. 27B is a schematic cross-sectional view as viewed in the [A]-[A] direction of FIG. 27A. Note that, in FIG. 27B, only an outline of a semiconductor element 200B is shown by an alternate long and short dash line. The sensor device 1B includes, in this embodiment, a plurality of sensor elements 100B configured as infrared detectors and the semiconductor element 200B. The sensor device 1B functions as an infrared imaging element. That is, the sensor device 1B is installed in an infrared imaging apparatus as an electronic apparatus.

The semiconductor element 200B has the same configuration as the semiconductor element 200 according to the first embodiment. That is, the semiconductor element 200B includes a first surface 201B that includes first terminals 241B on which the sensor elements 100B are mounted and is an inactive surface, a second surface 202B that includes second terminals 251B for external connection and is an active surface, and via-holes 230B that electrically connect the first surface 201B and the second surface 202B to each other. Note that, in the semiconductor element 200B, a plurality of element regions corresponding to the sensor elements 100B may be formed.

The plurality of sensor elements 100B are arranged in an array form of m*n rows on the first surface 201B of the semiconductor element 200B. With this, each of the sensor elements 100B corresponds to one pixel and they can configure the infrared imaging element having multiple pixels of m*n. In the examples shown in FIGS. 26 and 27, although the example of 3*3 sensor elements is shown, for example, with each of m and n being set to several tens to several hundreds, it is also possible to arrange several hundreds to several hundreds of thousands of sensor elements 100B can also be arranged in a two-dimensional form. With this configuration, a high-resolution infrared image having a large number of pixels can be captured.

Here, the infrared detector is classified into a thermal type and a quantum type based on the operation principles. The thermal type is further classified into a pyroelectric type, a microbolometer, and a thermopile type. The sensor element 100B according to this embodiment may be any of the infrared detectors. Hereinafter, the description will be made assuming that it is the pyroelectric type infrared detector.

[Sensor Element]

Figure 27:
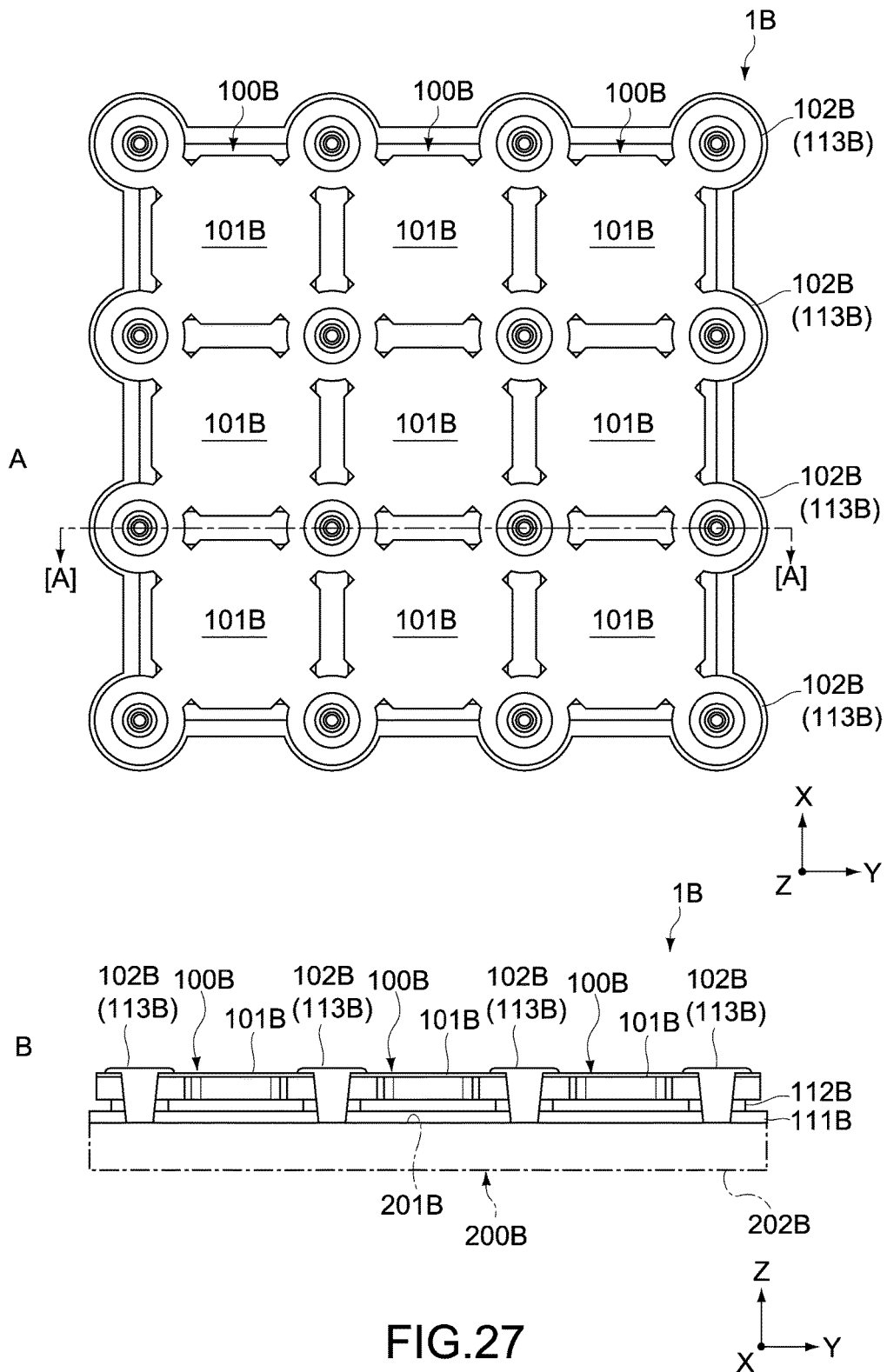
FIG. 27 A schematic diagram showing a configuration of the sensor device, in which A is a plan view and B is a cross-sectional view as viewed in the [A]-[A] direction of A.
Figure 28:
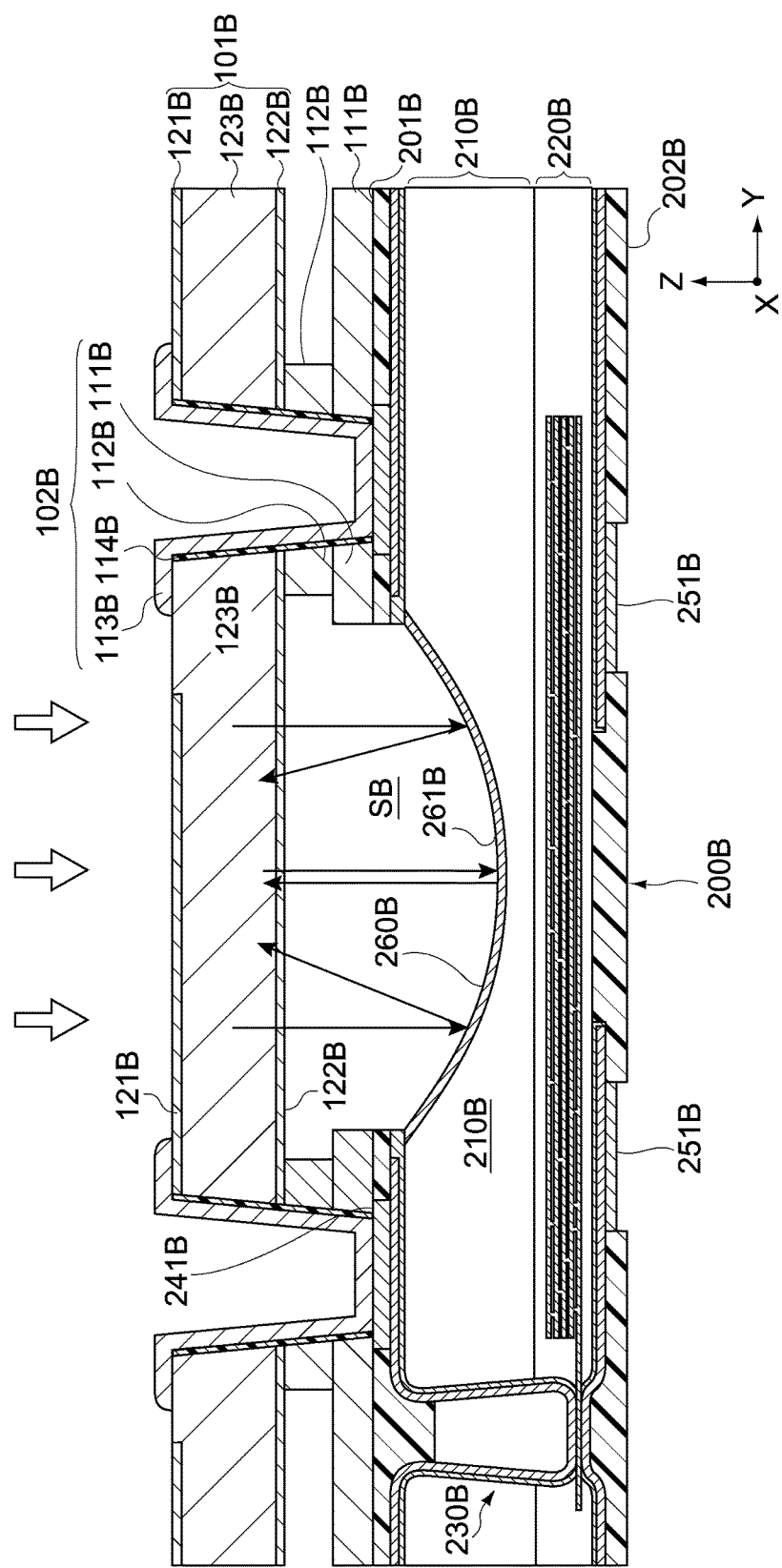
FIG. 28 A schematic cross-sectional view of a main part of the sensor device.

FIG. 28 is a schematic cross-sectional view of a main part of the sensor device 1B. Referring to FIGS. 28 and 27, the sensor element 100B includes a detecting portion 101B and supporting portions 102B. The detecting portion 101B is capable of detecting an absorption amount of electromagnetic waves having a predetermined wavelength as a predetermined physical quantity. The supporting portions 102B support the detecting portion 101B and are connected to the first terminals 241B. In this embodiment, the "electromagnetic wave having a predetermined wavelength" can be a far-infrared ray having a wavelength of approximately 5 μm to 1000 μm. The void arrow marks in the figure indicate infrared rays entering the detecting portion 101B. The arrow marks shown in a space SB schematically indicate infrared rays that pass through the detecting portion 101B and are reflected by a reflecting layer 261B (described later).

In this embodiment, the detecting portion 101B is configured as a pixel portion that outputs a signal based on the absorption of infrared rays. That is, the detecting portion 101B includes a thermoelectric conversion layer 123B, a first electrode 121B, and a second electrode 122B. The thermoelectric conversion layer 123B converts a temperature change based on the absorption of the infrared rays into an electrical signal. The first electrode 121B and second electrode 122B are formed to be opposed to each other while sandwiching the thermoelectric conversion layer 123B therebetween. The detecting portion 101B is formed in an approximately rectangular shape in a planar view as viewed in the Z-axis direction. Column portions 123B of the supporting portions 102B are supported at four corners. The detecting portion 101B is electrically connected to via-holes 113B (described later) of one supporting portion 102B of the four supporting portions 102B by which it is supported.

In this embodiment, the thermoelectric conversion layer 123B is formed of a pyroelectric material capable of changing the spontaneous polarization due to a temperature change due to the absorption of the infrared rays and generating a surface charge. As this pyroelectric material, for example, an inorganic material such as PZT, lead titanate, lithium tantalate, bismuth ferrite, $BiMgO_3$, and $BiZnO_3$ and an organic material such as triglycine sulfate (TGS) and polyvinylidene difluoride can be used. Further, the thickness of the thermoelectric conversion layer 123B is not particularly limited and, for example, may be approximately 0.5 to 10 μm.

The first electrode 121B is electrically connected to the via-hole 113B of the one supporting portion 102B of the supporting portions 102B that support the detecting portion 101B, for example. The first electrode 121B outputs a surface charge generated by spontaneous polarization of the thermoelectric conversion layer 123B as a detection signal. The second electrode 122B is connected to, for example, a ground terminal or the like (not shown) and maintained at the ground potential. Note that a plurality of second electrodes 122B of the sensor device 1B may be connected to the common ground terminal. The first and second electrodes 121B and 122B are formed of, for example, Cr, Pt, or Ti.

In addition, the detecting portion 101B may include a heat absorbing layer (not shown) arranged on each of the first and second electrodes 121B and 122B. The heat absorbing layer may be, for example, a silicon nitride film, a silicon oxide film, a silicon oxynitride film, a SiC film, or a laminate film obtained by combining at least two of these films. Alternatively, as the heat absorbing layer, an organic material such as Triporous carbon and graphene can also be used. By providing such a heat absorbing layer, heat can be more efficiently transmitted to the thermoelectric conversion layer 123B. Further, if the heat absorbing layer is formed of an insulating material, this heat absorbing layer can also function as an insulating protection film for the detecting portion 101B.

Each of the supporting portions 102B includes a first supporting layer 111B, a second supporting layer 112B, and the via-hole 113B. The supporting portion 102B is configured to provide the space SB between the detecting portion 101B and the semiconductor element 200B due to the via-hole 113B and the laminate structure of the first and second supporting layers 111B and 112B. With this, the detecting portion 101B can be configured to be thermally insulated. Further, by adjusting the second supporting layer 112B to have a predetermined thickness, it becomes possible to adjust a thickness (height) of the space SB.

As described above, the via-holes 113B are arranged at the four corners of the detecting portion 101B and each of the via-holes 113B is configured to be capable of connecting the first electrode 121B of one detecting portion 101B and the first terminal 241B corresponding to this detecting portion 101B to each other. The via-hole 113B is formed of an electrically conductive material of Cu, Ni, Ti, or the like. Note that an insulating film 114B may be provided on an outer peripheral side of the via-hole 113B. With this, insulation between the second electrode layer 122B, the thermoelectric conversion layer 123B, and the like and the via-hole 113B can be ensured.

The first supporting layer 111B is disposed on the first surface 201B of the semiconductor element 200B. The second supporting layer 112B is disposed on the first supporting layer 111B. In addition, the detecting portion 102B is disposed on the second supporting layer 112B. That is, a configuration in which corner portions of the detecting portion 102B is sandwiched by an upper portion of the via-hole 113B and the second supporting layer 112B. Note that, although the material of the first supporting layer 111B and the second supporting layer 112B is not particularly limited, it is, for example, formed of an insulating material such as silicon oxide and silicon nitride. The thickness of the laminate structure of the first and second supporting layers 111B and 112B can be set to, for example, approximately 1 to 5 μm.

Although the thickness of the supporting portion 102B having the above-mentioned configuration is not particularly limited, for example, it is a thickness larger than the semiconductor element 200B as in the first embodiment. With this, the thickness of the space SB can be sufficiently ensured and the strength of the sensor device 1B can be enhanced.

Figure 29:
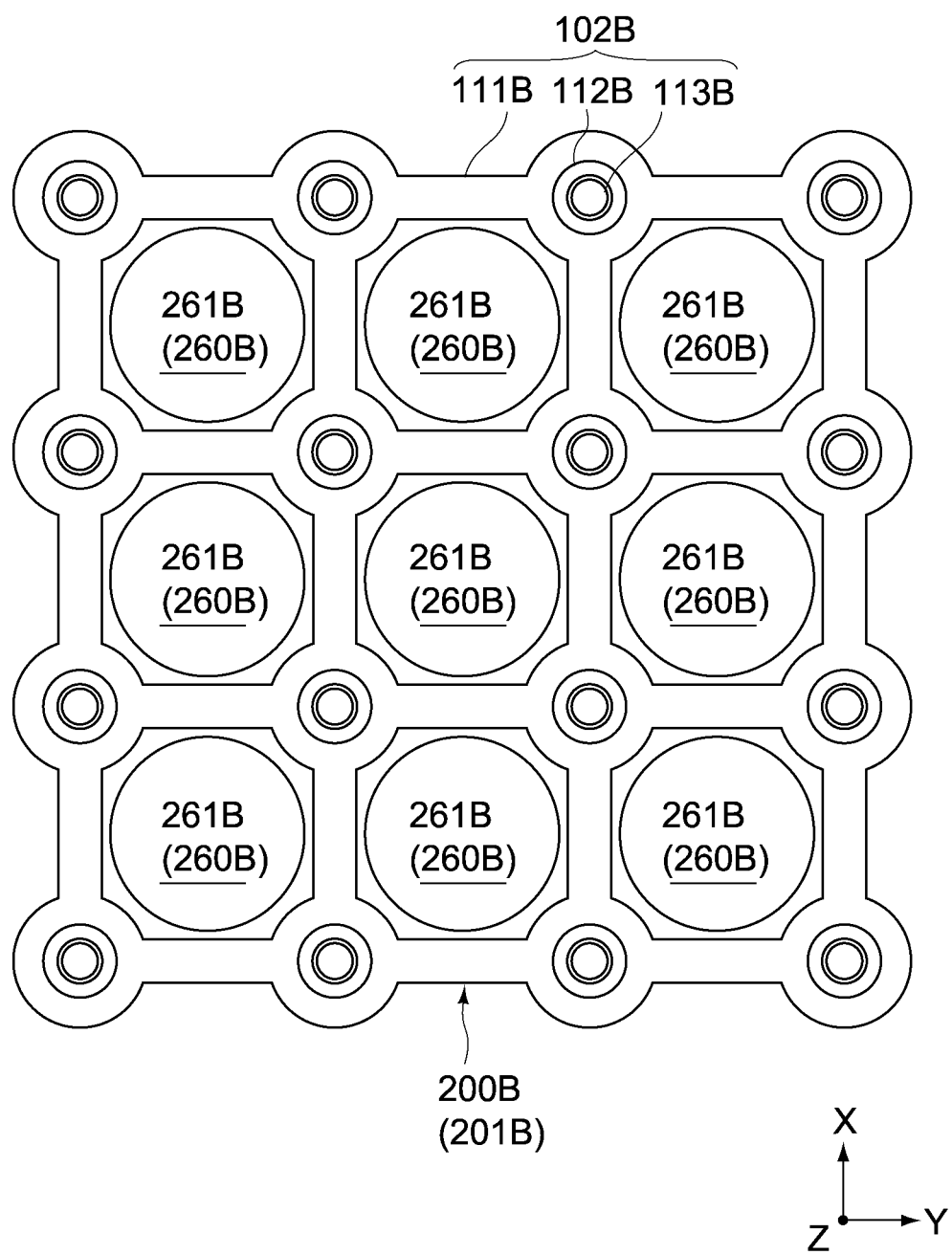
FIG. 29 A schematic plan view of the sensor device from which a part of the sensor element is removed.

FIG. 29 is a schematic plan view with the detecting portions 101B and the via-holes 113B being removed such that the first and second supporting layers 111B and 112B are exposed.

The first supporting layer 111B is formed, for example, in a grid shape along boundaries of the detecting portions 101B. The second supporting layers 112B are formed, for example, in an annular shape surrounding a periphery of each via-hole 113B. Note that, although not shown in the figure, connection holes (not shown) that connect the second electrode 122B and the ground terminal or the like to each other may be formed in the first and second supporting layers 111B and 112B.

FIG. 29 shows recess portions 260B of the semiconductor element 200B, which are arranged in regions surrounded by the first supporting layer 111B. Hereinafter, the semiconductor element 200B will be described.

[Semiconductor Element]

Referring to FIGS. 28 and 29, the semiconductor element 200B according to this embodiment is configured as an IC component as in the first embodiment. The semiconductor element 200B performs various types of arithmetic processing based on outputs from the sensor elements 100B or control of the sensor elements 100B, output to the control board or the like in which the sensor device 1B is installed, or the like. Different points are that it is formed in a semiconductor element wafer shape as described in the manufacturing process according to the first embodiment and each of the element regions performs signal processing for each detecting portion 101B as one pixel and that it includes the reflecting layers 261B arranged in the recess portions 260B such that infrared rays, which have passed through the detecting portion 101B, can be reflected to the detecting portion 101B. Hereinafter, the configuration of the recess portions 260B will be mainly described.

The recess portions 260B are formed in the first surface 201B to be opposed to the detecting portion 101B. In this embodiment, the recess portions 260B are formed by removing a wiring protection layer 246B of a first re-wiring layer 240B and further providing a substrate body 210B with predetermined recess surfaces. For example, the recess portion 260B includes a recess surface of a parabolic curved surface. With this, the reflected infrared ray can be collected into a center of the thermoelectric conversion layer 123B and thus the directivity of reflection light can be improved.

The reflecting layer 261B is formed on the first surface 201B. The reflecting layer 261B is formed on, for example, the recess surface of the recess portion 260B. The reflecting layer 261B is configured to be capable of reflecting far-infrared rays in this embodiment and is formed of, for example, an Au film. Note that the reflecting layer 261B only needs to be capable of reflecting electromagnetic waves having a wavelength that can be detected by the detecting portion 101B. A material having a reflectance with respect to the electromagnetic waves can be selected therefor.

Further, the depth of the recess portion 260B when the reflecting layer 261B is disposed can be set in view of the thickness of the space SB, that is, a distance between the reflecting layer 261B and the thermoelectric conversion layer 123B. That is, the distance between the recess portion 260B and the thermoelectric conversion layer 123B can be configured to be an optical distance such that infrared rays having a predetermined wavelength reflected by the recess portion 260B are intensified by each other due to interference. With this, the reflection light can be absorbed more efficiently. Specifically, a distance d between the reflecting layer 261B and the thermoelectric conversion layer 123B can be expressed as follows.

$$d = m*\lambda/4 (m \text{ is degree}, m=1,2,\ldots)$$

Where the wavelength of the infrared ray is indicated by $\lambda$. For example, in the case of the far-infrared ray having a wavelength $\lambda=10$ μm, assuming m=1, a distance between a lowermost portion of the reflecting layer 261B and a thermoelectric conversion layer 114B can be set to 2.5 μm. Note that the expression above is derived provided that the reflecting layer 261B is a total reflection film.

The sensor device 1B having the above-mentioned configuration is installed in the infrared imaging apparatus as the infrared imaging element as described above. Hereinafter, an operation example in which the sensor device 1B in this apparatus detects an absorption amount of infrared rays will be described.

[Operation Example of Sensor Device]

In the infrared imaging apparatus in which the sensor device 1B is installed, an optical lens, an optical chopper, and the like (not shown) is disposed to be opposed to the detecting portion 101B. The optical chopper has a shutter function of periodically controlling incident infrared rays. Even if an imaging target remains stationary, the optical chopper causes a temperature change of the detecting portion 101B such that a suitable image signal can be obtained. Note that this cycle is equivalent to a frame rate set in the infrared imaging apparatus. For example, if this frame rate is 30 fps, this cycle is 30 Hz.

First, infrared rays emitted from a subject are controlled by the optical chopper and the optical lens and enters each detecting portion 101B. Then, some of the infrared rays are absorbed by the first electrode 121B and the heat absorbing layer and a temperature change is caused. Thus, a surface charge is generated in each thermoelectric conversion layer 123B. For example, in some optical designs, if the temperature of the subject is different by 1 K (kelvin), a temperature difference that should be detected by the thermoelectric conversion layer 123B can be about 0.0001 K. That is, it is desirable that each thermoelectric conversion layer 123B detect a very small temperature difference.

On the other hand, the infrared rays that are not absorbed by the detecting portion 101B and pass therethrough are reflected by the reflecting layer 261B. With this, the reflected infrared rays are absorbed by the second electrode 122B and the heat absorbing layer. They contribute to charge generation of the thermoelectric conversion layer 123B. Therefore, the utilization efficiency of the infrared rays can be enhanced by the reflecting layer 261B and the detection sensitivity of the sensor device 1B can be enhanced.

Charges generated by each thermoelectric conversion layer 123B flow into the first terminal 241B of each element region of the semiconductor element 200B via the via-hole 113B of the first electrode 121B and the corresponding supporting portion 102B. In addition, it flows into the circuit of an element forming layer 220B from the first terminals 241B via the via-holes 230B of the semiconductor element 200B. Then, charges generated from each thermoelectric conversion layer 123B is converted into a voltage signal in the circuit and used in signal processing for each pixel.

In this manner, the sensor device 1B generates a signal based on an infrared ray absorption amount for each thermoelectric conversion layer 123B corresponding to each pixel and outputs the signal. The infrared imaging apparatus controls these signals, to thereby be able to generate a temperature image signal.

As described above, according to this embodiment, the first surface 201B of the semiconductor element 200B that is opposed to the sensor elements 100B is the inactive surface. Therefore, the recess portions 260B having a predetermined shape can be formed without damaging the element forming layer 220B. With such a recess portion 260 and the supporting portions 102B, the sufficient space SB between the semiconductor element 200B and the detecting portion 101B can be formed and transmission of heat generated in the element forming layer 220B to the detecting portion 101B can be suppressed. Therefore, the thermal insulation of the detecting portion 101B required to detect a very small temperature difference as described above can be improved and the detection accuracy can be improved.

In addition, the reflecting layers 261B can be disposed in the recess portions 260B, and hence it is possible to enhance the utilization efficiency of the infrared rays and the sensor sensitivity. For example, in the case where the reflecting layers 261B are not provided, assuming that the infrared ray utilization efficiency is 70%, the remaining infrared rays of 30% pass. By the reflecting layers 261B reflecting the passing infrared rays, the infrared ray utilization efficiency can be increased to about 100%. In this example, by providing the reflecting layers 261B, the sensor sensitivity can be increased by about 43%.

Further, the recess portions 260B are formed in the substrate body 210B, and hence the degree of freedom for the shape of the recess portions 260B can be increased. That is, the shapes of the recess portions 260B can be adjusted such that the directivity of the reflected infrared rays is increased and they are intensified by each other due to interference. Therefore, the sensor sensitivity can be further enhanced.

Further, the far-infrared rays used in this embodiment exhibit a high transmittance in Si, and hence easily pass through the substrate body 210B. In view of this, by providing the reflecting layers 261B, it also becomes possible to shield the far-infrared rays and suppress the influence on the element forming layer 220B.

Fourth Embodiment

Figure 30:
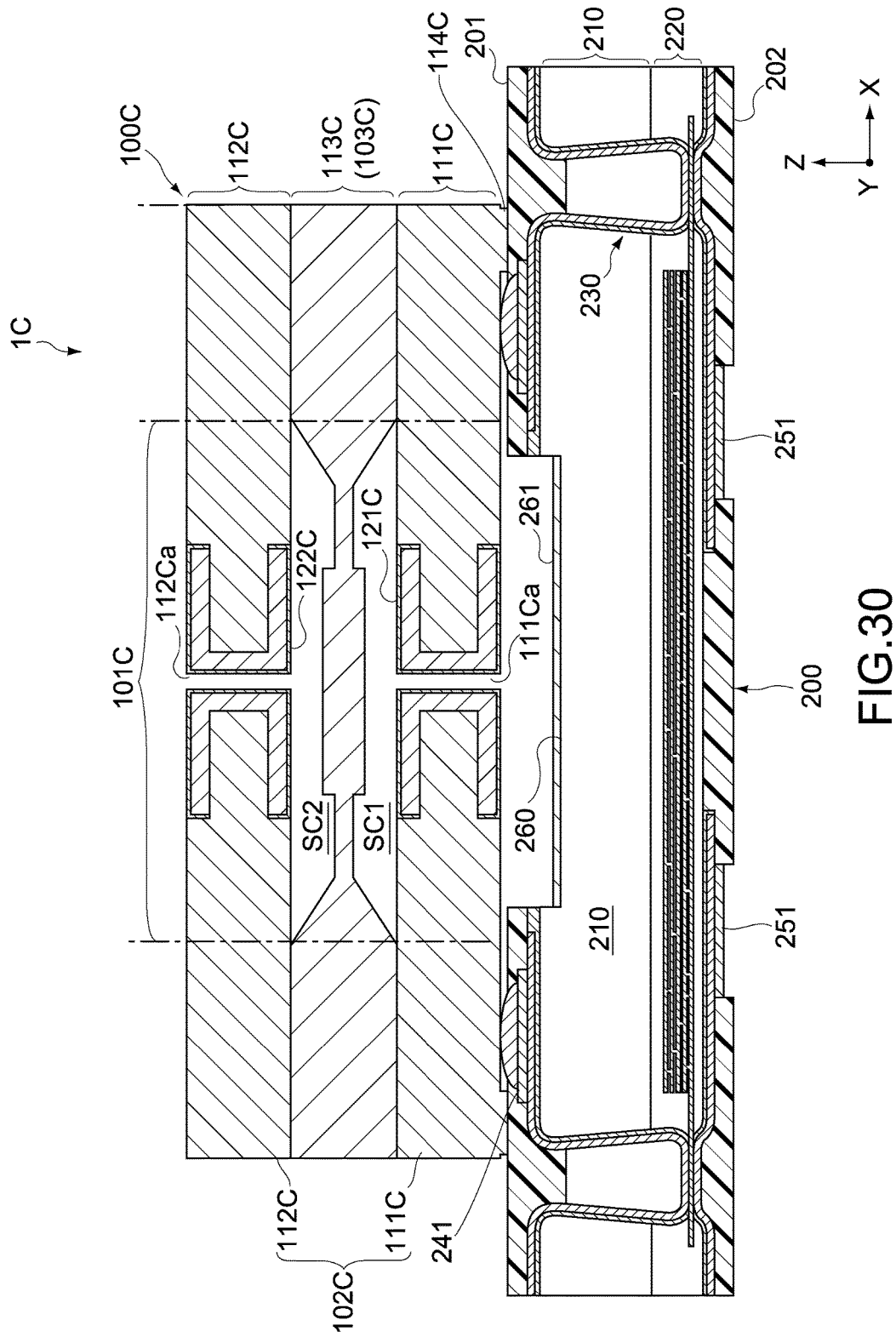
FIG. 30 A schematic cross-sectional view of a sensor device according to a fourth embodiment of the present technology.

FIG. 30 is a schematic cross-sectional view showing a sensor device 1C according to a fourth embodiment of the present technology. In this embodiment, descriptions of the same portions as the configurations and actions of the first embodiment will be omitted or simplified and portions different from the first embodiment will be mainly described.

In this embodiment, the sensor device 1C includes a sensor element 100C configured as the pressure detection element and a semiconductor element 200. The sensor device 1C is configured to be installable in an electronic apparatus (not shown) as a pressure sensor. Note that the semiconductor element 200 can be configured to be substantially same as the semiconductor element 200 according to the first embodiment and hence will be denoted by the same reference symbol and described.

The sensor element 100C is configured as, for example, a capacitance detection type pressure detection element. That is, the sensor element 100C includes a detecting portion 101C and a supporting portion 102C. The detecting portion 101C is capable of detecting a pressure change amount as a predetermined physical quantity. The supporting portion 102C supports the detecting portion 101C and is connected to a first terminal 241 of the semiconductor element 200. The detecting portion 101C is formed in a center portion of the sensor element 100C and includes a movable portion 103C. The supporting portion 102C is formed in a periphery. Hereinafter, a configuration of the sensor element 100C will be described.

The sensor element 100C includes a first layer 111C, a second layer 112C, and a diaphragm 113C sandwiched by the first and second layers 111C and 112C. In this embodiment, the movable portion 103C includes the diaphragm 113C. Further, the sensor element 100C further includes a first space SC1 closed between the diaphragm 113C and the first layer 111C and a second space SC2 opened between the diaphragm 113C and the second layer 112C. These spaces SC1 and SC2 are divided by the diaphragm 113C. With the first space SC1 being at a reference pressure, the sensor element 100C is configured to be capable of electrostatically detecting a displacement of the diaphragm 113C based on a pressure difference between the first and second spaces SC1 and SC2, to thereby detect a pressure in the opened second space SC2.

The diaphragm 113C is, at end portions thereof, supported by the first layer 111C and the second layer 112C. A center portion of the diaphragm 113C is configured to be displaceable. As the material of the diaphragm 113C, a conductive material such as metal, ceramic, and Si is employed.

Both of the first layer 111C and the second layer 112C are formed of an insulating material such as glass. In this embodiment, first and second through-holes 111Ca and 112Ca are provided in the center portion. Through the first through-hole 111Ca, the first space SC1 can communicate with a recess portion 260C. Through the second through-hole 112Ca, the second space SC2 can be opened to an external pressure.

The first layer 111C and the second layer 112C respectively include a first electrode 121C and a second electrode 122C that are opposed to the diaphragm 113C. Each of the first and second electrodes 121C and 122C is configured to be capable of achieving capacitive coupling with the diaphragm 113C and detects its capacitive coupling change amount, to thereby electrostatically detect a displacement of the diaphragm 113C. The configurations of the first and second electrodes 121C and 122C are not particularly limited. For example, as shown in FIG. 30, they are formed to coat the peripheries of the through-holes.

Further, the first layer 111C includes a terminal portion (not shown) that is electrically bonded to a first terminal 241. This terminal portion is connected to the first electrode 121C and the second electrode 122C. Further, the first layer 111C may include a sealing portion 114C that seals between the first layer 111C and the first surface 201 of the semiconductor element 200. With this, the first space SC1 can be configured as a hermetically sealed space, and the pressure in the first space SC1 can be kept. As shown in FIG. 25, the sealing portion 114C may be configured as a projection that is formed along the periphery of the first layer 111C and is held in contact with the first surface 201. Alternatively, the sealing portion 114C may be formed of a resin material, a seal member, or the like filling the gap between the first layer 111C and the first surface 201.

Note that the detecting portion 101C includes the diaphragm 113C and the first and second electrodes 121C and 122C. The supporting portion 102C includes peripheries of the first and second layers 111C and 112C that support the diaphragm 113C.

With the above-mentioned configuration, the diaphragm 113C is displaced in the Z-axis direction based on a pressure difference between the first space SC1 maintained at the reference pressure and the second space SC2. This displacement is detected as the capacitive coupling change amount between the first electrode 121C and the second electrode 122C, and hence the sensor device 1C can detect the pressure in the second space SC2 as the external pressure based on this capacitive coupling change amount.

Note that, in this embodiment, the supporting portion 102C having the above-mentioned configuration has a thickness larger than that of a semiconductor element 200C. With this, the strength of the sensor device 1C can be increased.

Further, the semiconductor element 200 includes the recess portion 260 opposed to the detecting portion 101C. With this, the capacity of the first space SC1 can be increased and influence of small amount of gas or the like that may be generated in the first space SC1 due to a long-term use can be reduced. Therefore, the reference pressure in the first space SC1 can be stably maintained and the detection accuracy of the sensor element 100C can be maintained.

Further, the semiconductor element 200 may include a vibration control member 261 disposed on the first surface 201 as in the first embodiment. With this, it becomes possible to suppress fine vibration due to the displacements of the diaphragm 113C and stably maintain the detection accuracy of the sensor element 100C.

Although the embodiments of the present technology have been described above, the present technology is not limited thereto and various modifications can be made based on the technical ideas of the present technology.

Figure 32:
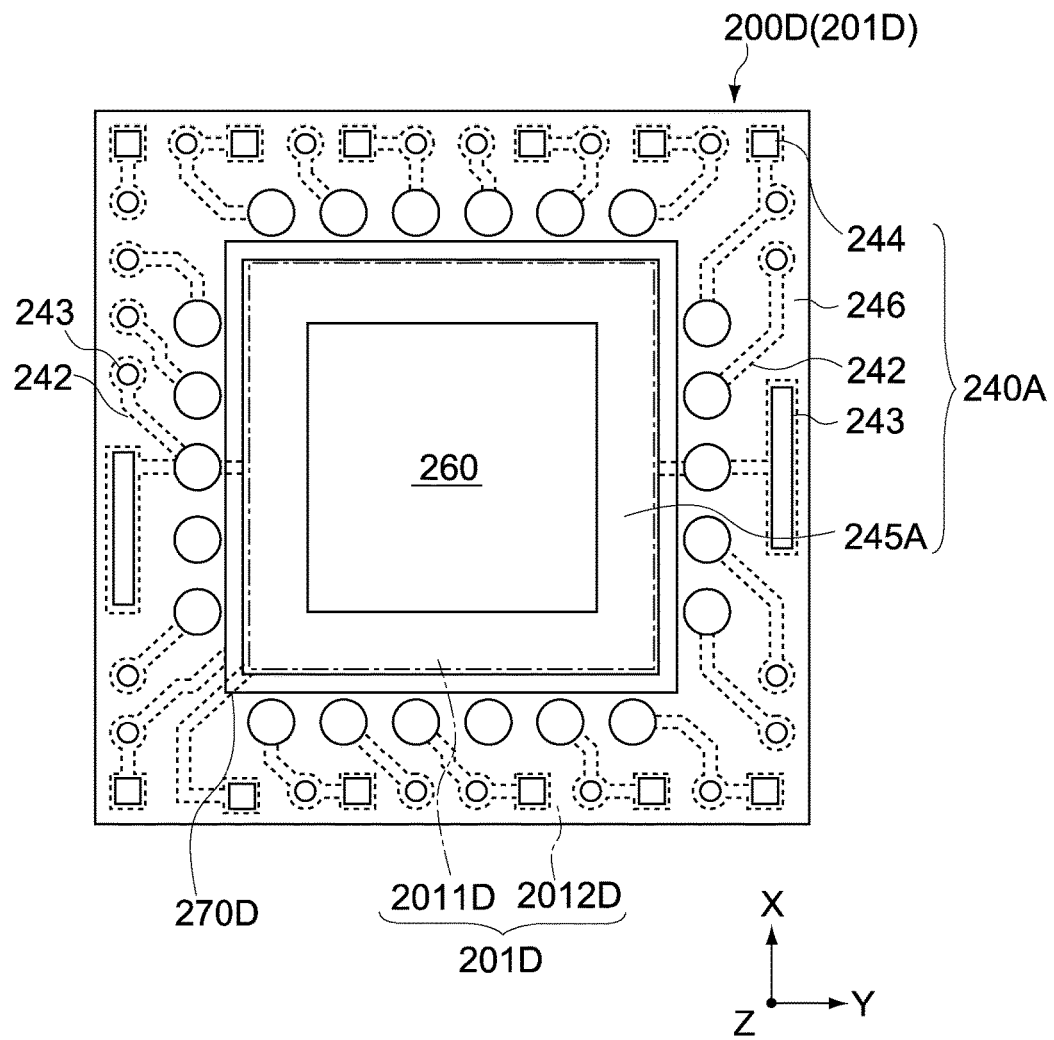
FIG. 32 A schematic plan view showing a configuration of a semiconductor element of the sensor device.

FIG. 31 is a schematic cross-sectional view of a sensor device 1D according to a modified example of the second embodiment. FIG. 32 is a schematic plan view of a first surface 201D of the sensor device 1D. Note that, in FIGS. 31 and 32, the configuration same as that of the second embodiment will be denoted by the same reference symbols and described.

A semiconductor element 200D of the sensor device 1D includes a convex portion 270D disposed between the first surface 201D and the sensor element 100. The convex portion 270D functions as a restriction portion that restricts a size of a gap between the first surface 201D and the sensor element 100. Specifically, the convex portion 270D has an annular convex structure and is formed to have a height of about 30 μm from the first surface 201D. With this, irrespective of an crush amount of the solder bumps, the gap between the first surface 201D and the sensor element 100 can be reliably ensured. With this, it becomes possible to stably drive the sensor element 100 without interfering with the motion of the vibrator portion 103.

The material of the convex portion 270D is not particularly limited. For example, the convex portion 270D can be formed of a film resist or a liquid resist. Further, the convex portion 270D can be formed by, for example, etching after bonding in the case of the film resist or etching after spin coating and dry baking in case of the liquid resist.

In addition, as described hereinafter, the convex portion 270D may function as an inflow preventing portion of a resin layer 2013D.

As shown in FIG. 31, the first surface 201D includes a first region 2011D opposed to the detecting portion 101 and a second region 2012D in which first terminals 241 are formed, the second region 2012D being proximate to the first region 2011D. The resin layer 2013D functions as an underfill formed for strengthening the bonding between the first terminals 241 and the terminal portions 114 and protecting these terminals and is formed between the second region 2012 and the sensor element 100. In this case, the convex portion 270D is disposed on the first surface 201 and can function as an inflow preventing portion that prevents inflow of the resin layer 2013D into the first region 2011.

Note that the configuration functioning as the inflow preventing portion is not limited to the convex portion and may be, for example, a groove formed in an annular shape in the first surface 201. With this, by flowing the resin material forming the resin layer 2013D into the groove, inflow into the first region 2011 can be prevented.

In addition, the inflow preventing portion is not limited to the annular configuration and, for example, may be formed in a four-wall shape or the like formed along the first terminals 241.

In the case where the groove as the inflow preventing portion is formed, the solder bumps formed on the first terminal portions 241 may be configured to function as the restriction portion. As described in the embodiment above, the solder bumps can be, for example, solder balls or cream solder. For example, in the case of the solder balls, by making a configuration in which a solder layer is formed around a core of Cu or the like, it is possible to restrict the size of the gap between the first surface and the sensor element by this core. Further, also in the case of the cream solder, for example, by adjusting the size of the first end 241 or adjusting a thickness of a screen mask used during screen printing, it is possible to adjust the volume of the cream solder and to restrict the gap between the first surface and the sensor element.

Note that the restriction portion and the inflow preventing portion are not limited to the second embodiment and it is also applicable to the other first, third, and fourth embodiments.

In any of the above-mentioned embodiments, the recess portion is formed in the semiconductor element. However, a configuration in which the recess portion is not formed in the semiconductor element may be employed. Further, even in this case, in the first, second, and fourth embodiments, the semiconductor element may include a vibration control member that is disposed on the first surface and capable of suppressing the vibration of the semiconductor element and the sensor element based on the motion of the movable portion (vibrator portion). Alternatively, in the third embodiment, the semiconductor element may include a reflecting layer formed on the first surface and capable of reflecting electromagnetic waves having a predetermined wavelength that can be detected by the detecting portion.

Further, in the above-mentioned embodiments, the semiconductor element includes the recess portion. However, a configuration in which the semiconductor element does not include the recess portion may be employed. Further, in the first, second, and fourth embodiments, the semiconductor element includes the vibration control member. However, a configuration in which the semiconductor element does not include the vibration control member may be employed. In the third embodiment, the reflecting layer is provided. However, a configuration in which the reflecting layer is not provided may be employed.

In addition, in the first, second, and fourth embodiments, when the vibration control member is disposed, it is disposed in the recess portion. However, it is not limited to be in the recess portion. The vibration control member can be appropriately disposed on the first surface. In the third embodiment, when the reflecting layer is formed, it is formed in the recess portion. It is not limited to be in the recess portion. The reflecting layer can be appropriately formed in the first surface.

In addition, in the above-mentioned embodiments, a configuration in which the semiconductor element does not include the first and second re-wiring layers can be made if possible in view of the wiring design.

Further, in the first and second embodiments, the sensor device may include a reflecting film that is disposed on the first surface of the semiconductor element and opposed to the detecting portion. With this, in the adjustment process of the sensor properties by laser machining, it becomes possible to further reduce the influence of the laser irradiation on the semiconductor element. Further, as the material of the reflecting film, a material having a high reflectance of laser light having a wavelength used in the above-mentioned process can be appropriately selected. Further, in the case where the recess portion is formed in the semiconductor element, the reflecting film may be formed in the recess portion.

Note that, in FIG. 32, a ground wire 245A is formed in a solid film shape between the recess portion 260 and the convex portion 270D. By forming the ground wire 245A in this manner, it can function as a laser light reflecting film.

Also in the third and fourth embodiments, the sensor device may include the coating portion. With this, the handleability as the sensor device can be improved. Further, the coating portion can also be provided with an electromagnetic shield function and the reliability of the sensor device can be improved.

Further, in the above-mentioned embodiments, the thickness of the semiconductor element is smaller than the thickness of the supporting portion of the sensor element. However, it is not limited to this configuration. The thickness of the semiconductor element may be substantially equal to or larger than the thickness of the supporting portion of the sensor element.

In addition, in the above-mentioned embodiments, the sensor device is the vibration type gyro sensor, the infrared imaging element, or the pressure sensor. However, it is not limited thereto. For example, the sensor device may be configured as an acceleration sensor, a geomagnetic sensor, or an imaging element capable of detecting visible rays. Alternatively, the sensor device may be configured as a composite sensor combining two or more sensors of those sensors.

It should be noted that the present technology may also take the following configurations.

(1) A sensor device, including:
    a sensor element; and
    a semiconductor element including
        a first surface that includes a first terminal on which the sensor element is mounted and is an inactive surface,
        a second surface that includes a second terminal for external connection and is an active surface, and
        a via-hole that electrically connects the first surface and the second surface to each other.

(2) The sensor device according to (1), in which
    the sensor element includes
        a detecting portion capable of detecting a predetermined physical quantity, and
        a supporting portion that supports the detecting portion and is connected to the first terminal.

(3) The sensor device according to (2), in which
    the semiconductor element further includes a recess portion formed in the first surface to be opposed to the detecting portion.

(4) The sensor device according to (2), in which
    the detecting portion includes a movable portion, and
    the sensor element is configured to be capable of outputting a signal depending on the predetermined physical quantity based on a moving state of the movable portion.

(5) The sensor device according to (4), in which
    the sensor element is configured to output a signal relating to an angular velocity based on a change of a vibrating state of the movable portion.

(6) The sensor device according to (4), in which
    the movable portion includes a diaphragm, and
    the sensor element is configured to be capable of outputting a signal relating to a pressure based on a deformation of the diaphragm.

(7) The sensor device according to any one of (4) to (6), in which
    the semiconductor element further includes a recess portion formed in the first surface to be opposed to the movable portion.

(8) The sensor device according to any one of (4) to (7), in which
the semiconductor element further includes a vibration control member that is formed in the first surface and capable of suppressing vibration of the semiconductor element and the sensor element based on motion of the movable portion.

(9) The sensor device according to (2), in which
the detecting portion outputs a signal based on absorption of an electromagnetic wave having a predetermined wavelength.

(10) The sensor device according to (9), in which
the semiconductor element further includes a recess portion that is formed in the first surface to be opposed to the detecting portion.

(11) The sensor device according to (9) or (10), in which
the semiconductor element further includes a reflecting layer that is formed in the first surface and capable of reflecting the electromagnetic wave having the predetermined wavelength.

(12) The sensor device according to any one of (2) to (11), in which
the supporting portion has a first thickness, and
the semiconductor element has a second thickness smaller than the first thickness.

(13) The sensor device according to any one of (1) to (12), in which
the semiconductor element further includes
a first re-wiring layer that is provided in the first surface and electrically connects the first terminal and the via-hole to each other, and
a second re-wiring layer that is provided in the second surface and electrically connects the second terminal and the via-hole to each other.

(14) The sensor device according to (13), further including
a coating portion that is disposed on the first surface and coats the sensor element, in which
the first re-wiring layer includes a third terminal that is connected to the coating portion.

(15) The sensor device according to (14), in which
the sensor element includes a movable portion and is configured to be capable of outputting a signal depending on the predetermined physical quantity based on a moving state of the movable portion, and
the coating portion further includes
a coating film that coats the sensor element, and
a sealing portion that seals between the coating film and the movable portion.

(16) The sensor device according to any one of (1) to (15), in which
the semiconductor element further includes a restriction portion that is disposed between the first surface and the sensor element and restricts a size of a gap between the first surface and the sensor element.

(17) The sensor device according to any one of (2) to (15), in which
the first surface includes
a first region that is opposed to the detecting portion, and
a second region in which the first terminal is formed, the second region being proximate to the first region, and
the semiconductor element further includes
a resin layer formed between the second region and the sensor element, and
an inflow preventing portion that is disposed on the first surface and prevents the resin layer from flowing into the first region.

(18) An electronic apparatus, including
a sensor device including
a sensor element, and
a semiconductor element including
a first surface that includes a first terminal on which the sensor element is mounted and is an inactive surface,
a second surface that includes a second terminal for external connection and is an active surface, and
a via-hole that electrically connects the first surface and the second surface to each other.

DESCRIPTION OF SYMBOLS 1, 1A, 1B, 1C, 1D sensor device
100, 100B, 100C sensor element
101, 101B detecting portion
102 frame body (supporting portion)
102B supporting portion
103 vibrator portion (movable portion)
103B movable portion
113C diaphragm
200, 200B, 200C, 200D semiconductor element
201, 201B, 201C first surface
202, 202B, 202C second surface
230, 230B, 230C via-hole
241, 241B, 241C first terminal
251, 251B, 251C second terminal
240 first re-wiring layer
250 second re-wiring layer
260, 260B recess portion
261 vibration control member
261B reflecting layer
2011, 2011D first region
2012, 2012D second region
2013D resin layer
300, 300A coating portion
310 coating film
320 sealing portion
270D convex portion (restriction portion, inflow preventing portion)

The invention claimed is:

1. A sensor device, comprising:
a sensor element; and
a semiconductor element including:
a first surface that includes a first terminal on which the sensor element is mounted, wherein the first surface is an inactive surface;
a second surface that includes a second terminal for external connection, wherein the second surface is an active surface; and
a via-hole that electrically connects the first surface and the second surface to each other,
wherein the second terminal is closer to a center vertical axis of the sensor element than the first terminal.

2. The sensor device according to claim 1, wherein the sensor element includes:
a detecting portion capable of detecting a predetermined physical quantity; and
a supporting portion that supports the detecting portion and is connected to the first terminal.

3. The sensor device according to claim 2, wherein the semiconductor element further includes a recess portion formed in the first surface to be opposed to the detecting portion.

4. The sensor device according to claim 2, wherein:
the detecting portion includes a movable portion; and
the sensor element is configured to be capable of outputting a signal depending on the predetermined physical quantity based on a moving state of the movable portion.

5. The sensor device according to claim 4, wherein the sensor element is configured to output a signal relating to an angular velocity based on a change of a vibrating state of the movable portion.

6. The sensor device according to claim 4, wherein:
the movable portion includes a diaphragm; and
the sensor element is configured to be capable of outputting a signal relating to a pressure based on a deformation of the diaphragm.

7. The sensor device according to claim 4, wherein the semiconductor element further includes a recess portion formed in the first surface to be opposed to the movable portion.

8. The sensor device according to claim 4, wherein the semiconductor element further includes a vibration control member that is formed in the first surface and capable of suppressing vibration of the semiconductor element and the sensor element based on motion of the movable portion.

9. The sensor device according to claim 2, wherein the detecting portion outputs a signal based on absorption of an electromagnetic wave having a predetermined wavelength.

10. The sensor device according to claim 9, wherein the semiconductor element further includes a recess portion that is formed in the first surface to be opposed to the detecting portion.

11. The sensor device according to claim 9, wherein the semiconductor element further includes a reflecting layer that is formed in the first surface and capable of reflecting the electromagnetic wave having the predetermined wavelength.

12. The sensor device according to claim 2, wherein:
the supporting portion has a first thickness; and
the semiconductor element has a second thickness smaller than the first thickness.

13. The sensor device according to claim 1, wherein the semiconductor element further includes:
a first re-wiring layer that is provided in the first surface and electrically connects the first terminal and the via-hole to each other; and
a second re-wiring layer that is provided in the second surface and electrically connects the second terminal and the via-hole to each other.

14. The sensor device according to claim 13, further comprising:
a coating portion that is disposed on the first surface and coats the sensor element, wherein the first re-wiring layer includes a third terminal that is connected to the coating portion.

15. The sensor device according to claim 14, wherein:
the sensor element includes a movable portion and is configured to be capable of outputting a signal depending on the predetermined physical quantity based on a moving state of the movable portion; and
the coating portion further includes:
a coating film that coats the sensor element; and
a sealing portion that seals between the coating film and the movable portion.

16. The sensor device according to claim 1, wherein the semiconductor element further includes a restriction portion that is disposed between the first surface and the sensor element and restricts a size of a gap between the first surface and the sensor element.

17. The sensor device according to claim 2, wherein the first surface includes:
a first region that is opposed to the detecting portion; and
a second region in which the first terminal is formed, the second region being proximate to the first region; and
the semiconductor element further includes:
a resin layer formed between the second region and the sensor element; and
an inflow preventing portion that is disposed on the first surface and prevents the resin layer from flowing into the first region.

18. The sensor device according to claim 1, wherein the semiconductor element further includes:
a first re-wiring layer in the first surface and in the via-hole;
a second re-wiring layer in the second surface,
wherein the first re-wiring layer and the second re-wiring layer electrically connect the first terminal to the second terminal at a connection portion of the via-hole,
wherein the first re-wiring layer includes a first conductive layer on a first insulating layer, the first insulating layer insulating the first conductive layer from sidewalls of the via-hole,
wherein the second re-wiring layer includes a second insulating layer on a second conductive layer, the second conductive layer electrically connecting to the first conductive layer at the connection portion of the via-hole.

19. The sensor device according to claim 18, wherein the semiconductor element further includes:
an element forming region between the first surface and the second surface; and
a third conductive layer that electrically connects the element forming region to the first terminal and the second terminal,
wherein the third conductive layer electrically connects to the first conductive layer and the second conductive layer at the connection portion of the via-hole,
wherein the connection portion of the via-hole is at an end of the via-hole that is closest to the second surface, and
wherein the first insulating layer and the second insulating layer contact the third conductive layer.

20. An electronic apparatus, comprising
a sensor device including:
a sensor element; and
a semiconductor element including:
a first surface that includes a first terminal on which the sensor element is mounted, wherein the first surface is an inactive surface;
a second surface that includes a second terminal for external connection, wherein the second surface is an active surface; and
a via-hole that electrically connects the first surface and the second surface to each other, wherein the second terminal is closer to a center vertical axis of the sensor element than the first terminal.

\* \* \* \* \*